(12) United States Patent
Utsumi et al.

(10) Patent No.: US 9,618,842 B2
(45) Date of Patent: Apr. 11, 2017

(54) RESIST COMPOSITION AND METHOD OF FORMING RESIST PATTERN

(75) Inventors: Yoshiyuki Utsumi, Kawasaki (JP); Makiko Irie, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 249 days.

(21) Appl. No.: 12/940,793

(22) Filed: Nov. 5, 2010

(65) Prior Publication Data
US 2011/0165512 A1 Jul. 7, 2011

(30) Foreign Application Priority Data
Nov. 11, 2009 (JP) .................................. 2009-258278

(51) Int. Cl.
G03F 7/004 (2006.01)
G03F 7/038 (2006.01)
G03F 7/039 (2006.01)
G03F 7/20 (2006.01)

(52) U.S. Cl.
CPC .......... G03F 7/0045 (2013.01); G03F 7/0046 (2013.01); G03F 7/0382 (2013.01); G03F 7/0392 (2013.01); G03F 7/0397 (2013.01); G03F 7/2041 (2013.01)

(58) Field of Classification Search
CPC ............................ G03F 7/0045; G03F 7/0382
See application file for complete search history.

(56) References Cited

U.S. PATENT DOCUMENTS

| | | | |
|---|---|---|---|
| 5,580,695 A | 12/1996 | Murata et al. | |
| 5,945,517 A | 8/1999 | Nitta et al. | |
| 5,968,712 A | 10/1999 | Thackeray et al. | |
| 6,153,733 A | 11/2000 | Yukawa et al. | |
| 6,444,397 B2 | 9/2002 | Hada et al. | |
| 6,949,325 B2 | 9/2005 | Li et al. | |
| 7,074,543 B2 | 7/2006 | Iwai et al. | |
| 2003/0198894 A1 | 10/2003 | Mizutani et al. | |
| 2004/0053171 A1* | 3/2004 | Takata et al. | 430/311 |
| 2010/0015552 A1* | 1/2010 | Kawaue et al. | 430/281.1 |
| 2010/0331440 A1 | 12/2010 | Maruyama et al. | |

FOREIGN PATENT DOCUMENTS

| | | | |
|---|---|---|---|
| JP | A-H05-232706 | | 9/1993 |
| JP | A-H05-249662 | | 9/1993 |
| JP | H09-208554 | | 8/1997 |
| JP | H11-035551 | | 2/1999 |
| JP | H11-035552 | | 2/1999 |
| JP | H11-035573 | | 2/1999 |
| JP | H11-322707 | | 11/1999 |
| JP | 2000-206694 | | 7/2000 |
| JP | 2001-255647 | | 9/2001 |
| JP | 2001255647 A | * | 9/2001 |
| JP | 2003-241385 | | 8/2003 |
| JP | A-2004-004557 | | 1/2004 |
| JP | A-2004-177929 | | 6/2004 |
| JP | 2004233661 A | * | 8/2004 |
| JP | 2005-037888 | | 2/2005 |
| JP | 2005-336452 | | 12/2005 |
| JP | 2006-259582 | | 9/2006 |
| JP | 2006-317803 | | 11/2006 |
| JP | EP 1947510 A1 | * | 7/2008 ........... G03F 7/0397 |
| JP | 2009199021 A | * | 9/2009 |
| WO | WO 2004/074242 | | 9/2004 |

(Continued)

OTHER PUBLICATIONS

English Translation of JP2009199021, published on Sep. 3, 2009.*
English Translation of JP2001255647, published on Sep. 21, 2001.*
English Translation of JP2009199021.*
English Translation of JP2004233661.*

(Continued)

*Primary Examiner* — Cynthia H Kelly
*Assistant Examiner* — Anna Malloy
(74) *Attorney, Agent, or Firm* — Knobbe Martens Olson & Bear LLP

(57) ABSTRACT

A resist composition including a base component that exhibits changed solubility in an alkali developing solution under the action of acid, an acid-generator component that generates acid upon exposure, and a nitrogen-containing organic compound, the acid generator component including an acid generator represented by general formula (b0), the nitrogen-containing organic compound including a compound represented by general formula (d1) or general formula (d2) in which each of $R^1$ and $R^2$ represents an aryl group or an alkyl group, Rf represents a fluorinated alkyl group, $X^-$ represents a counter anion, each of $R^3$ and $R^4$ represents an aliphatic hydrocarbon group, $R^5$ represents a hydrocarbon group having 5 or more carbon atoms, and each of $R^6$ and $R^7$ independently represents a hydrogen atom, an aliphatic hydrocarbon group, or —C(=O)—O—$R^5$.

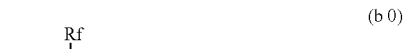

(b 0)

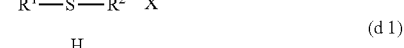

(d 1)

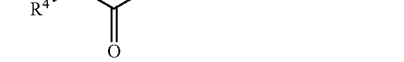

(d 2)

3 Claims, No Drawings

(56) References Cited

FOREIGN PATENT DOCUMENTS

WO    WO 2009/110388 A1    9/2009
WO    WO 2010067905 A2 *    6/2010

OTHER PUBLICATIONS

Notice of Allowance mailed on Nov. 19, 2013 in Japanese Patent Application No. 2009-258278.

* cited by examiner

RESIST COMPOSITION AND METHOD OF FORMING RESIST PATTERN

TECHNICAL FIELD

The present invention relates to a resist composition, and a method of forming a resist pattern that uses the resist composition.

Priority is claimed on Japanese Patent Application No. 2009-258278, filed Nov. 11, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist composition is used, which includes a base component that exhibits changed solubility in an alkali developing solution under the action of acid and an acid generator that generates acid upon exposure.

For example, a chemically amplified positive resist composition typically contains a resin component (base resin) that exhibits increased solubility in an alkali developing solution under the action of acid, and an acid generator component. If the resist film formed using this resist composition is selectively exposed during formation of a resist pattern, then acid is generated from the acid generator within the exposed portions, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are widely used as base resins for resists that use ArF excimer laser lithography or the like, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

On the other hand, a multitude of compounds have been proposed for use as the acid generator in a chemically amplified resist, and known examples include onium salt-based acid generators such as iodonium salts and sulfonium salts, oxime sulfonate-based acid generators, diazomethane-based acid generators, nitrobenzylsulfonate-based acid generators, iminosulfonate-based acid generators, and disulfone-based acid generators.

Currently, onium salt-based acid generators having a cation moiety such as a triphenylsulfonium ion are widely used as the acid generator (for example, see Patent Document 2).

Further, onium salt-based acid generators such as those disclosed in Patent Document 3 are also available, although further improvements are required to achieve better lithography properties.

Furthermore, currently, a nitrogen-containing organic compound such as an alkylamine or alkyl alcohol amine is frequently added to a chemically amplified resist in addition to the base resin and the acid generator (for example, see Patent Documents 4 and 5). These nitrogen-containing organic compounds function as quenchers that trap the acid generated from the acid generator, and contribute to an improvement in lithography properties such as the resist pattern shape. Further, these nitrogen-containing organic compounds also suppress the effects that basic compounds within the air can have on the resist composition, thereby improving the resistance of the composition to Post Exposure Delay (PED).

CITATION LIST

Patent Documents

[Patent Document 1] Japanese Unexamined Patent Application, First Publication No. 2003-241385
[Patent Document 2] Japanese Unexamined Patent Application, First Publication No. 2005-037888
[Patent Document 3] Japanese Unexamined Patent Application, First Publication No. 2001-255647
[Patent Document 4] Japanese Unexamined Patent Application, First Publication No. Hei 05-249662
[Patent Document 5] Japanese Unexamined Patent Application, First Publication No. Hei 05-232706

DISCLOSURE OF INVENTION

Problems to be Solved by the Invention

In the future, as further progress is made in lithography techniques and the potential application fields for lithography techniques continue to expand, demands will grow for novel materials capable of being used in these lithography applications. For example, further progress in pattern miniaturization will result in ever greater demands for improvements in all manner of lithography properties relating to resist materials.

Further, the types of onium salt-based acid generators having a fluorinated alkyl as the cation moiety which are described in the above-mentioned Patent Document 3 exhibit high reactivity due to their high cationicity, but a problem has arisen in that these acid generators tend to undergo decomposition via a nucleophilic reaction caused by the nitrogen-containing organic compound such as an alkyl amine used as a quencher, meaning the storage stability tend to inferior and the lithography properties tend to deteriorate.

The present invention has been developed in light of the circumstances described above, and has an object of providing a resist composition having excellent storage stability, and a method of forming a resist pattern that uses the resist composition.

Means to Solve the Problems

As a result of intensive investigation, the inventors of the present invention discovered that by combining an acid generator according to the present invention with a nitrogen-containing organic compound, the object described above could be achieved, and they were therefore able to complete the present invention.

In other words, a first aspect of the present invention is a resist composition including a base component (A) that exhibits changed solubility in an alkali developing solution under the action of acid, an acid-generator component (B) that generates acid upon exposure, and a nitrogen-containing organic compound (D), wherein the acid generator component (B) includes an acid generator (B1) consisting of a compound represented by general formula (b0) shown below, and the nitrogen-containing organic compound (D) includes a compound represented by general formula (d1) shown below or general formula (d2) shown below.

[Chemical Formula 1]

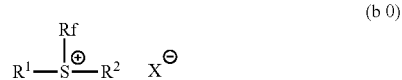

(b 0)

wherein each of $R^1$ and $R^2$ independently represents an aryl group which may have a substituent, or an alkyl group which may have a substituent, or alternatively, $R^1$ and $R^2$ may be bonded to each other to form a ring in combination with the sulfur atom in the formula, Rf represents a fluorinated alkyl group which may have a substituent, and $X^-$ represents a counter anion.

[Chemical Formula 2]

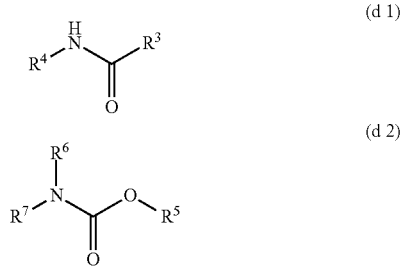

(d 1)

(d 2)

wherein each of $R^3$ and $R^4$ independently represents an aliphatic hydrocarbon group, $R^5$ represents a hydrocarbon group having 5 or more carbon atoms, each of $R^6$ and $R^7$ independently represents a hydrogen atom, an aliphatic hydrocarbon group which may have a substituent, or —C(=O)—O—$R^5$, a plurality of $R^5$ groups within formula (d2) may be the same or different, and $R^6$ and $R^7$ may be bonded to each other to form a ring.

A second aspect of the present invention is a method of forming a resist pattern that includes: applying a resist composition of the first aspect to a substrate to form a resist film on the substrate, conducting exposure of the resist film, and alkali-developing the resist film to form a resist pattern.

In the present description and claims, the term "aliphatic" is a relative concept used in relation to the term "aromatic", and defines a group or compound or the like that has no aromaticity.

The term "alkyl group" includes linear, branched and cyclic monovalent saturated hydrocarbons, unless otherwise specified.

The term "alkylene group" includes linear, branched and cyclic divalent saturated hydrocarbons, unless otherwise specified. This definition also applies to the alkyl group within an alkoxy group.

A "halogenated alkyl group" is a group in which some or all of the hydrogen atoms of an alkyl group have been substituted with halogen atoms, wherein examples of the halogen atoms include fluorine atoms, chlorine atoms, bromine atoms and iodine atoms.

A "fluorinated alkyl group" or "fluorinated alkylene group" describes a group in which some or all of the hydrogen atoms of an alkyl group or alkylene group have been substituted with fluorine atoms.

The term "structural unit" refers to a monomer unit that contributes to the formation of a high molecular weight compound (resin, polymer or copolymer).

A "structural unit derived from an acrylate ester" describes a structural unit which is formed by the cleavage of the ethylenic double bond of an acrylate ester.

The term "acrylate ester" is a generic term that includes the acrylate ester having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include alkyl groups of 1 to 5 carbon atoms, halogenated alkyl groups of 1 to 5 carbon atoms, and hydroxyalkyl groups.

Unless otherwise specified, the α-position carbon atom of an acrylate ester refers to the carbon atom to which the carbonyl group is bonded.

With respect to the acrylate ester, specific examples of the alkyl group of 1 to 5 carbon atoms for the substituent at the α-position include linear or branched alkyl groups of 1 to 5 carbon atoms such as a methyl group, ethyl group, propyl group, isopropyl group, n-butyl group, isobutyl group, tert-butyl group, pentyl group, isopentyl group and neopentyl group.

Further, specific examples of the halogenated alkyl group of 1 to 5 carbon atoms include groups in which some or all of the hydrogen atoms of an aforementioned "alkyl group of 1 to 5 carbon atoms for the substituent at the α-position" are substituted with halogen atoms. Examples of the halogen atoms include fluorine atoms, chlorine atoms, bromine atoms and iodine atoms, and fluorine atoms are particularly desirable.

In the present invention, it is preferable that a hydrogen atom, an alkyl group of 1 to 5 carbon atoms or a halogenated alkyl group of 1 to 5 carbon atoms, and more preferably a hydrogen atom, an alkyl group of 1 to 5 carbon atoms or a fluorinated alkyl group of 1 to 5 carbon atoms, is bonded to the α-position of the acrylate ester. In terms of industrial availability, a hydrogen atom or a methyl group is the most desirable.

The term "exposure" is used as a general concept that includes irradiation with any form of radiation, including an ArF excimer laser, KrF excimer laser, $F_2$ excimer laser, extreme ultraviolet rays (EUV), vacuum ultraviolet rays (VUV), electron beam (EB), X-rays or soft X-rays.

Effect of the Invention

According to the present invention, there are provided a resist composition having excellent storage stability, and a method of forming a resist pattern that uses the resist composition.

Best Mode for Carrying Out the Invention

<<Resist Composition>>

The resist composition of the present invention includes a base component (A) (hereinafter referred to as "component (A)") which exhibits changed solubility in an alkali developing solution under the action of acid, an acid-generator component (B) (hereinafter referred to as "component (B)") which generates acid upon exposure, and a nitrogen-containing organic compound (D) (hereinafter referred to as "component (D)").

With respect to a resist film formed using the resist composition, when a selective exposure is conducted during formation of a resist pattern, acid is generated from the component (B), and the generated acid acts on the component (A) to change the solubility of the component (A) in an alkali developing solution. As a result, the solubility of the exposed portions in an alkali developing solution is changed, whereas the solubility of the unexposed portions in an alkali developing solution remains unchanged. Therefore, the exposed portions are dissolved and removed by alkali developing in the case of a positive resist composition, whereas unexposed portions are dissolved and removed in the case of a negative resist composition, and hence, a resist pattern can be formed.

The resist composition of the present invention may be either a negative resist composition or a positive resist composition.

<Component (A)>

As the component (A), an organic compound typically used as a base component for a chemically amplified resist composition can be used alone, or two or more of such organic compounds can be mixed together.

The term "base component" refers to an organic having a film-forming ability.

The component (A) is typically an organic compound having a molecular weight of 500 or more. When the molecular weight is 500 or more, a satisfactory film-forming ability is achieved, and a resist pattern of nano level can be more easily formed.

Organic compounds having a molecular weight of 500 or more can be broadly classified into non-polymers and polymers.

As the non-polymer, a compound having a molecular weight of at least 500 but less than 4,000 is typically used. Hereinafter, the term "low molecular weight compound" is used to describe a non-polymer having a molecular weight of at least 500 but less than 4,000.

As the polymer, a compound having a molecular weight of not less than 1,000 is typically used. Hereinafter, the term "resin" is used to describe a polymer having a molecular weight of not less than 1,000. In the case of a resin, the "molecular weight" is the polystyrene equivalent weight average molecular weight determined by gel permeation chromatography (GPC).

As the component (A), a resin may be used, a low molecular weight compound may be used, or a resin and a low molecular weight compound may be used in combination.

When the resist composition of the present invention is a negative resist composition, for example, a base component that is soluble in an alkali developing solution is used as the component (A), and a cross-linking agent is also blended into the composition.

In the negative resist composition, when acid is generated from the component (B) upon exposure, the action of the generated acid causes cross-linking between the base component and the cross-linking agent, and the cross-linked portion becomes insoluble in an alkali developing solution. Therefore, in the formation of a resist pattern, by conducting selective exposure of a resist film formed by applying the negative resist composition onto a substrate, the exposed portions become insoluble in an alkali developing solution, whereas the unexposed portions remain soluble in an alkali developing solution, and hence, a resist pattern can be formed by alkali developing.

Generally, as the component (A) for a negative resist composition, a resin that is soluble in an alkali developing solution (hereinafter, referred to as "alkali-soluble resin") is used.

As the alkali-soluble resin, it is preferable to use a resin having a structural unit derived from at least one of an α-(hydroxyalkyl)acrylic acid and an alkyl ester (and preferably an alkyl ester of 1 to 5 carbon atoms) of an α-(hydroxyalkyl)acrylic acid, as disclosed in Japanese Unexamined Patent Application, First Publication No. 2000-206694; a (meth)acrylic resin or polycycloolefin resin having a sulfonamide, as disclosed in U.S. Pat. No. 6,949,325; a (meth)acrylic resin containing a fluorinated alcohol, as disclosed in U.S. Pat. No. 6,949,325, Japanese Unexamined Patent Application, First Publication No. 2005-336452 and Japanese Unexamined Patent Application, First Publication No. 2006-317803, or a polycycloolefin resin having a fluorinated alcohol as disclosed in Japanese Unexamined Patent Application, First Publication No. 2006-259582, as such resins enable the formation of a satisfactory resist pattern with minimal swelling.

The above-mentioned term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linking agent added is preferably within a range from 1 to 50 parts by weight, relative to 100 parts by weight of the alkali-soluble resin.

When the resist composition of the present invention is a positive resist composition, as the component (A), a base component which exhibits increased solubility in an alkali developing solution under the action of acid is used. This base component is insoluble in an alkali developing solution prior to exposure, and when acid is generated from the component (B) upon exposure, the action of that acid increases the solubility of the component (A) in an alkali developing solution. Therefore, in the formation of a resist pattern, by conducting selective exposure of a resist film formed by applying the positive resist composition onto a substrate, the exposed portions change from an insoluble state to a soluble state in an alkali developing solution, whereas the unexposed portions remain insoluble in an alkali developing solution, and hence, a resist pattern can be formed by alkali developing.

In the resist composition of the present invention, the component (A) is preferably a base component which exhibits increased solubility in an alkali developing solution under the action of acid. That is, the resist composition of the present invention is preferably a positive resist composition.

The component (A) may be a resin component (A1) which exhibits increased solubility in an alkali developing solution under the action of acid (hereinafter referred to as "component (A1)"), a low molecular weight compound (A2) which exhibits increased solubility in an alkali developing solution under the action of acid (hereinafter referred to as "component (A2)"), or a mixture of the component (A1) and the component (A2). Of these possibilities, the component (A) preferably contains the component (A1).

[Component (A1)]

As the component (A1), a resin component (base resin) typically used as a base component for a chemically amplified resist composition can be used alone, or two or more of such resin components can be mixed together.

In the resist composition of the present invention, the component (A1) preferably contains a structural unit (a5) having a polymerizable group, an aromatic hydrocarbon group and a hydroxyl group.

In the resist composition of the present invention, a component (A1) having a structural unit (a1) derived from an acrylate ester containing an acid-dissociable, dissolution-inhibiting group is particularly desirable.

Further, the component (A1) may also have a structural unit (a2) derived from an acrylate ester containing a lactone-containing cyclic group.

Furthermore, the component (A1) may also have a structural unit (a3) derived from an acrylate ester containing a polar group-containing aliphatic hydrocarbon group.

(Structural Unit (a5))

The structural unit (a5) is a structural unit having a polymerizable group, an aromatic hydrocarbon group and a hydroxyl group.

The polymerizable group is a group having an ethylenic double bond (such as a vinyl group, (meth)acryloyl group or cyclic olefin). Examples of the aromatic hydrocarbon group include the aromatic hydrocarbon groups listed below in relation to $R^{58}$, and groups derived from benzene, naphthalene and anthracene and the like are preferred.

By including the structural unit (a5), an appropriate level of alkali solubility can be obtained when the resist composition is prepared. Further, lithography properties such as the resolution and the sensitivity are also improved. Furthermore, particularly in those cases where KrF, an electron beam or EUV is used as the exposure wavelength, inclusion of the structural unit (a5) yields superior lithography properties such as sensitivity and resolution, and is consequently preferable.

Examples of the structural unit (a5) include structural units represented by general formulas (a5-1) and (a5-2) shown below.

[Chemical Formula 3]

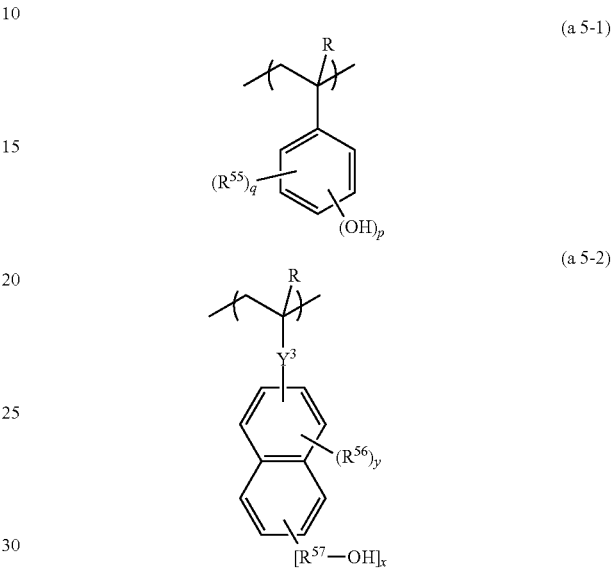

wherein R represents a hydrogen atom, an alkyl group of 1 to 5 carbon atoms or a halogenated alkyl group of 1 to 5 carbon atoms, each of $R^{55}$ and $R^{56}$ independently represents a halogen atom, an alkyl group of 1 to 5 carbon atoms, an alkoxy group of 1 to carbon atoms or a halogenated alkyl group of 1 to 5 carbon atoms, p represents an integer of 1 to 3 and q represents an integer of 0 to 4, provided that p+q is an integer of 1 to 5, $Y^3$ represents a single bond or —C(=O)—O—$R^{58}$— (wherein $R^{58}$ represents a single bond or a divalent linking group), $R^{57}$ represents a single bond or an alkylene group, x represents an integer of 1 to 3 and y represents an integer of 0 to 6, provided that x+y is an integer of 1 to 7.

In formula (a5-1), R represents a hydrogen atom, an alkyl group of 1 to 5 carbon atoms or a halogenated alkyl group of 1 to 5 carbon atoms.

The alkyl group of 1 to 5 carbon atoms for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

The halogenated alkyl group of 1 to 5 carbon atoms for R is a group in which some or all of the hydrogen atoms of an above-mentioned alkyl group of 1 to 5 carbon atoms have been substituted with halogen atoms. Examples of the halogen atoms include fluorine atoms, chlorine atoms, bromine atoms and iodine atoms, and fluorine atoms are particularly desirable.

As R, a hydrogen atom, an alkyl group of 1 to 5 carbon atoms, or a fluorinated alkyl group of 1 to 5 carbon atoms is preferable, and a hydrogen atom or a methyl group is the most preferred in terms of industrial availability.

In formula (a5-1), p represents an integer of 1 to 3 and q represents an integer of 0 to 4, provided that p+q is an integer of 1 to 5.

p is most preferably 1.

q is preferably an integer of 0 to 2, is more preferably 0 or 1, and from an industrial perspective, is most preferably 0.

In formula (a5-1), there are no particular limitations on the bonding position of the hydroxyl group(s) on the phenyl group. In those cases where p represents 1, the hydroxyl group may be bonded at the o-position, the m-position or the p-position, although from the viewpoints of ease of availability and cost, the p-position is preferable. In those cases where p is 2 or 3, any combination of bonding positions may be used.

Further, there are no particular limitations on the bonding position of $R^{55}$ on the phenyl group. In those cases where q represents 1, $R^{55}$ may be bonded at the o-position, the m-position or the p-position, whereas in those cases where q is 2 or more, any combination of bonding positions may be used.

In those cases where q represents an integer of 2 or more, the plurality of $R^{55}$ groups may be the same or different.

$R^{55}$ represents a halogen atom, an alkyl group of 1 to 5 carbon atoms, an alkoxy group of 1 to 5 carbon atoms or a halogenated alkyl group of 1 to 5 carbon atoms.

Examples of the halogen atom for $R^{55}$ include a fluorine atom, chlorine atom, bromine atom and iodine atom, and a fluorine atom is particularly desirable.

The alkyl group of 1 to 5 carbon atoms for $R^{55}$ is preferably a linear or branched alkyl group, and specific examples include a methyl group, ethyl group, propyl group, isopropyl group, n-butyl group, isobutyl group, tert-butyl group, pentyl group, isopentyl group and neopentyl group.

The alkoxy group of 1 to 5 carbon atoms for $R^{55}$ is preferably a linear or branched alkoxy group, and specific examples include a methoxy group, ethoxy group, n-propoxy group, i-propoxy group and n-butoxy group.

The halogenated alkyl group of 1 to 5 carbon atoms for $R^{55}$ is preferably a fluorinated alkyl group. Examples of the alkyl group within this fluorinated alkyl group include the same alkyl groups of 1 to 5 carbon atoms as those listed above in relation to $R^{55}$.

In formula (a5-2), R is the same as defined above for R in formula (a5-1).

$Y^3$ represents a single bond or —C(=O)—O—$R^{58}$— (wherein $R^{58}$ represents a single bond or a divalent linking group).

Examples of suitable divalent linking groups for $R^{58}$ include divalent hydrocarbon groups which may have a substituent and divalent linking groups containing a hetero atom.

In the "divalent hydrocarbon group which may have a substituent" for $R^{58}$, the description that the hydrocarbon group "may have a substituent" means that some or all of the hydrogen atoms within the hydrocarbon group may be substituted with a group or atom other than a hydrogen atom.

The hydrocarbon group may be either an aliphatic hydrocarbon group or an aromatic hydrocarbon group. The term "aliphatic hydrocarbon group" describes a hydrocarbon group having no aromaticity.

The aliphatic hydrocarbon group may be either saturated or unsaturated, but in most cases, is preferably saturated.

More specific examples of the aliphatic hydrocarbon group include linear or branched aliphatic hydrocarbon groups, and aliphatic hydrocarbon groups containing a ring in the structure thereof.

The linear or branched aliphatic hydrocarbon group preferably contains 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable, and specific examples include a methylene group [—$CH_2$—], ethylene group [—($CH_2$)$_2$—], trimethylene group [—($CH_2$)$_3$—], tetramethylene group [—($CH_2$)$_4$—] and pentamethylene group [—($CH_2$)$_5$—].

As the branched aliphatic hydrocarbon group, a branched alkylene group is preferable, and specific examples include alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, alkylethylene groups such as —CH($CH_3$)$CH_2$—, —CH($CH_3$)CH($CH_3$)—, —C($CH_3$)$_2CH_2$—, —CH($CH_2CH_3$)$CH_2$— and —C($CH_2CH_3$)$_2$—$CH_2$—, alkyltrimethylene groups such as —CH($CH_3$)$CH_2CH_2$— and —$CH_2$CH($CH_3$)$CH_2$—, and alkyltetramethylene groups such as —CH($CH_3$)$CH_2CH_2CH_2$— and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

Examples of the aliphatic hydrocarbon group containing a ring in the structure thereof include cyclic aliphatic hydrocarbon groups (groups in which two hydrogen atoms have been removed from an aliphatic hydrocarbon ring), and groups in which the cyclic aliphatic hydrocarbon group is either bonded to the terminal of an aforementioned chain-like aliphatic hydrocarbon group or interposed within an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocycle group.

As the monocycle group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aromatic hydrocarbon group include divalent aromatic hydrocarbon groups in which an additional hydrogen atom has been removed from the aromatic hydrocarbon nucleus of a monovalent aromatic hydrocarbon group such as a phenyl group, biphenyl group, fluorenyl group, naphthyl group, anthryl group or phenanthryl group;

aromatic hydrocarbon groups in which some of the carbon atoms that constitute the ring of an aforementioned divalent aromatic hydrocarbon group have been substituted with a hetero atom such as an oxygen atom, sulfur atom or nitrogen atom; and aromatic hydrocarbon groups in which an additional hydrogen atom has been removed from the aromatic hydrocarbon nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In the "divalent linking group containing a hetero atom" for $R^{58}$, the hetero atom within the "divalent linking group containing a hetero atom" is an atom other than a carbon atom or hydrogen atom, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate linkage (—O—C(=O)—O—), —NH—, —NR$^{04}$— (wherein R$^{04}$ represents an alkyl group), —NH—C(=O)—, and =N—. Further, combinations of any of these "divalent linking groups containing a hetero atom" with a divalent hydrocarbon group can also be used. Examples of the divalent hydrocarbon group include the same groups as those described above for the hydrocarbon group which may have a substituent, although a linear or branched aliphatic hydrocarbon group is preferable.

As the divalent linking group for $R^{58}$, an alkylene group, an ester linkage (—C(=O)—O—) or a combination thereof is preferred.

The alkylene group for $R^{58}$ is preferably a linear or branched alkylene group. Specific examples include the same linear alkylene groups and branched alkylene groups as those listed above for the aliphatic hydrocarbon group in the divalent hydrocarbon group which may have a substituent.

As the linear alkylene group for $R^{58}$, a methylene group or ethylene group is preferred, and a methylene group is particularly desirable.

As the branched alkylene group for $R^{58}$, an alkylmethylene group or alkylethylene group is preferred, and —CH(CH$_3$)—, —C(CH$_3$)$_2$— or —C(CH$_3$)$_2$CH$_2$— is particularly desirable.

Examples of the combination of an alkylene group and an ester linkage (—C(=O)—O—) include —R$^{58'}$—C(=O)—O— and —R$^{58'}$—C(=O)—O—R$^{58''}$—. In these formulas, each of R$^{58'}$ and R$^{58''}$ independently represents an alkylene group. Examples of the alkylene groups for R$^{58'}$ and R$^{58''}$ include the same groups as those listed above for the alkylene group for $R^{58}$.

$R^{58}$ may be either a single bond or a divalent linking group. $R^{58}$ is preferably a single bond or an alkylene group, and is most preferably a single bond.

In the present invention, $Y^3$ is preferably a single bond, —C(=O)—O— or —C(=O)—O—R$^{58'}$— (wherein R$^{58'}$ is the same as defined above), is more preferably a single bond or —C(=O)—O—, and is most preferably a single bond.

$R^{57}$ is a single bond or an alkylene group.

The alkylene group for $R^{57}$ may be a linear, branched or cyclic group, but is preferably a linear or branched alkylene group. The number of carbon atoms within the alkylene group is preferably within a range from 1 to 12, and specific examples include groups in which one hydrogen atom has been removed from the alkyl groups listed above in relation to $R^{55}$.

As $R^{57}$, a single bond or a methylene group is preferred, and a single bond is the most desirable.

In those cases where x represents an integer of 2 or more, the plurality of R$^{57}$ groups may be the same or different. For example, when x represents 2, then among the two —R$^{57}$—OH groups, one R$^{57}$ may represent a single bond, while the other R$^{57}$ represents an alkylene group.

$R^{56}$ represents a halogen atom, an alkyl group of 1 to 5 carbon atoms, an alkoxy group of 1 to 5 carbon atoms or a halogenated alkyl group of 1 to 5 carbon atoms, and is the same as described above for $R^{55}$.

In those cases where y represents an integer of 2 or more, the plurality of R$^{56}$ groups may be the same or different.

x represents an integer of 1 to 3, and y represents an integer of 0 to 6, provided that x+y is an integer of 1 to 7.

x is most preferably 1.

y is preferably an integer of 0 to 2, is more preferably 0 or 1, and is most preferably 0.

In formula (a5-2), $Y^3$ (or in the case where $Y^3$ is a single bond, the carbon atom to which R is bonded) may be bonded to either the 1st position or the 2nd position of the naphthalene ring.

There are no particular limitations on the bonding position of the —R$^{57}$—OH group on the naphthalene ring. In those cases where $Y^3$ (or in the case where $Y^3$ is a single bond, the carbon atom to which R is bonded) is bonded to the 1st position or 2nd position of the naphthalene ring, the —R$^{57}$—OH group is preferably bonded to one of the 5th to 8th positions of the naphthalene ring. In particular, if x represents 1, then the —R$^{57}$—OH group is preferably bonded to one of the 5th to 7th positions, and more preferably the 5th or 6th position, of the naphthalene ring. If x represents an integer of 2 or more, then any combination of bonding positions may be used.

As the structural unit (a5-2), structural units represented by general formulas (a5-21) to (a5-29) shown below are preferred.

[Chemical Formula 4]

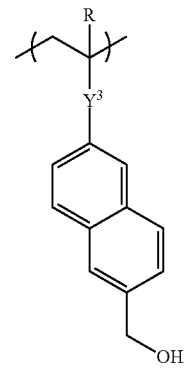

(a5-21)

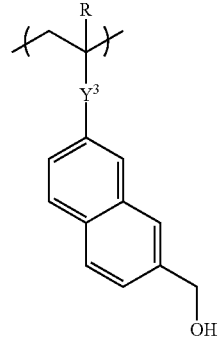

(a5-22)

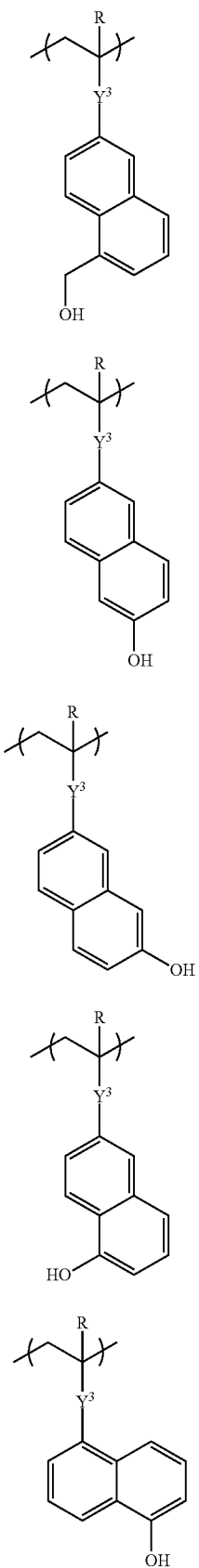

(a5-23)
(a5-24)
(a5-25)
(a5-26)
(a5-27)

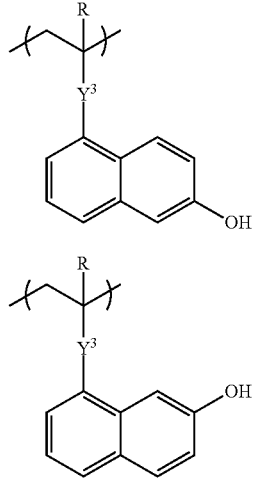

(a5-28)
(a5-29)

wherein R and $Y^3$ are the same as defined above for R and $Y^3$ in formula (a5-2).

As the structural unit (a5), either a single type of structural unit may be used alone, or two or more types of structural units may be used in combination.

The amount of the structural unit (a5) within the component (A1), based on the combined total of all the structural units that constitute the component (A1), is preferably within a range from 5 to 85 mol %, more preferably from 30 to 80 mol %, and most preferably from 60 to 75 mol %. Provided the amount satisfies this range, an appropriate level of alkali solubility can be obtained when a resist composition is prepared. Further, lithography properties such as the resolution and the sensitivity are also improved.

(Structural Unit (a1))

The structural unit (a1) is a structural unit derived from an acrylate ester containing an acid-dissociable, dissolution-inhibiting group.

As the acid-dissociable, dissolution-inhibiting group in the structural unit (a1), any of the groups that have been proposed as acid-dissociable, dissolution-inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid-dissociable, dissolution-inhibiting groups such as alkoxyalkyl groups are widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereinafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include aliphatic branched, acid-dissociable, dissolution-inhibiting groups and aliphatic cyclic group-containing acid-dissociable, dissolution-inhibiting groups.

In the descriptions of the claims and the specification, the term "aliphatic branched" refers to a branched structure having no aromaticity.

The "aliphatic branched, acid-dissociable, dissolution-inhibiting group" is not limited to groups constituted of only carbon atoms and hydrogen atoms (not limited to hydrocarbon groups), but is preferably a hydrocarbon group.

Further, the "hydrocarbon group" may be either saturated or unsaturated, but in most cases, is preferably saturated.

Examples of aliphatic branched, acid-dissociable, dissolution-inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, a fluorine atom, fluorinated lower alkyl groups of 1 to 5 carbon atoms, and an oxygen atom (=O).

The basic ring of the "aliphatic cyclic group" exclusive of substituents is not limited to structures constituted from only carbon and hydrogen (not limited to hydrocarbon groups), but is preferably a hydrocarbon group. Further, the "hydrocarbon group" may be either saturated or unsaturated, but in most cases, is preferably saturated. Furthermore, the "aliphatic cyclic group" is preferably a polycyclic group.

Examples of such aliphatic cyclic groups include groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantine, norbornane, isobornane, tricyclodecane or tetracyclododecane.

Examples of the aliphatic cyclic group-containing acid-dissociable, dissolution-inhibiting group include groups having a tertiary carbon atom on the ring structure of the cycloalkyl group. Specific examples include a 2-methyl-2-adamantyl group and a 2-ethyl-2-adamantyl group. Alternative examples include groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, such as the groups bonded to the oxygen atom of the carbonyloxy group (—C(O)—O—) within the structural units represented by general formulas (a1"-1) to (a1"-6) shown below.

[Chemical Formula 5]

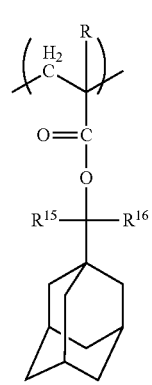

(a1"-1)

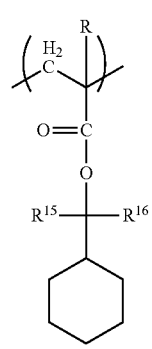

(a1"-2)

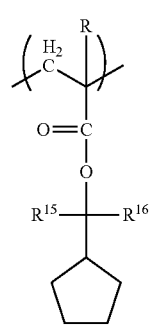

(a1"-3)

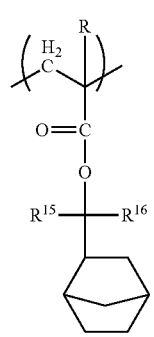

(a1"-4)

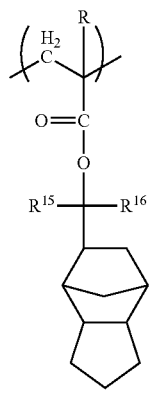

(a1"-5)

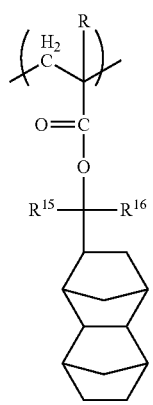

(a1"-6)

wherein R represents a hydrogen atom, an alkyl group of 1 to 5 carbon atoms or a halogenated alkyl group of 1 to 5 carbon atoms, and $R^{15}$ and $R^{16}$ each independently represents an alkyl group (which may be linear or branched, and preferably has 1 to 5 carbon atoms).

In general formulas (a1"-1) to (a1"-6) above, the alkyl group of 1 to 5 carbon atoms or halogenated alkyl group of 1 to 5 carbon atoms for R are the same as defined above for the alkyl group of 1 to 5 carbon atoms or halogenated alkyl group of 1 to 5 carbon atoms for R in the above formula (a5-1).

An "acetal-type acid-dissociable, dissolution-inhibiting group" generally substitutes a hydrogen atom at the terminal of an alkali-soluble group such as a carboxyl group or hydroxyl group, so as to be bonded with an oxygen atom. When acid is generated upon exposure, the action of the generated acid breaks the bond between the acetal-type acid-dissociable, dissolution-inhibiting group and the oxygen atom to which the acetal-type, acid-dissociable, dissolution-inhibiting group is bonded.

Examples of acetal-type acid-dissociable, dissolution-inhibiting groups include groups represented by general formula (p1) shown below.

[Chemical Formula 6]

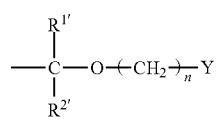

(p 1)

wherein each of $R^{1'}$ and $R^{2'}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In general formula (p1) above, n is preferably an integer of 0 to 2, more preferably 0 or 1, and most preferably 0.

Examples of the alkyl group of 1 to 5 carbon atoms for $R^{1'}$ and $R^{2'}$ include the same groups as those listed above for the alkyl group of 1 to 5 carbon atoms for R in formula (a5-1), and of these, a methyl group or ethyl group is preferable, and a methyl group is particularly desirable.

In the present invention, it is preferable that at least one of $R^{1'}$ and $R^{2'}$ is a hydrogen atom. That is, it is preferable that the acid-dissociable, dissolution-inhibiting group (p1) is a group represented by general formula (p1-1) shown below.

[Chemical Formula 7]

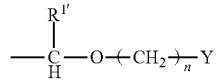

(p 1-1)

wherein $R^{1'}$, n and Y are as defined above for $R^{1'}$, n and Y in formula (p1).

Examples of the alkyl group of 1 to 5 carbon atoms for Y include the same alkyl groups of 1 to 5 carbon atoms listed above for R in formula (a5-1).

As the aliphatic cyclic group for Y, any of the multitude of monocyclic or polycyclic aliphatic cyclic groups which have been proposed for conventional ArF resists and the like can be appropriately selected for use. Specific examples include the same groups as those described above in connection with the "aliphatic cyclic group."

Further examples of the acetal-type, acid-dissociable, dissolution-inhibiting group include groups represented by general formula (p2) shown below.

[Chemical Formula 8]

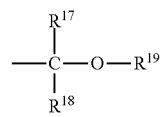

(p 2)

wherein $R^{17}$ and $R^{18}$ each independently represents a linear or branched alkyl group or a hydrogen atom, and $R^{19}$ represents a linear, branched or cyclic alkyl group, or alternatively, $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (and preferably an alkylene group of 1 to 5 carbon atoms), wherein $R^{19}$ is bonded to $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one unit selected from the group consisting of structural units represented by general formula (a1-0-1) shown below and structural units represented by general formula (a1-0-2) shown below.

[Chemical Formula 9]

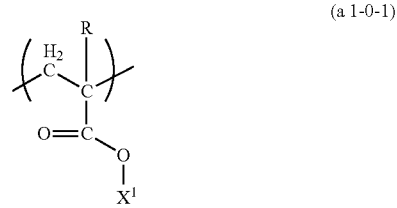

(a1-0-1)

wherein R represents a hydrogen atom, an alkyl group of 1 to 5 carbon atoms or a halogenated alkyl group of 1 to 5 carbon atoms, and $X^1$ represents an acid-dissociable, dissolution-inhibiting group.

[Chemical Formula 10]

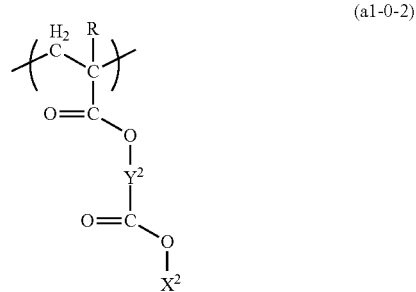

(a1-0-2)

wherein R represents a hydrogen atom, an alkyl group of 1 to 5 carbon atoms or a halogenated alkyl group of 1 to 5 carbon atoms, $X^2$ represents an acid-dissociable, dissolution-inhibiting group, and $Y^2$ represents a divalent linking group.

In general formula (a1-0-1), the alkyl group of 1 to 5 carbon atoms and halogenated alkyl group of 1 to 5 carbon atoms for R are the same as defined above for the alkyl group of 1 to 5 carbon atoms and halogenated alkyl group of 1 to 5 carbon atoms described above for R in formula (a5-1).

$X^1$ is not particularly limited as long as it is an acid-dissociable, dissolution-inhibiting group, and examples thereof include the aforementioned tertiary alkyl ester-type acid-dissociable, dissolution-inhibiting groups and acetal-type acid-dissociable, dissolution-inhibiting groups. Of these, tertiary alkyl ester-type acid-dissociable, dissolution-inhibiting groups are preferable.

In general formula (a1-0-2), R is the same as defined above for R in formula (a1-0-1).

$X^2$ is the same as $X^1$ in general formula (a1-0-1).

Examples of the divalent linking group for $Y^2$ include alkylene groups, divalent aliphatic cyclic groups, and divalent linking groups containing a hetero atom.

Examples of the aliphatic cyclic group include the same groups as those exemplified above within the description of the "aliphatic cyclic group" with the exception that two or more hydrogen atoms have been removed therefrom.

When $Y^2$ represents an alkylene group, the group preferably contains 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, it is particularly desirable that the divalent aliphatic cyclic group is a group in which two or more hydrogen atoms have been removed from cyclopentane, cyclohexane, norbornane, isobornane, adamantine, tricyclodecane or tetracyclododecane.

When $Y^2$ represents a divalent linking group containing a hetero atom, examples of the divalent linking group containing a hetero atom include —O—, —C(=O)—O—, —C(=O)—, —O—C(=O)—O—, —C(=O)—NH—, —NH— (wherein H may be replaced with a substituent such as an alkyl group or acyl group), —S—, —S(=O)$_2$—, —S(=O)$_2$—O—, -A-O(oxygen atom)-B- (wherein each of A and B independently represents a divalent hydrocarbon group which may have a substituent), and combinations of an alkylene group and a divalent linking group containing a hetero atom.

In those cases where $Y^2$ is —NH— and the H has been replaced with a substituent (such as an alkyl group or acyl group), the number of carbon atoms within the substituent is preferably from 1 to 10 carbon atoms, more preferably from 1 to 8 carbon atoms, and most preferably from 1 to 5 carbon atoms.

When $Y^2$ represents -A-O-B-, each of A and B independently represents a divalent hydrocarbon group that may have a substituent.

The description that the hydrocarbon group "may have a substituent" means that some or all of the hydrogen atoms within the hydrocarbon group may be substituted with a group or atom other than a hydrogen atom.

The hydrocarbon group for A may be either an aliphatic hydrocarbon group or an aromatic hydrocarbon group. An "aliphatic hydrocarbon group" refers to a hydrocarbon group that has no aromaticity.

The aliphatic hydrocarbon group for A may be saturated or unsaturated, although in general, the aliphatic hydrocarbon group is preferably saturated.

Specific examples of the aliphatic hydrocarbon group for A include linear and branched aliphatic hydrocarbon groups, and aliphatic hydrocarbon groups containing a ring in the structure thereof.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable. Specific examples thereof include a methylene group, ethylene group [—$(CH_2)_2$—], trimethylene group [—$(CH_2)_3$—], tetramethylene group [—$(CH_2)_4$—] and pentamethylene group [—$(CH_2)_5$—].

As the branched aliphatic hydrocarbon group, a branched alkylene group is preferable, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—, alkylethylene groups such as —$CH(CH_3)CH_2$—, —$CH(CH_3)CH(CH_3)$—, —$C(CH_3)_2CH_2$— and —$CH(CH_2CH_3)CH_2$—, alkyltrimethylene groups such as —$CH(CH_3)CH_2CH_2$— and —$CH_2CH(CH_3)CH_2$—, and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (═O).

Examples of the aliphatic hydrocarbon group containing a ring in the structure thereof include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable, and specific examples of the monocycloalkane include cyclopentane and cyclohexane.

As the polycyclic group, a group in which two hydrogen atoms have been removed from a polycycloalkane of 7 to 12 carbon atoms is preferable, and specific examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

As the group A, a linear aliphatic hydrocarbon group is preferable, a linear alkylene group is more preferable, a linear alkylene group of 2 to 5 carbon atoms is still more preferable, and an ethylene group is the most desirable.

Specific examples of the aromatic hydrocarbon group for A include divalent aromatic hydrocarbon groups in which an additional hydrogen atom has been removed from the aromatic hydrocarbon nucleus of a monovalent aromatic hydrocarbon group such as a phenyl group, biphenyl group, fluorenyl group, naphthyl group, anthryl group or phenanthryl group, aromatic hydrocarbon groups in which some of the carbon atoms that constitute the ring of an aforementioned divalent aromatic hydrocarbon group have been substituted with a hetero atom such as an oxygen atom, sulfur atom or nitrogen atom, and aromatic hydrocarbon groups in which an additional hydrogen atom has been removed from the aromatic hydrocarbon nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

Examples of the hydrocarbon group for B include the same divalent hydrocarbon groups as those listed above for A.

As the group B, a linear or branched aliphatic hydrocarbon group is preferable, and a methylene group or an alkylmethylene group is particularly desirable.

The alkyl group within the alkylmethylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 11]

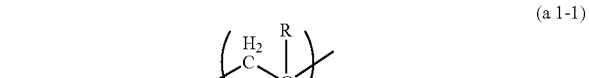

(a1-1)

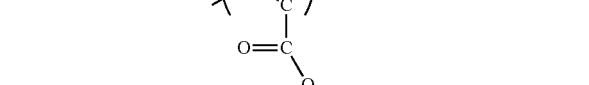

(a1-2)

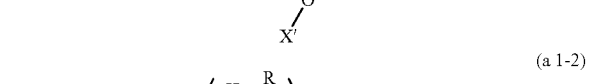

(a1-3)

-continued (a1-4)

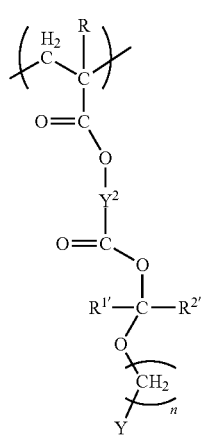

wherein X' represents a tertiary alkyl ester-type acid-dissociable, dissolution-inhibiting group, Y represents an alkyl group of 1 to 5 carbon atoms or an aliphatic cyclic group, n represents an integer of 0 to 3, $Y^2$ represents a divalent linking group, R is as the same as defined above for R in formula (a1-0-1), and each of $R^{1\prime}$ and $R^{2\prime}$ independently represents a hydrogen atom or an alkyl group of 1 to 5 carbon atoms.

Examples of the tertiary alkyl ester-type acid-dissociable, dissolution-inhibiting group for X' include the same tertiary alkyl ester-type acid-dissociable, dissolution-inhibiting groups as those listed above for $X^1$ in formula (a1-0-1).

$R^{1\prime}$, $R^{2\prime}$, n and Y are the same as defined above for $R^{1\prime}$, $R^{2\prime}$, n and Y in general formula (p1) described above in connection with the "acetal-type acid-dissociable, dissolution-inhibiting group."

Examples of $Y^2$ include the same groups as those described above for $Y^2$ in general formula (a1-0-2).

Specific examples of structural units represented by general formula (a1-1) to (a1-4) are shown below.

In each of the following formulas, $R^\alpha$ represents a hydrogen atom, a methyl group or a trifluoromethyl group.

[Chemical Formula 12]

(a1-1-1)

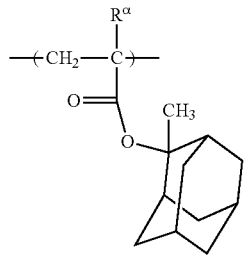

(a1-1-2)

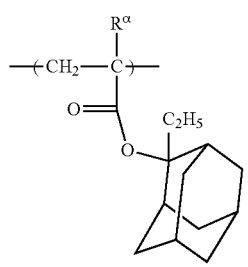

(a1-1-3)

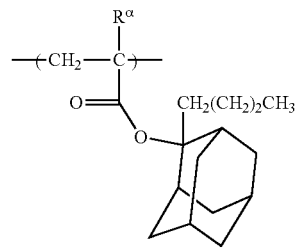

(a1-1-4)

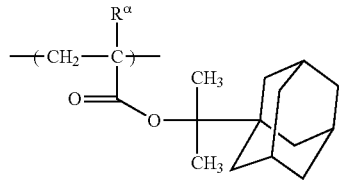

(a1-1-5)

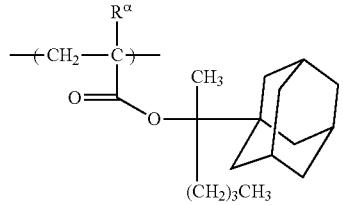

(a1-1-6)

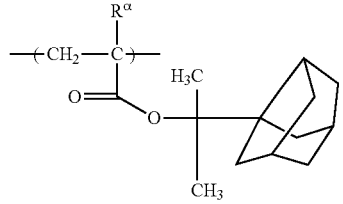

(a1-1-7)

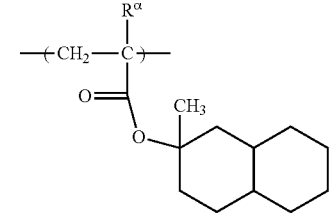

(a1-1-8)

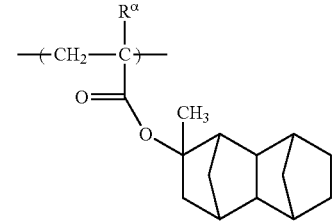

(a1-1-9)

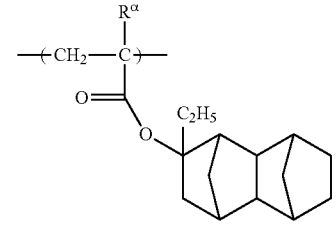

[Chemical Formula 13]
(a1-1-10)
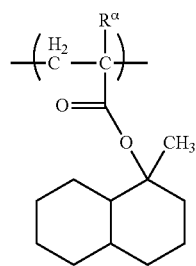
(a1-1-11)
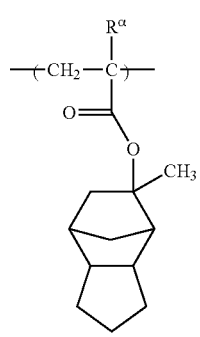
(a1-1-12)
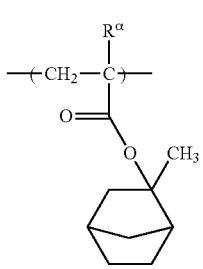
(a1-1-13)
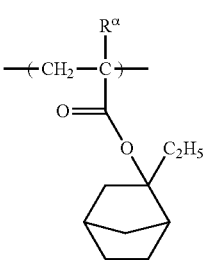
(a1-1-14)
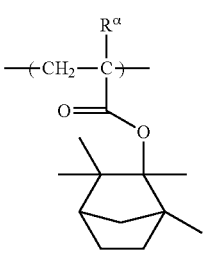
(a1-1-15)
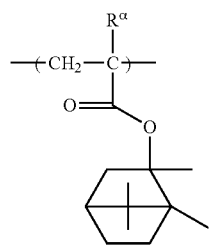
(a1-1-16)
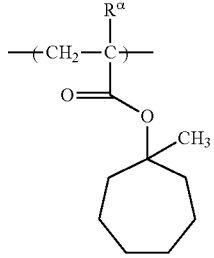
(a1-1-17)
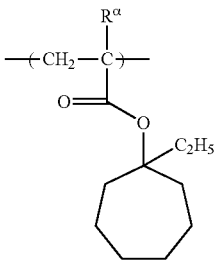
(a1-1-18)
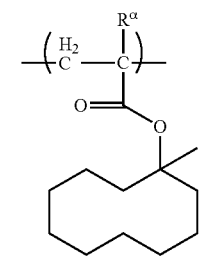
(a1-1-19)
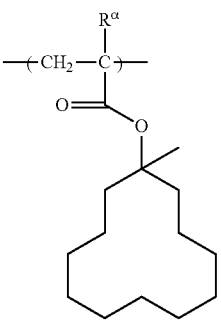
(a1-1-20)
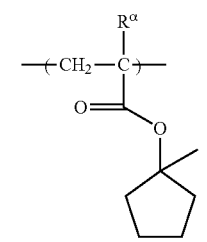

(a1-1-21) 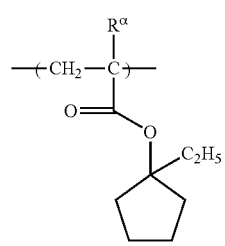
[Chemical Formula 14]
(a1-1-22) 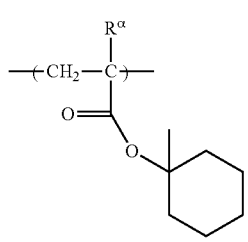
(a1-1-23) 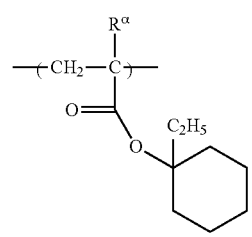
(a1-1-24) 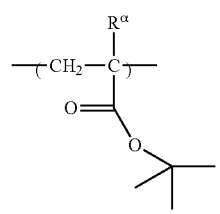
(a1-1-25) 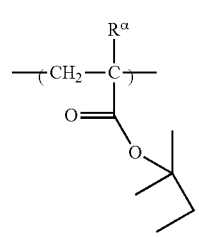
(a1-1-26) 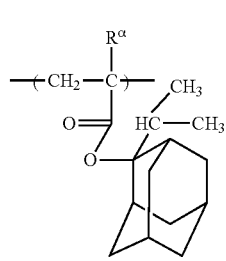
(a1-1-27) 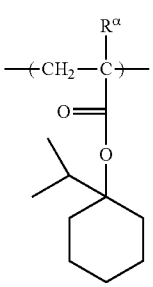
(a1-1-28) 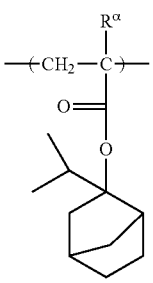
(a1-1-29) 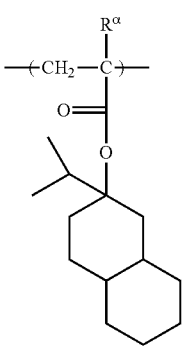
(a1-1-30) 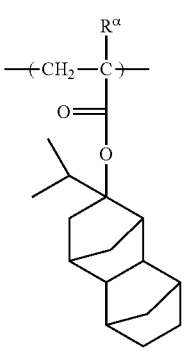
(a1-1-31) 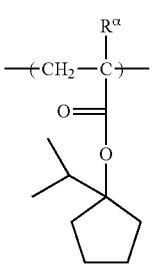

[Chemical Formula 15]
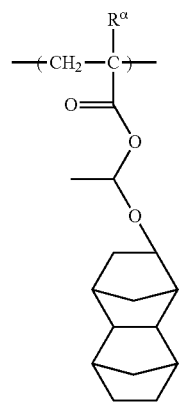 (a1-2-1)
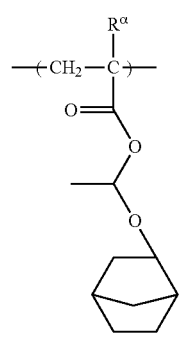 (a1-2-2)
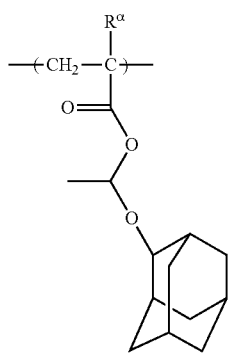 (a1-2-3)
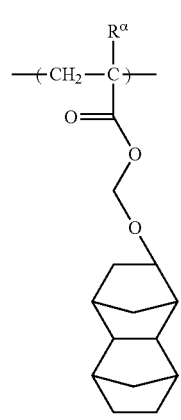 (a1-2-4)
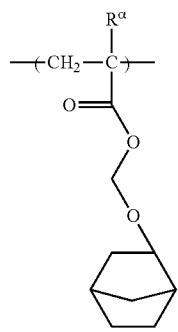 (a1-2-5)
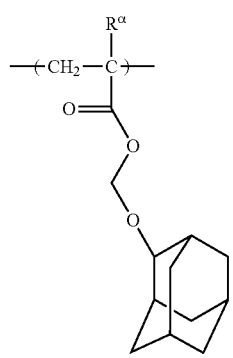 (a1-2-6)
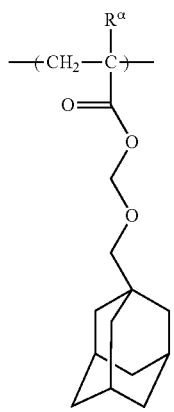 (a1-2-7)
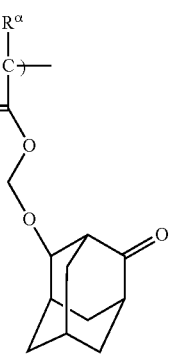 (a1-2-8)

-continued
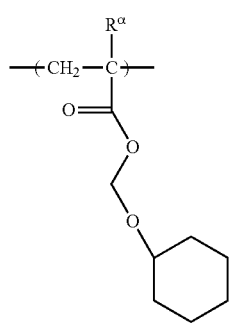
(a1-2-9)
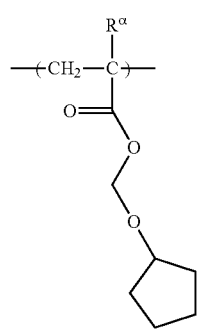
(a1-2-10)
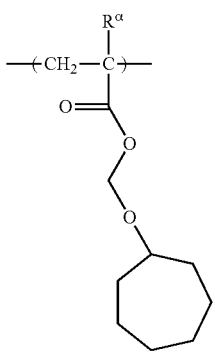
(a1-2-11)
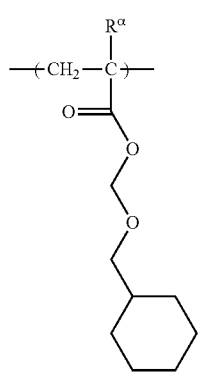
(a1-2-12)
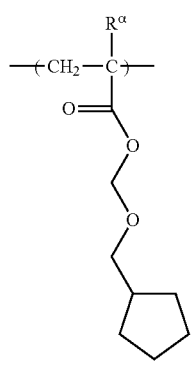
(a1-2-13)
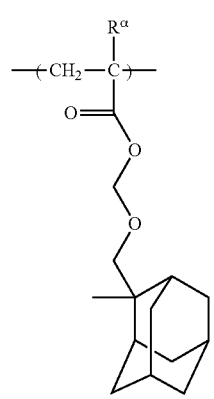
(a1-2-14)
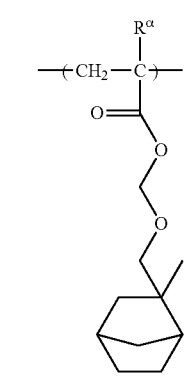
(a1-2-15)
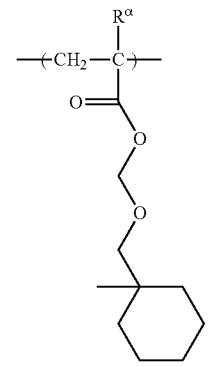
(a1-2-16)

(a1-2-17)
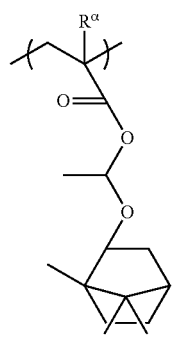
(a1-2-18)
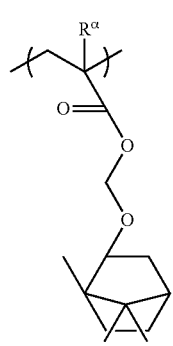
(a1-2-19)
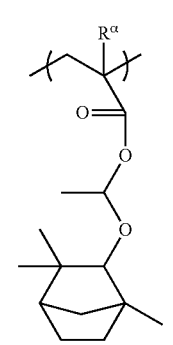
(a1-2-20)
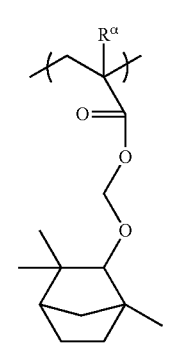
(a1-2-21)
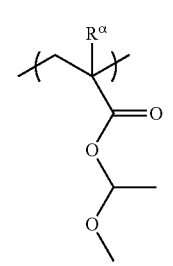
(a1-2-22)
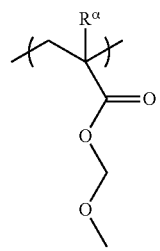
(a1-2-23)
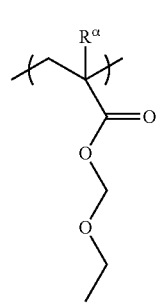
(a1-2-24)
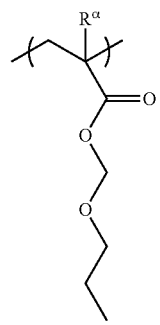
[Chemical Formula 16]
(a1-3-1)
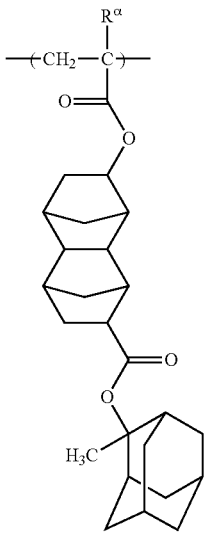

(a1-3-2)
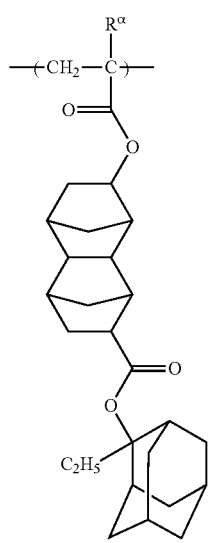
(a1-3-5)
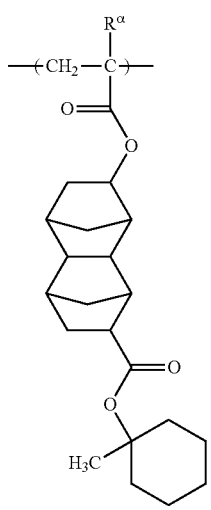
(a1-3-3)
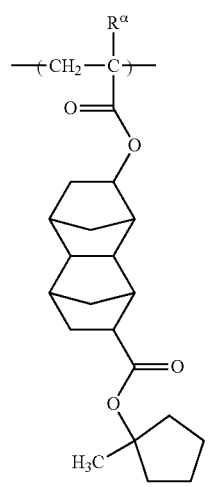
(a1-3-6)
(a1-3-4)
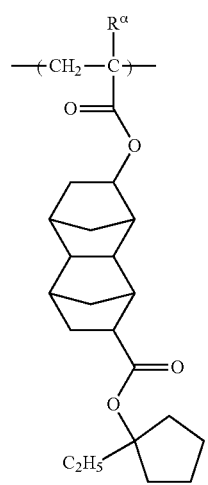
(a1-3-7)

(a1-3-8)
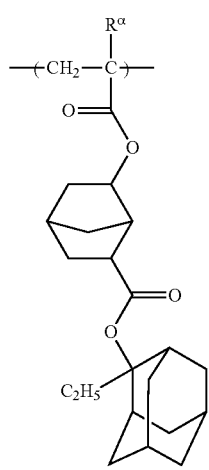
(a1-3-9)
(a1-3-10)
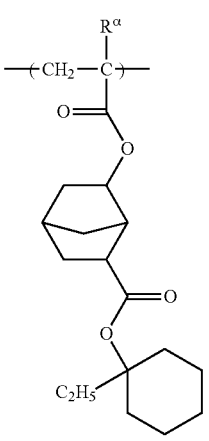
(a1-3-11)
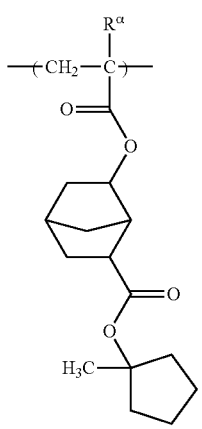
(a1-3-12)
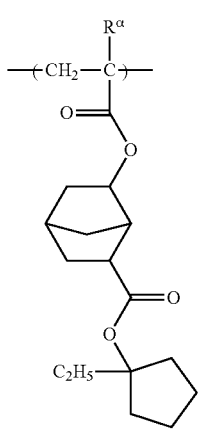
(a1-3-13)
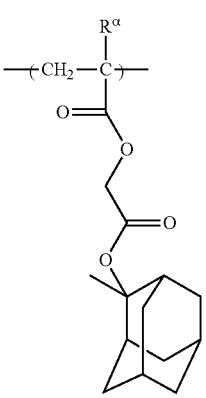
(a1-3-14)
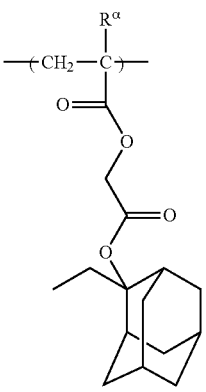

(a1-3-15)
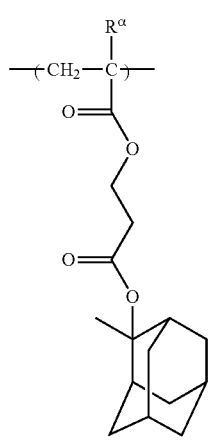
(a1-3-16)
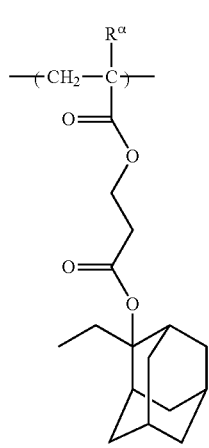
(a1-3-17)
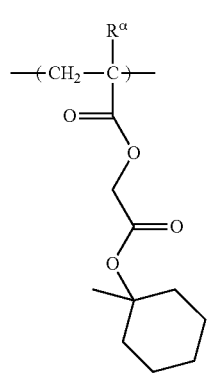
(a1-3-18)
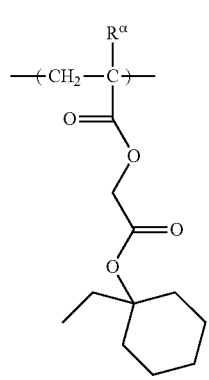
[Chemical Formula 17]
(a1-3-19)
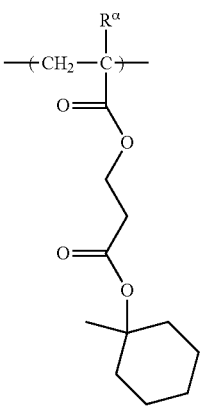
(a1-3-20)
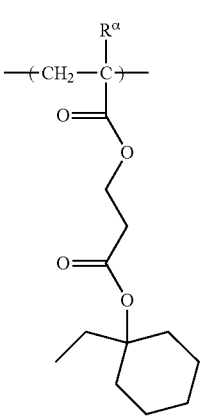
(a1-3-21)
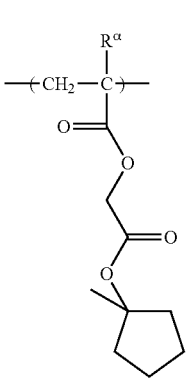
(a1-3-22)
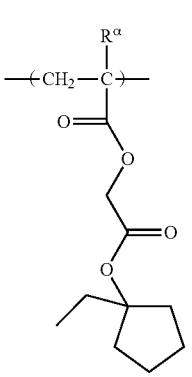

(a1-3-23)
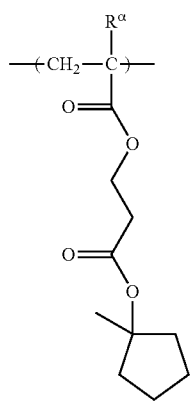
(a1-3-26)
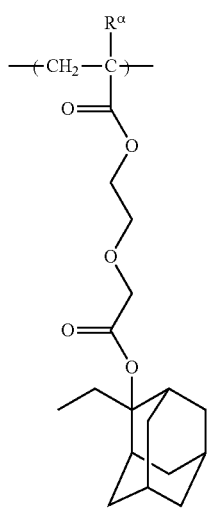
(a1-3-24)
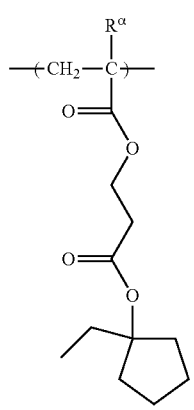
(a1-3-27)
[Chemical Formula 18]
(a1-3-25)
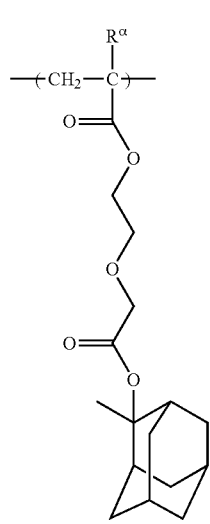
(a1-3-28)
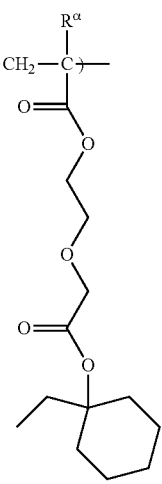

(a1-3-29)
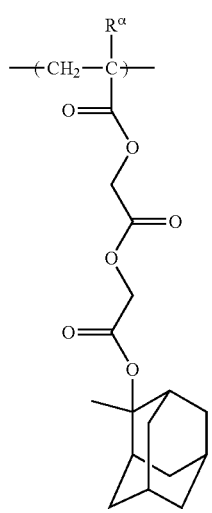
(a1-3-30)
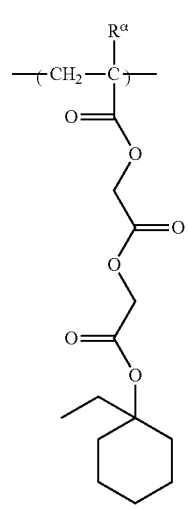
(a1-3-31)
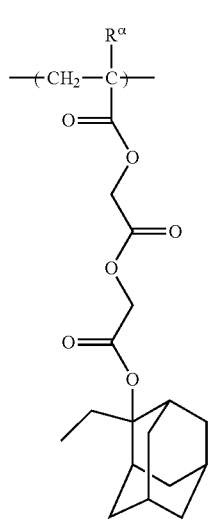
(a1-3-32)
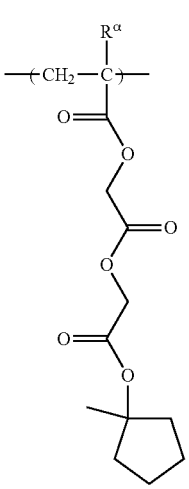
[Chemical Formula 19]
(a1-4-1)
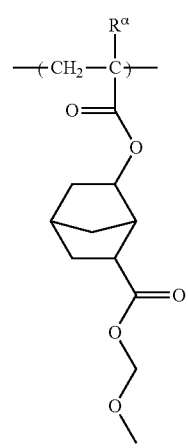
(a1-4-2)
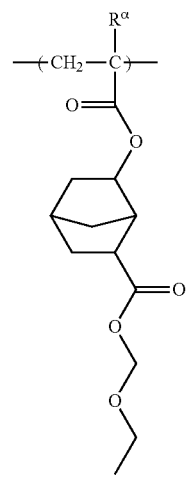

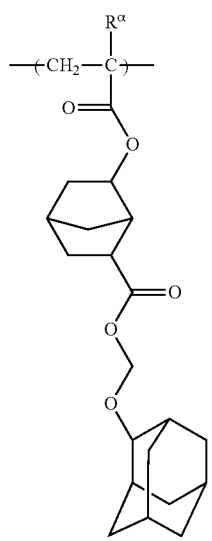
(a1-4-3)
(a1-4-4)
(a1-4-5)
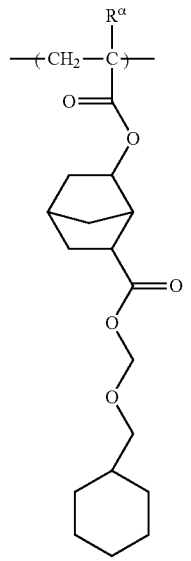
(a1-4-6)
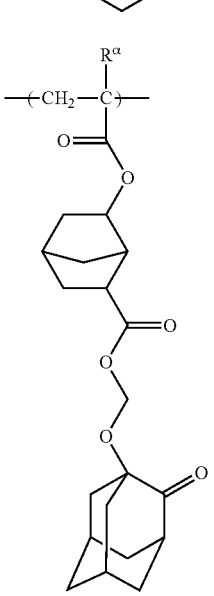
(a1-4-7)
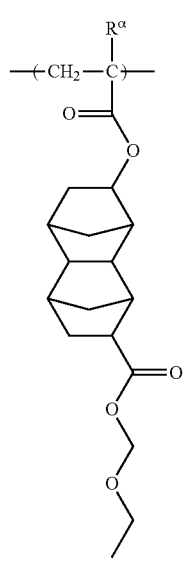
(a1-4-8)

(a1-4-9)
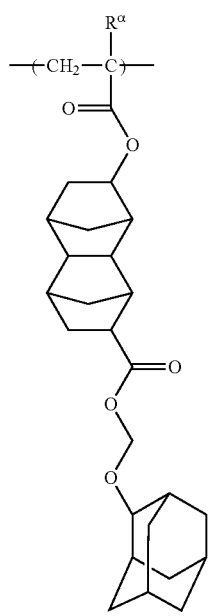
(a1-4-10)
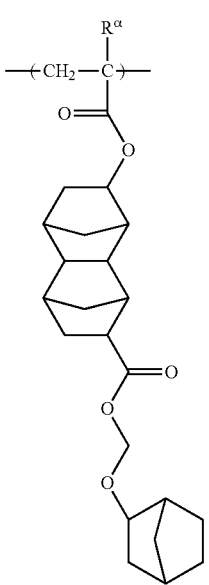
(a1-4-11)
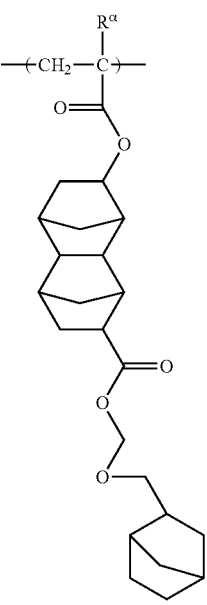
(a1-4-12)
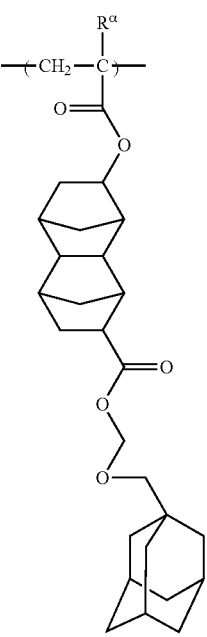

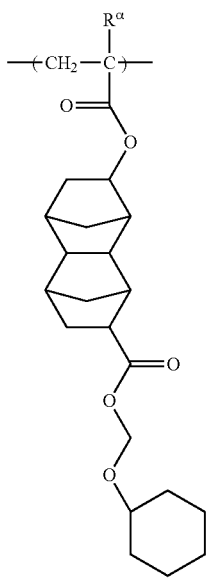

(a1-4-13)

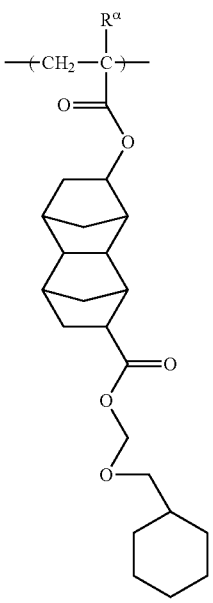

(a1-4-14)

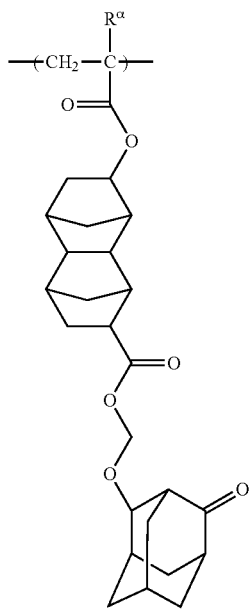

(a1-4-15)

As the structural unit (a1), one type of structural unit may be used alone, or two or more types of structural units may be used in combination.

Among these, structural units represented by general formula (a1-1), (a1-2) or (a1-3) are preferable, and more specifically, the use of at least one structural unit selected from the group consisting of structural units represented by formulas (a1-1-1) to (a1-1-4), formulas (a1-1-20) to (a1-1-23), formulas (a1-2-1) to (a1-2-24), and formulas (a1-3-25) to (a1-3-28) is more preferable.

Moreover, as the structural unit (a1), structural units represented by general formula (a1-2-01) shown below, which includes the structural units represented by formulas (a1-2-3) to (a1-2-6) and formula (a1-2-14), structural units represented by general formula (a1-1-01) shown below, which includes the structural units represented by formulas (a1-1-1) to (a1-1-3) and formula (a1-1-26), structural units represented by general formula (a1-1-02) shown below, which includes the structural units represented by formulas (a1-1-16) to (a1-1-17) and formulas (a1-1-20) to (a1-1-23), structural units represented by general formula (a1-3-01) shown below, which includes the structural units represented by formulas (a1-3-25) to (a1-3-26), structural units represented by general formula (a1-3-02) shown below, which includes the structural units represented by formulas (a1-3-27) to (a1-3-28), and structural units represented by general formula (a1-3-03) shown below, which includes the structural units represented by formulas (a1-3-29) to (a1-3-30) are preferred.

[Chemical Formula 20]

(a1-2-01)

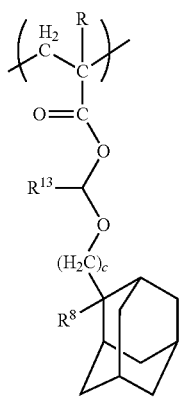

wherein R represents a hydrogen atom, an alkyl group of 1 to 5 carbon atoms or a halogenated alkyl group of 1 to 5 carbon atoms, $R^{13}$ represents a hydrogen atom or a methyl group, $R^8$ represents a hydrogen atom or an alkyl group of 1 to 5 carbon atoms, and c represents an integer of 0 to 3.

In general formula (a1-2-01), R represents a hydrogen atom, an alkyl group of 1 to 5 carbon atoms or a halogenated alkyl group of 1 to 5 carbon atoms. The alkyl group of 1 to 5 carbon atoms for $R^8$ is the same as the alkyl group of 1 to 5 carbon atoms defined above for R, and is preferably a methyl group, ethyl group or isopropyl group. $R^8$ is most preferably a hydrogen atom, methyl group, ethyl group or isopropyl group. c is preferably an integer of 0 to 2, and more preferably 0 or 1.

[Chemical Formula 21]

(a1-1-01)

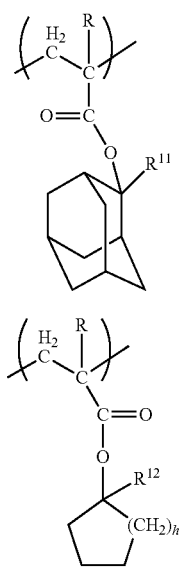

(a1-1-02)

wherein each R independently represents a hydrogen atom, an alkyl group of 1 to 5 carbon atoms or a halogenated alkyl group of 1 to 5 carbon atoms, $R^{11}$ represents an alkyl group of 1 to 5 carbon atoms, $R^{12}$ represents an alkyl group of 1 to 7 carbon atoms, and h represents an integer of 1 to 6.

In general formula (a1-0-1), R is the same as defined above for R in formula (a1-2-01). The alkyl group of 1 to 5 carbon atoms for $R^{11}$ is the same as defined above for the alkyl group of 1 to 5 carbon atoms for R in formula (a1-2-01), and is preferably a methyl group, ethyl group or isopropyl group.

In general formula (a1-1-02), R is the same as defined above for R in formula (a1-2-01). The alkyl group of 1 to 5 carbon atoms for $R^{12}$ is the same as defined above for the alkyl group of 1 to 5 carbon atoms for R in formula (a1-2-01), and is preferably a methyl group, ethyl group or isopropyl group. h is preferably 1 or 2, and most preferably 2.

[Chemical Formula 22]

(a1-3-01)

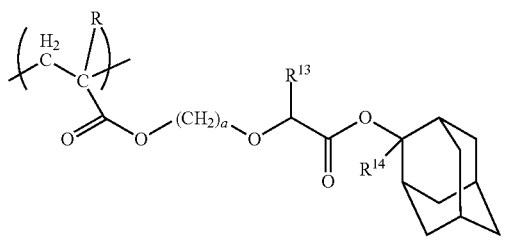

wherein R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, and a represents an integer of 1 to 10.

[Chemical Formula 23]

(a1-3-02)

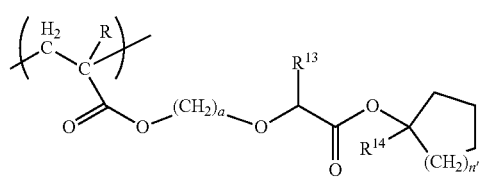

wherein R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, a represents an integer of 1 to 10, and n' represents an integer of 1 to 6.

[Chemical Formula 24]

(a1-3-03)

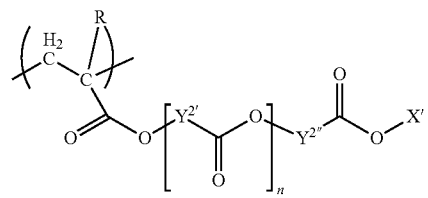

wherein R represents a hydrogen atom, an alkyl group of 1 to 5 carbon atoms or a halogenated alkyl group of 1 to 5 carbon atoms, each of $Y^{2'}$ and $Y^{2''}$ independently represents a divalent linking group, X' represents an acid-dissociable, dissolution-inhibiting group, and n represents an integer of 0 to 3.

In general formulas (a1-3-01) to (a1-3-03), R is the same as defined above for R in formula (a1-2-01).

$R^{13}$ is preferably a hydrogen atom.

The alkyl group of 1 to 5 carbon atoms for $R^{14}$ is the same as defined above for the alkyl group of 1 to 5 carbon atoms for R in formula (a1-2-01), and is preferably a methyl group or an ethyl group.

n' is preferably 1 or 2, and most preferably 2.

a is preferably an integer of 1 to 8, more preferably an integer of 2 to 5, and most preferably 2.

Examples of the divalent linking groups for $Y^{2'}$ and $Y^{2''}$ include the same groups as those described above for $Y^2$ in general formula (a1-3).

As $Y^{2'}$, a divalent hydrocarbon group which may have a substituent is preferable, a linear aliphatic hydrocarbon group is more preferable, and a linear alkylene group is particularly desirable. Among such groups, linear alkylene groups of 1 to 5 carbon atoms are preferable, and a methylene group or ethylene group is the most desirable.

As $Y^{2''}$, a divalent hydrocarbon group which may have a substituent is preferable, a linear aliphatic hydrocarbon group is more preferable, and a linear alkylene group is particularly desirable. Among such groups, linear alkylene groups of 1 to 5 carbon atoms are preferable, and a methylene group or ethylene group is the most desirable.

Examples of the acid-dissociable, dissolution-inhibiting group for X' include the same groups as those described above for $X^1$ in formula (a1-0-1). A tertiary alkyl ester-type acid-dissociable, dissolution-inhibiting group is preferable, and a group having a tertiary carbon atom on the ring structure of a monovalent aliphatic cyclic group is particularly desirable.

n represents an integer of 0 to 3, and is preferably an integer of 0 to 2, more preferably 0 or 1, and most preferably 1.

In the component (A1), the amount of the structural unit (a1), based on the combined total of all the structural units that constitute the component (A1), is preferably within a range from 5 to 80 mol %, more preferably from 10 to 70 mol %, and still more preferably from 15 to 60 mol %. By ensuring that the amount of the structural unit (a1) is at least as large as the lower limit of the above range, a pattern can be formed easily using a resist composition prepared from the component (A1), whereas by ensuring that the amount is not more than the upper limit of the above range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 25]

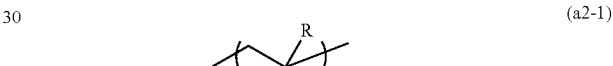
(a2-1)

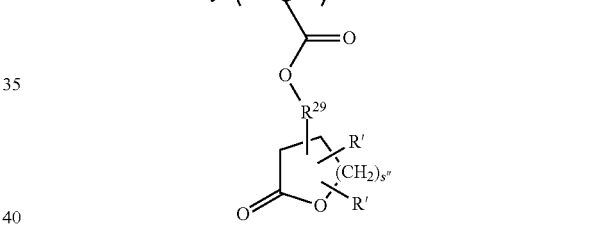
(a2-2)

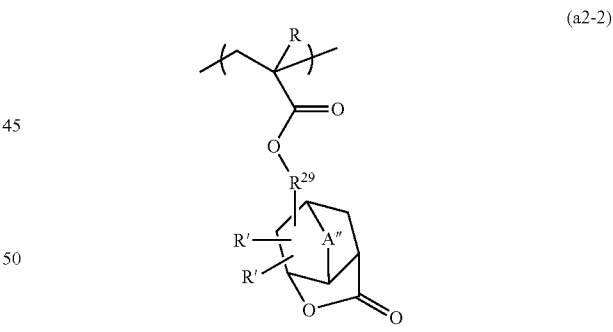
(a2-3)

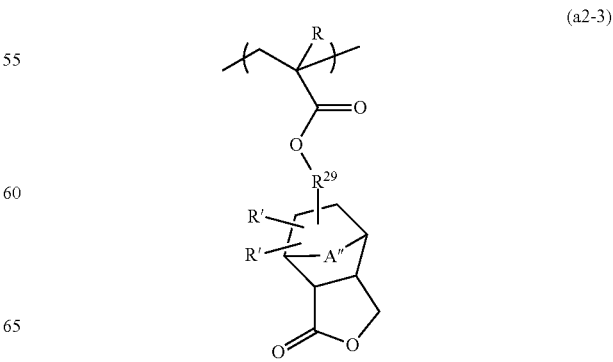

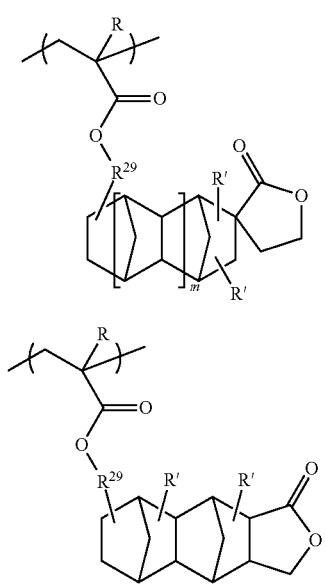

(a2-4)

(a2-5)

wherein R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents 0 or 1.

In general formulas (a2-1) to (a2-5), R is the same as defined above for R in the structural unit (a1).

Examples of the alkyl group of 1 to 5 carbon atoms for R' include a methyl group, ethyl group, propyl group, n-butyl group or tert-butyl group.

Examples of the alkoxy group of 1 to 5 carbon atoms for R' include a methoxy group, ethoxy group, n-propoxy group, iso-propoxy group, n-butoxy group or tert-butoxy group.

In terms of industrial availability, R' is preferably a hydrogen atom.

The alkyl group for R" may be a linear, branched or cyclic alkyl group.

When R" is a linear or branched alkyl group, it preferably has 1 to 10 carbon atoms, and more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or dimethylmethylene group is preferable, and a methylene group is the most desirable.

$R^{29}$ represents a single bond or a divalent linking group. Examples of the divalent linking group include the same divalent linking groups as those described above for $R^{58}$ within $Y^3$ in general formula (a5-2). Among these groups, an alkylene group, an ester linkage (—C(=O)—O—) or a combination thereof is preferred. The alkylene group for the divalent linking group for $R^{29}$ is preferably a linear or branched alkylene group. Specific examples include the same linear alkylene groups and branched alkylene groups as those listed above for the aliphatic hydrocarbon group for $R^{58}$.

As $R^{29}$, a single bond or a group represented by —$R^{29'}$—C(=O)—O—[wherein $R^{29'}$ represents a linear or branched alkylene group] is particularly preferred.

The linear or branched alkylene group for $R^{29'}$ preferably has 1 to 10 carbon atoms, more preferably 1 to 8, still more preferably 1 to 5, still more preferably 1 to 3, and most preferably 1 to 2, carbon atoms.

As the linear alkylene group for $R^{29'}$, a methylene group or ethylene group is preferable, and a methylene group is particularly desirable. As the branched alkylene group for $R^{29'}$, an alkylmethylene group or alkylethylene group is preferable, and —CH(CH$_3$)—, —C(CH$_3$)$_2$— or —C(CH$_3$)$_2$CH$_2$— is particularly desirable.

In formula (a2-1), s" is preferably 1 or 2.

Specific examples of the structural units represented by general formulas (a2-1) to (a2-5) are shown below. In each of the following formulas, $R^\alpha$ represents a hydrogen atom, a methyl group or a trifluoromethyl group.

[Chemical Formula 26]

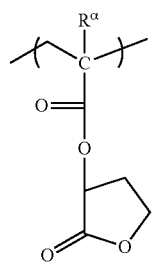

(a2-1-1)

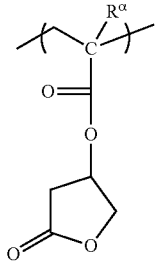

(a2-1-2)

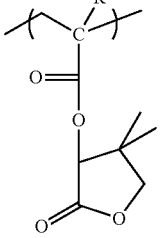

(a2-1-3)

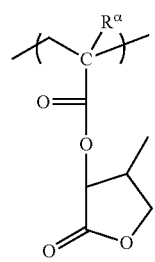 (a2-1-4)
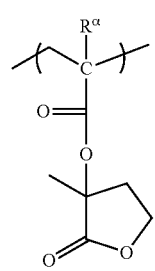 (a2-1-5)
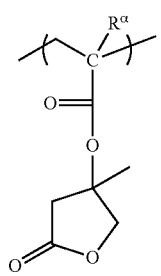 (a2-1-6)
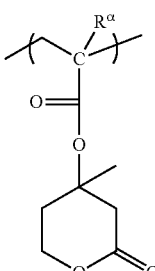 (a2-1-7)
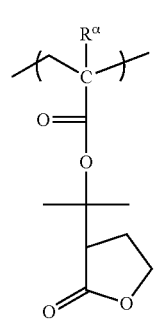 (a2-1-8)
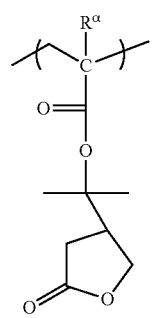 (a2-1-9)
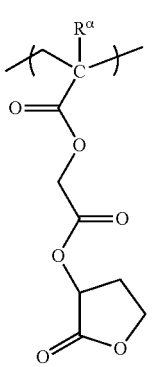 (a2-1-10)
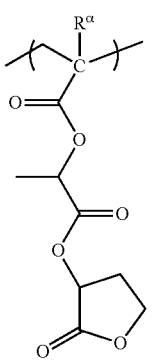 (a2-1-11)
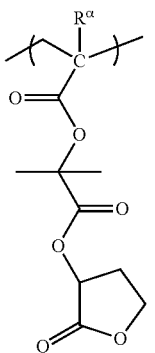 (a2-1-12)

(a2-1-13)
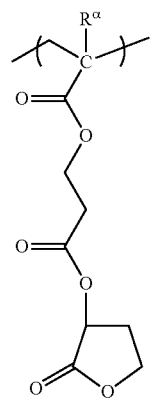
[Chemical Formula 27]
(a2-2-1)
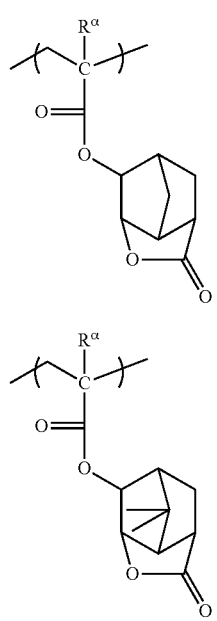
(a2-2-2)
(a2-2-3)
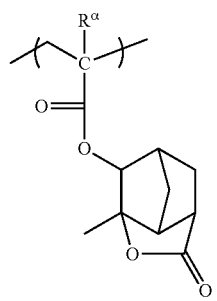
(a2-2-4)
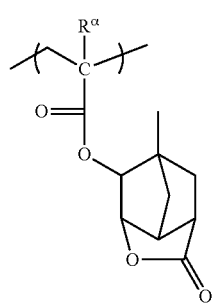
(a2-2-5)
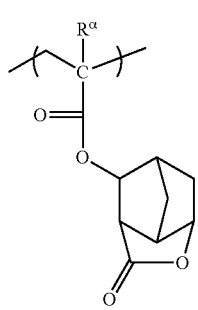
(a2-2-6)
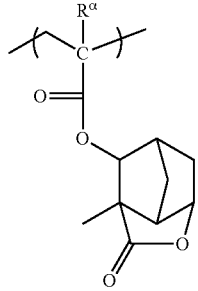
(a2-2-7)
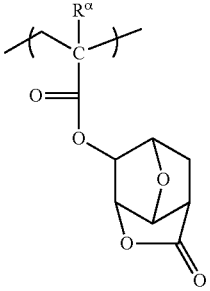
(a2-2-8)
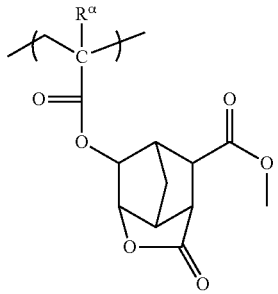
(a2-2-9)
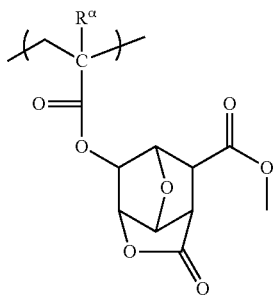

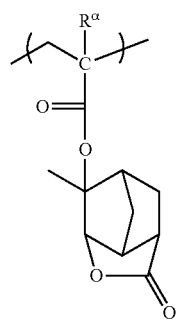 (a2-2-10)
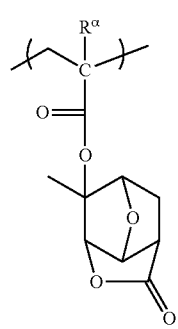 (a2-2-11)
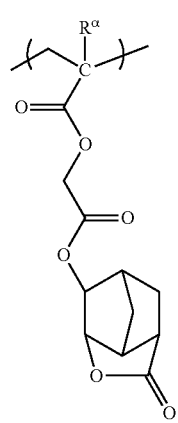 (a2-2-12)
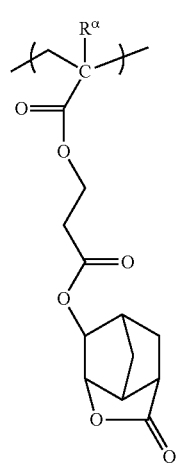 (a2-2-13)
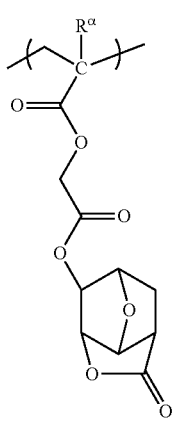 (a2-2-14)
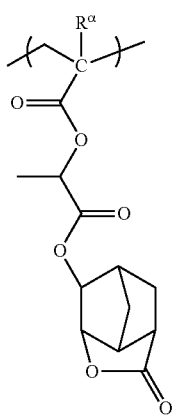 (a2-2-15)
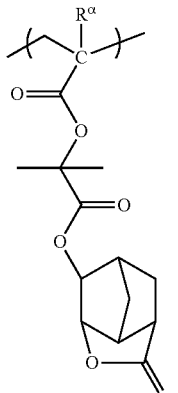 (a2-2-16)

(a2-2-17)
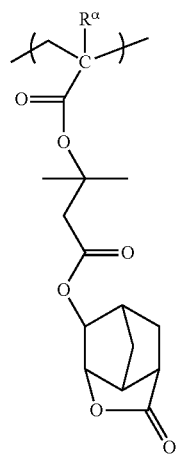
[Chemical Formula 28]
(a2-3-1)
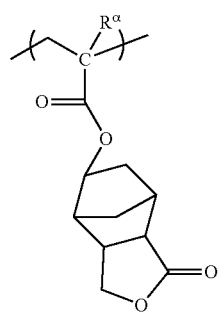
(a2-3-2)
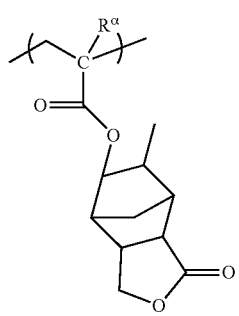
(a2-3-3)
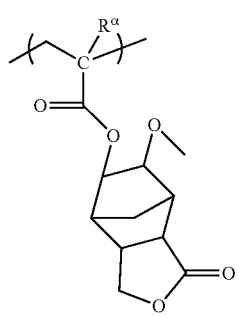
(a2-3-4)
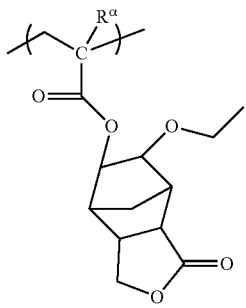
(a2-3-5)
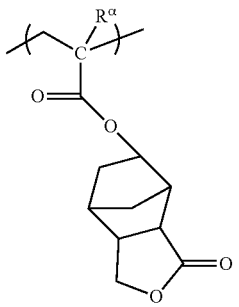
(a2-3-6)
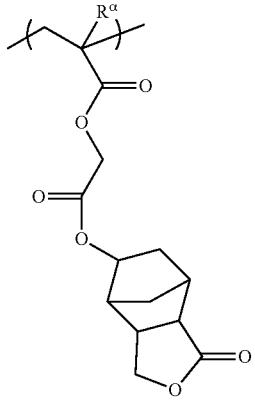
(a2-3-7)
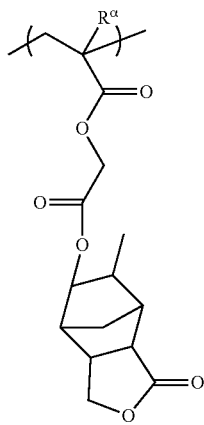

-continued
(a2-3-8)
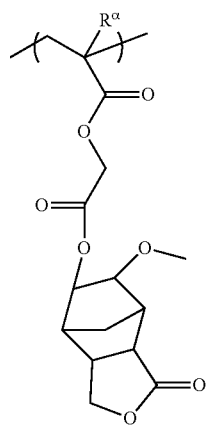
(a2-3-9)
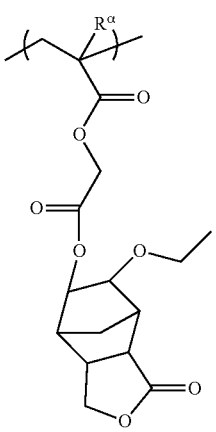
(a2-3-10)
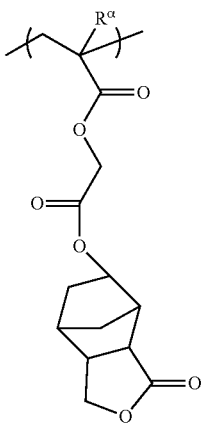
[Chemical Formula 29]
(a2-4-1)
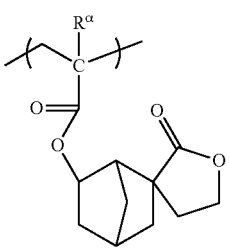
-continued
(a2-4-2)
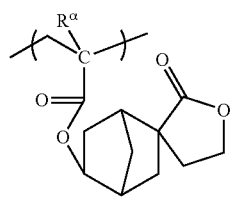
(a2-4-3)
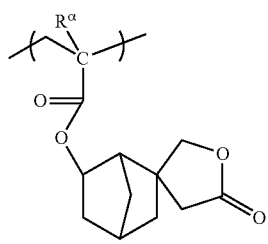
(a2-4-4)
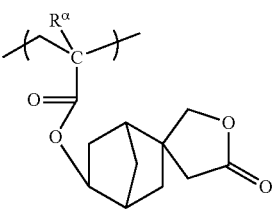
(a2-4-5)
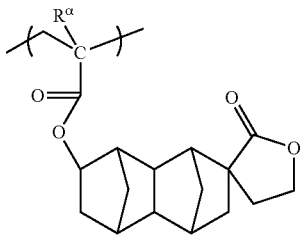
(a2-4-6)
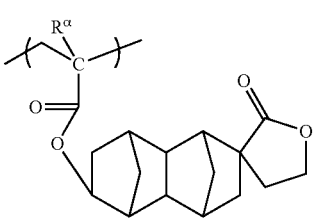
(a2-4-7)
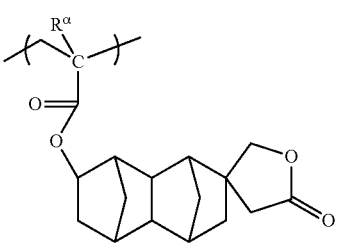
(a2-4-8)
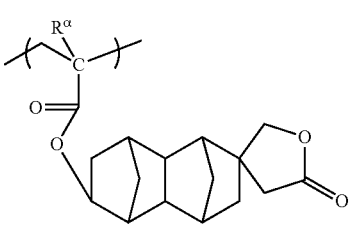

(a2-4-9)
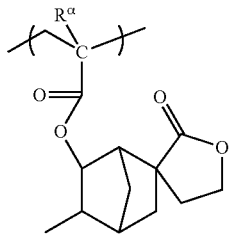
(a2-4-10)
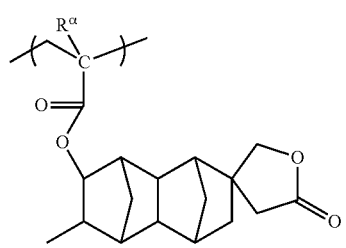
(a2-4-11)
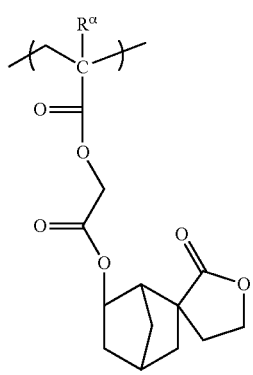
(a2-4-12)
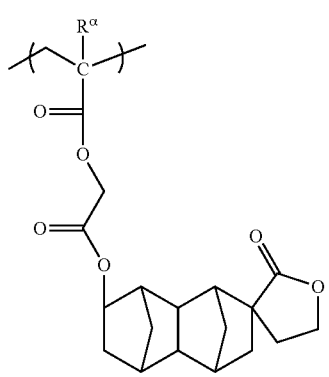
[Chemical Formula 30]
(a2-5-1)
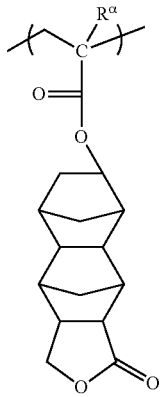
(a2-5-2)
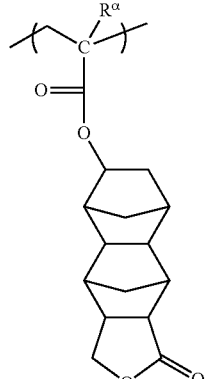
(a2-5-3)
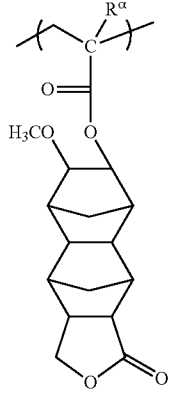
(a2-5-4)
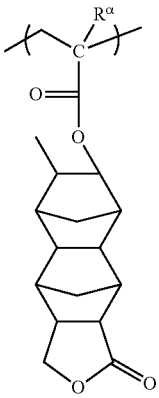

-continued

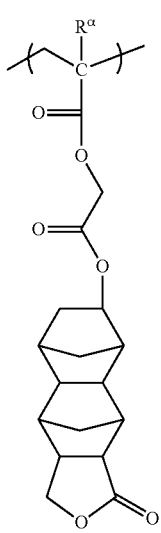

(a2-5-5)

(a2-5-6)

In the component (A1), as the structural unit (a2), one type of structural unit may be used alone, or two or more types of structural units may be used in combination.

In the present invention, the component (A1) preferably includes, as the structural unit (a2), at least one structural unit selected from the group consisting of structural units represented by general formulas (a2-1) to (a2-5), more preferably at least one structural unit selected from the group consisting of structural units represented by general formulas (a2-1) to (a2-3), and most preferably at least one structural unit selected from the group consisting of structural units represented by general formulas (a2-1) and (a2-2).

In terms of achieving superior levels of adhesion to substrates and the like and superior affinity with the developing solution when a positive resist composition containing the component (A1) is used to form a resist film, the amount of the structural unit (a2) within the component (A1), based on the combined total of all the structural units that constitute the component (A1), is preferably within a range from 5 to 70 mol %, more preferably from 10 to 65 mol %, still more preferably from 15 to 65 mol %, and most preferably from 20 to 60 mol %. By ensuring that the amount satisfies this range, the MEF and pattern shape can be further improved, and the CDU also improves.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 31]

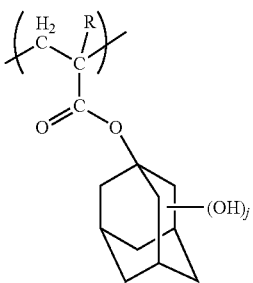

(a3-1)

-continued

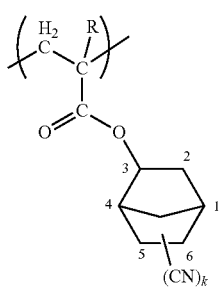
(a3-2)

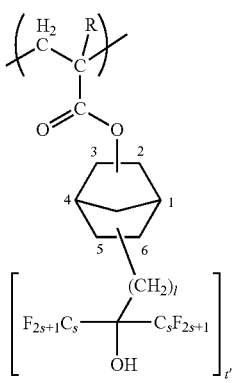
(a3-3)

wherein R is the same as defined above for R in the structural unit (a1), j represents an integer of 1 to 3, k represents an integer of 1 to 3, t' represents an integer of 1 to 3, l represents an integer of 1 to 5, and s represents an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1, and s is preferably 1. Further, in formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3), one type of structural unit may be used, or two or more types may be used in combination.

When the component (A1) contains the structural unit (a3), the amount of the structural unit (a3), based on the combined total of all the structural units that constitute the component (A1), is preferably within a range from 1 to 50 mol %, more preferably from 3 to 45 mol %, and still more preferably from 5 to 40 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

(Other Structural Units)

The component (A1) may also include a structural unit (hereinafter referred to as "structural unit (a4)") which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit derived from an acrylate ester containing a non-acid-dissociable aliphatic polycyclic group is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 32]

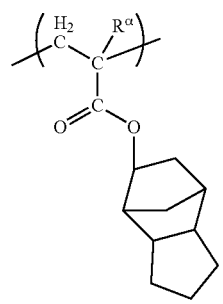
(a4-1)

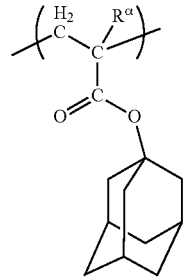
(a4-2)

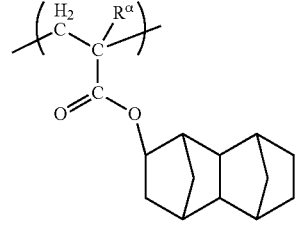
(a4-3)

73

-continued (a4-4)
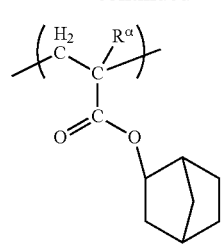

(a4-5)
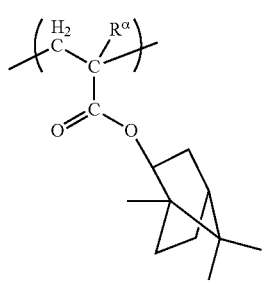

wherein R is as the same as defined above for R in the structural unit (a1).

As the structural unit (a4), one type of structural unit may be used, or two or more types may be used in combination.

When the structural unit (a4) is included in the component (A1), the amount of the structural unit (a4), based on the combined total of all the structural units that constitute the component (A1), is preferably within the range from 1 to 20 mol %, more preferably from 1 to 15 mol %, and still more preferably from 1 to 10 mol %.

The component (A1) is preferably a copolymer having the structural unit (a1).

Examples of such copolymers include copolymers consisting of the structural units (a1) and (a5), copolymers consisting of the structural units (a1), (a2) and (a3), and copolymers consisting of the structural units (a1) and (a2).

In the present invention, as the component (A1), a copolymer containing a combination of structural units shown below in general formula (A1-11) is particularly desirable.

[Chemical Formula 33]

(A1-11)
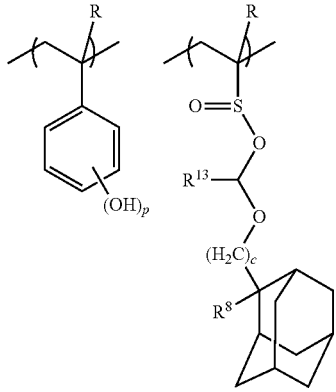

wherein R, $R^{13}$, $R^8$ and c are the same as defined above for R, $R^{13}$, $R^8$ and c in formula (a1-2-01), p is the same as defined above for p in formula (a5-1), and the plurality of R groups in the above formula may be the same or different.

74

The weight average molecular weight (Mw) (the polystyrene equivalent value determined by gel permeation chromatography) of the component (A1) is not particularly limited, but is preferably within a range from 1,000 to 50,000, more preferably from 1,500 to 30,000, and most preferably from 2,500 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the above-mentioned range, the dry etching resistance and cross-sectional shape of the resist pattern are more favorable.

Further, although there are no particular limitations on the dispersity (Mw/Mn) of the component (A1), the dispersity is preferably within a range from 1.0 to 5.0, more preferably from 1.0 to 3.0, and most preferably from 1.2 to 2.5.

Here, Mn is the number average molecular weight.

In the component (A), either a single component (A1) may be used alone, or two or more different types of the component (A1) may be used in combination.

The amount of the component (A1) within the component (A), based on the total weight of the component (A), is preferably not less than 25% by weight, more preferably 50% by weight or more, and still more preferably 75% by weight or more. The amount of the component (A1) may also represent 100% by weight of the component (A). Provided the amount is not less than 25% by weight, effects such as an improvement in the lithography properties can be obtained.

[Component (A2)]

As the component (A2), it is preferable to use a compound that has a molecular weight of at least 500 and less than 2,500, contains a hydrophilic group, and also contains an acid-dissociable, dissolution-inhibiting group exemplified above in connection with the component (A1). Specific examples include compounds containing a plurality of phenol skeletons in which some of the hydrogen atoms of the hydroxyl groups have been substituted with the aforementioned acid dissociable, dissolution-inhibiting groups.

Examples of the component (A2) include low molecular weight phenolic compounds in which a portion of the hydroxyl group hydrogen atoms have been substituted with an aforementioned acid-dissociable, dissolution-inhibiting group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3', 4'-trihydroxyphenyl)propane, tris(4-hydroxyphenyl) methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl) isopropyl]-4-[1,1-bis(4-hydroxyphenyl)ethyl]benzene, and dimers to hexamers of formalin condensation products of phenols such as phenol, m-cresol, p-cresol and xylenol. Needless to say, the low molecular weight phenol compound is not limited to these examples. Phenol compounds having from 2 to 6 triphenylmethane skeletons are particularly preferred, as they yield superior levels of resolution and LWR.

Also, there are no particular limitations on the acid-dissociable, dissolution-inhibiting group, and suitable examples include the groups described above.

A single component (A2) may be used alone, or two or more different types of the component (A2) may be used in combination.

In the resist composition of the present invention, a single component (A) may be used alone, or two or more different types of the component (A) may be used in combination.

Of the various possibilities, the component (A) preferably contains the component (A1).

In the resist composition of the present invention, the amount of the component (A) can be adjusted appropriately depending on factors such as the thickness of the resist film that is to be formed.

<Component (B)>

In the resist composition of the present invention, the component (B) includes an acid generator (B1) (hereinafter referred to as "component (B1)") consisting of a compound represented by general formula (b0) shown below.

[Chemical Formula 34]

(b0)

wherein each of $R^1$ and $R^2$ independently represents an aryl group which may have a substituent, or an alkyl group which may have a substituent, or alternatively, $R^1$ and $R^2$ may be bonded to each other to form a ring in combination with the sulfur atom in the formula, Rf represents a fluorinated alkyl group which may have a substituent, and $X^-$ represents a counter anion.

[Component (B1)]
(Cation Moiety of Component (B1))

In the above general formula (b0), each of $R^1$ and $R^2$ independently represents an aryl group which may have a substituent, or an alkyl group which may have a substituent.

There are no particular limitations on the aryl group which may have a substituent for $R^1$ and $R^2$, and examples include aryl groups of 6 to 20 carbon atoms, wherein some or all of the hydrogen atoms within the aryl group may be substituted. For example, the aryl group may or may not be substituted with one or more alkyl groups, halogen atoms, —O—$R^{70}$, or —C(=O)—O—$R^{70}$ (wherein $R^{70}$ represents a hydrogen atom or a hydrocarbon which may have a substituent).

Among these types of aryl groups, in terms of enabling low-cost synthesis, aryl groups of 6 to 10 carbon atoms are preferred. Specific examples include a phenyl group or naphthyl group.

The alkyl group with which a hydrogen atom of the aryl group may be substituted is preferably an alkyl group of 1 to 5 carbon atoms, more preferably a methyl group, ethyl group, propyl group, n-butyl group, or tert-butyl group, and most preferably a methyl group or tert-butyl group.

Examples of the halogen atom with which a hydrogen atom of the aryl group may be substituted include a fluorine atom, chlorine atom, bromine atom and iodine atom, although a fluorine atom is preferable.

The hydrocarbon group which may have a substituent for $R^{70}$ may be either an aliphatic hydrocarbon group or an aromatic hydrocarbon group.

The aliphatic hydrocarbon group which may have a substituent for $R^{70}$ may be a chain-like group, a cyclic group, or a combination thereof. Further, the group may be saturated or unsaturated.

Examples of this type of aliphatic hydrocarbon group include chain-like or cyclic alkyl groups and combinations thereof, wherein some or all the hydrogen atoms may be substituted with halogen atoms or hydroxyl groups or the like. Specifically, alkyl groups of 1 to 15 carbon atoms are preferable, a methyl group, ethyl group, propyl group, n-butyl group, tert-butyl group, pentyl group, hexyl group, heptyl group, octyl group, nonyl group, decanyl group, undecyl group or dodecyl group is more preferable, and a methyl group is the most desirable.

Further, if the aliphatic hydrocarbon group for $R^{70}$ includes a halogen atom as a substituent, then for processing using liquid immersion lithography, an enhanced elution retarding effect is achieved during the immersion exposure, and therefore $R^{70}$ is preferably a fluorinated alkyl group, and is more preferably an alkyl group in which the terminal hydrogen atoms are fluorinated.

Specifically, —$(CH_2)_3$—$C_4F_9$ is particularly desirable.

Examples of the aromatic hydrocarbon group which may have a substituent for $R^{70}$ include a phenyl group, biphenyl group, fluorenyl group, naphthyl group, anthryl group and phenanthryl group, and from the viewpoint of enabling low-cost synthesis, a phenyl group or naphthyl group is preferred.

Further, if the aromatic hydrocarbon group for $R^{70}$ includes a halogen atom as a substituent, then for processing using liquid immersion lithography, an enhanced elution retarding effect is achieved during the immersion exposure. This halogen atom is preferably a fluorine atom.

Furthermore, for those cases where the above-mentioned —O$R^{70}$ has a substituent, examples of the –O$R^{70}$ group include the groups listed below:

—O—C(=O)—$R^{701}$ (wherein $R^{701}$ represents an aliphatic hydrocarbon group which may have a substituent), —O—$CH_2$—C(=O)—O—$R^{702}$ (wherein $R^{702}$ represents a hydrogen atom or an acid-dissociable, dissolution-inhibiting group), —O—$CH_2$—C(=O)—O—$R^{703}$ (wherein $R^{703}$ represents a lactone-containing cyclic group), and —O—$CH_2$—C(=O)—O—$R^{704}$ (wherein $R^{704}$ represents a methyl group, ethyl group or —$CH_2$—$R^{705}$ (wherein $R^{705}$ represents a fluorinated alkyl group of 1 to 5 carbon atoms)).

If the above-mentioned —O$R^{70}$ is a group represented by —O—C(=O)—$R^{701}$, then the compatibility with the component (A) and the solubility within solvents can be enhanced, both of which are desirable.

Examples of the aliphatic hydrocarbon for $R^{701}$ include chain-like or cyclic alkyl groups and combinations thereof, wherein some or all of the hydrogen atoms may be substituted with halogen atoms or hydroxyl groups or the like. Specifically, alkyl groups of 1 to 15 carbon atoms are preferable, and the same chain-like alkyl groups as those listed above are ideal in terms of improving the solvent solubility, whereas monocycloalkyl groups such as a cyclopentyl group or cyclohexyl group, and polycycloalkyl groups such as an adamantyl group, norbornyl group, isobornyl group, tricyclodecyl group or tetracyclododecyl group are ideal for improving the compatibility with the component (A) (groups containing a polycycloalkyl group are particularly desirable). Preferred examples of the group —O—C(=O)—$R^{701}$ include the groups shown below.

[Chemical Formula 35]

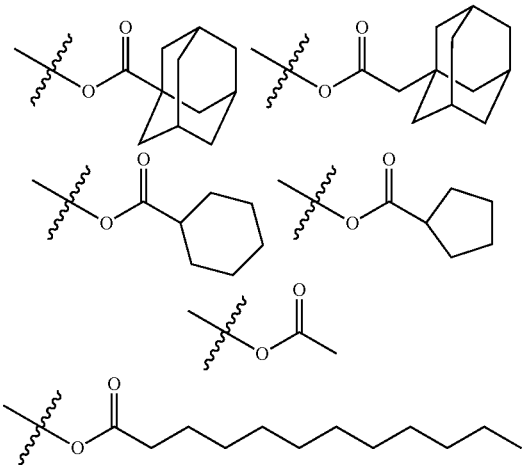

If the above-mentioned —$OR^{70}$ is a group represented by —O—$CH_2$—C(=O)—O—$R^{702}$, then the solubility within the developing solution and rinse liquid can be controlled favorably. In those cases where $R^{702}$ represents an acid-dissociable group, examples of $R^{702}$ include the same groups as those listed above for $X^1$ in formula (a1-0-1). Preferred examples of the group —O—$CH_2$—C(=O)—O—$R^{702}$ include the groups shown below.

[Chemical Formula 36]

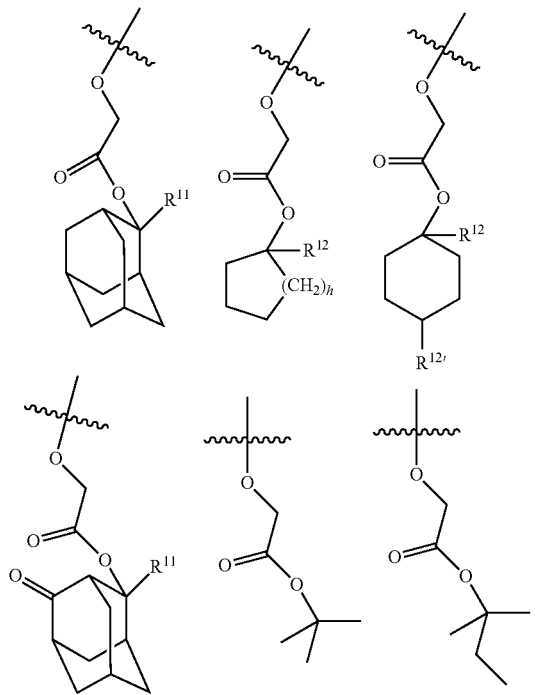

wherein $R^{11}$ is an alkyl group of 1 to 5 carbon atoms, as defined above in relation to formula (a1-1-01), $R^{12}$ represents an alkyl group of 1 to 7 carbon atoms and h represents an integer of 1 to 6, as defined above in relation to formula (a1-1-02), and $R^{12'}$ represents an alkyl group of 1 to 5 carbon atoms.

If the above-mentioned —$OR^{70}$ is a group represented by —O—$CH_2$—C(=O)—O—$R^{703}$, then in the case of a positive resist composition, an enhanced precipitate reduction effect is achieved within the exposed portions, which is desirable.

Examples of the lactone-containing cyclic group of $R^{703}$ include not only groups of formulas (L1) to (L5) and (S1) to (S4) described below, but also substituent groups represented by the formulas shown below.

[Chemical Formula 37]

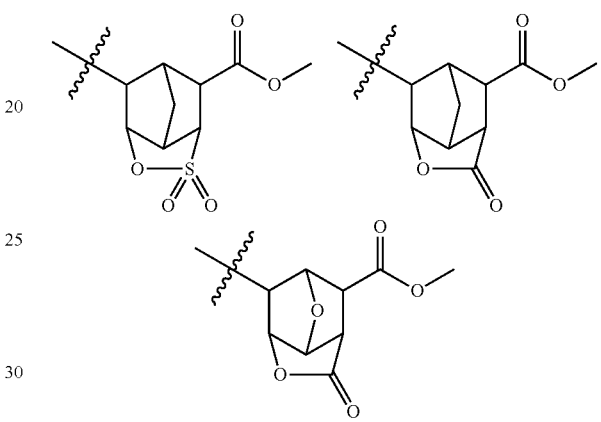

If the above-mentioned —$OR^{70}$ is a group represented by —O—$CH_2$—C(=O)—O—$R^{704}$, then in the case of a positive resist composition, an enhanced precipitate reduction effect is achieved within the exposed portions, which is desirable, and particularly in those cases where the group includes one or more fluorine atoms, an enhanced elution retarding effect is achieved during immersion exposure in a liquid immersion lithography process, which is also desirable.

$R^{704}$ represents a methyl group, an ethyl group, or —$CH_2$—$R^{705}$ (wherein $R^{705}$ represents a fluorinated alkyl group of 1 to 5 carbon atoms).

In those cases where $R^{704}$ represents —$CH_2$—$R^{705}$, preferred examples of —$R^{705}$ include the groups shown below.

[Chemical Formula 38]

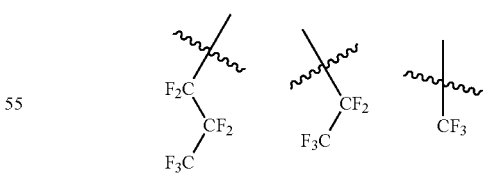

In formula (b0), there are no particular limitations on the alkyl group which may have a substituent for $R^1$ and $R^2$, and examples include linear, branched and cyclic alkyl groups of 1 to 10 carbon atoms in which some or all of the hydrogen atoms may be substituted. For example, one or more of the hydrogen atom may or may not be substituted with a halogen atom, a hydroxyl group or —O—$R^{70}$ (wherein $R^{70}$ is the same as defined above).

In terms of achieving superior resolution, an alkyl group of 1 to 5 carbon atoms is preferable. Specific examples include a methyl group, ethyl group, n-propyl group, isopropyl group, n-butyl group, n-butyl group, isobutyl group, n-pentyl group, cyclopentyl group, hexyl group, cyclohexyl group, nonyl group and decyl group. Among these, in terms of achieving superior resolution and enabling low-cost synthesis, a methyl group is particularly desirable.

Examples of the halogen atom with which a hydrogen atom of the alkyl group may be substituted include a fluorine atom, chlorine atom, bromine atom or iodine atom, and a fluorine atom is preferable.

In formula (b0), $R^1$ and $R^2$ may be bonded to each other to form a ring in combination with the sulfur atom in the formula.

In such cases, it is preferable that the ring that is formed is a 3- to 10-membered ring including the sulfur atom, and a 5- to 7-membered ring including the sulfur atom is particularly desirable.

The ring structure formed in combination with the sulfur atom may also include a hetero atom such as a sulfur atom or an oxygen atom (—O—, =O).

Specific examples of the ring that is formed include a benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolidine ring, quinoline ring, phthalazine ring, naphthylidine ring, quinoxaline ring, quinoxazoline ring, isoquinoline ring, carbazole ring, phenanthridine ring, acridine ring, phenanthroline ring, thianthrene ring, chromene ring, xanthene ring, phenoxazine ring, phenothiazine ring and phenazine ring.

In the above general formula (b0), Rf represents a fluorinated alkyl group which may have a substituent.

Examples of the fluorinated alkyl group include groups in which some or all of the hydrogen atoms within an unsubstituted alkyl group described below have been substituted with fluorine atoms. The fluorinated alkyl group may either be a group in which some of the hydrogen atoms of the unsubstituted alkyl group have been substituted with fluorine atoms, or a group in which all of the hydrogen atoms of the unsubstituted alkyl group have been substituted with fluorine atoms (namely, a perfluoroalkyl group).

The unsubstituted alkyl group may be a linear, branched or cyclic group, or a combination of a linear or branched alkyl group and a cyclic alkyl group.

The unsubstituted linear alkyl group is preferably a group of 1 to 10 carbon atoms, and more preferably 1 to 8 carbon atoms. Specific examples include a methyl group, ethyl group, n-propyl group, n-butyl group, n-pentyl group, n-hexyl group, n-heptyl group, n-octyl group, n-nonyl group or n-decyl group.

The unsubstituted branched alkyl group is preferably a group of 3 to 10 carbon atoms, and more preferably 3 to 8 carbon atoms. As the branched alkyl group, a tertiary alkyl group is preferred.

Examples of the unsubstituted cyclic alkyl group include groups in which one hydrogen atom has been removed from a monocycloalkane, or a polycycloalkane such as a bicycloalkane, tricycloalkane or tetracycloalkane. Specific examples include monocycloalkyl groups such as a cyclopentyl group and cyclohexyl group, and polycycloalkyl groups such as an adamantyl group, norbornyl group, isobornyl group, tricyclodecyl group or tetracyclododecyl group.

Examples of the combination of an unsubstituted linear or branched alkyl group and a cyclic alkyl group include linear and branched alkyl groups having a cyclic alkyl group bonded thereto as a substituent, and cyclic alkyl groups having a linear or branched alkyl group bonded thereto as a substituent.

Examples of the substituent which the fluorinated alkyl group may have include alkyl groups of 1 to 5 carbon atoms.

The fluorinated alkyl group for Rf is preferably a linear or branched fluorinated alkyl group. Groups represented by general formula (I) shown below are particularly preferable.

[Chemical Formula 39]

wherein m represents an integer of 0 to 5, and n represents an integer of 0 to 10, provided that m+n≥1.

In formula (I), m represents an integer of 0 to 5, and is preferably an integer of 1 to 5.

n represents an integer of 0 to 10, and is preferably an integer of 1 to 10.

However, m+n≥1. Accordingly, if m is 0, then n must be an integer of 1 to 10, and if n is 0, then m must be an integer of 1 to 5.

Specific examples of the cation moiety of component (B1) are shown below. In the following formulas, "Me" represents a methyl group.

[Chemical Formula 40]

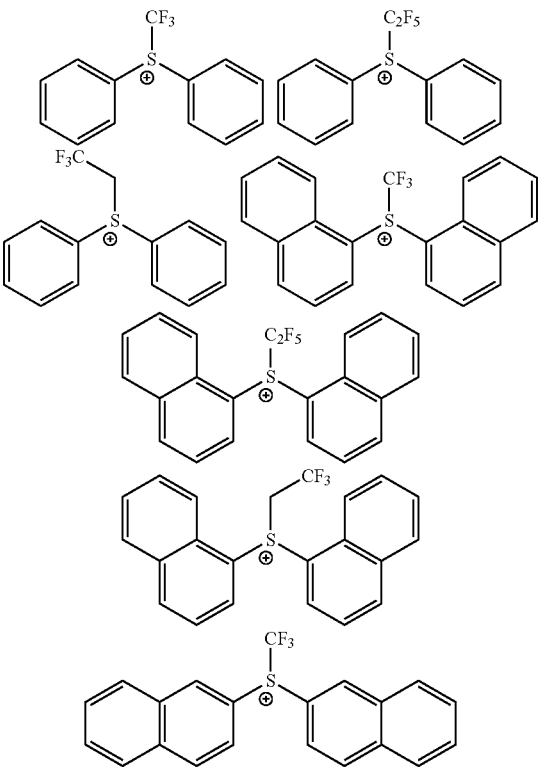

-continued
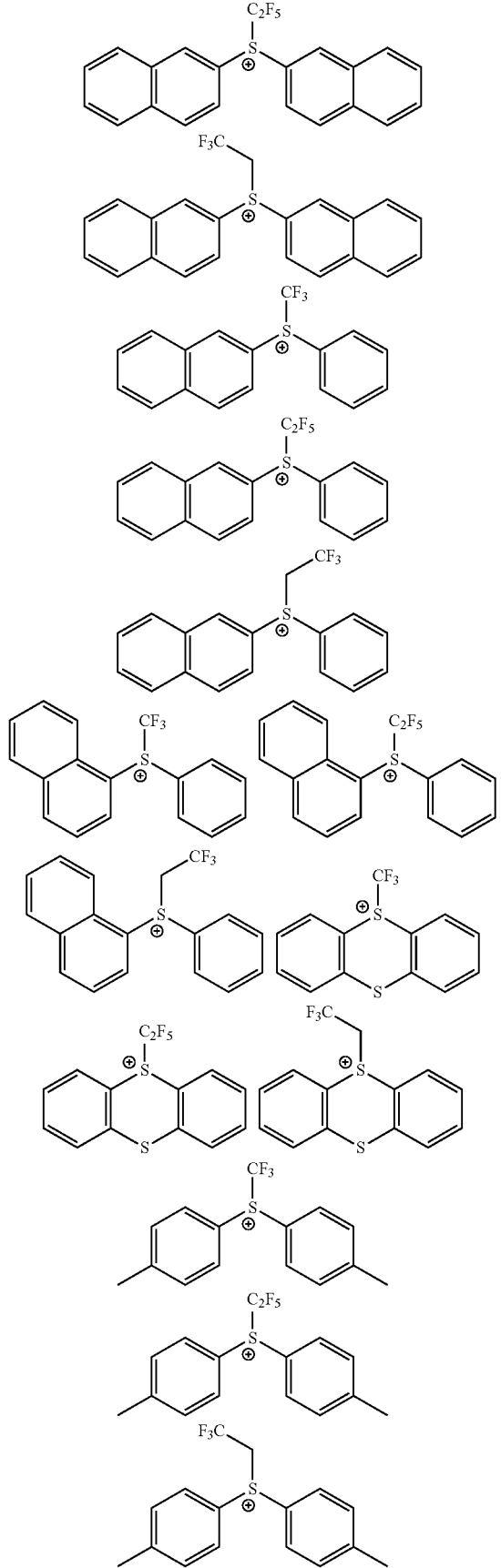
[Chemical Formula 41]
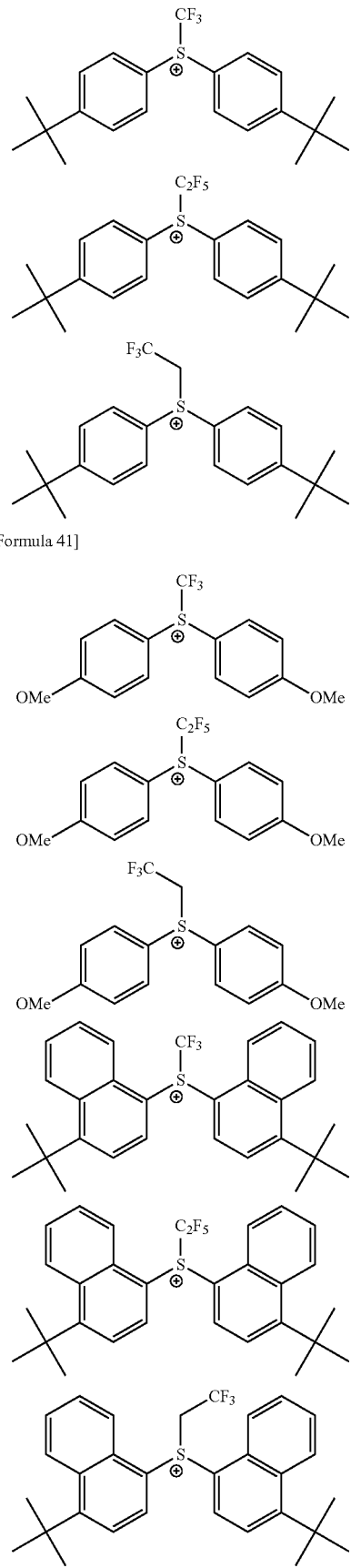

-continued

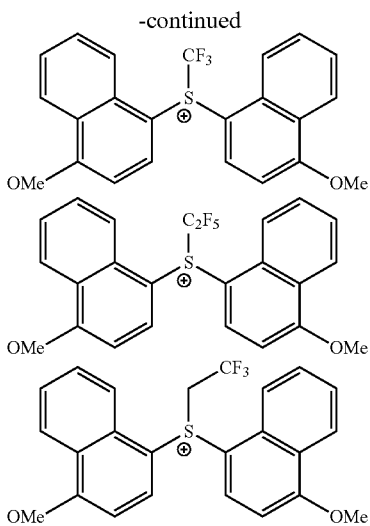

(Anion Moiety of Component (B1))

In the above formula (b0), $X^-$ represents a counter anion.

There are no particular limitations on the anion for $X^-$, and for example, any of the anions known as anion moieties for onium salt-based acid generators may be used appropriately.

Examples of $X^-$ include anions represented by the general formula $R^{20}SO_3^-$ (wherein $R^{20}$ represents a linear, branched or cyclic alkyl group which may have a substituent, a halogenated alkyl group, an aryl group or an alkenyl group).

In the general formula $R^{20}SO_3^-$, $R^{20}$ represents a linear, branched or cyclic alkyl group which may have a substituent, a halogenated alkyl group, an aryl group or an alkenyl group.

The linear or branched alkyl group for $R^{20}$ is preferably a group of 1 to 10 carbon atoms, more preferably 1 to 8 carbon atoms, and most preferably 1 to 4 carbon atoms.

The cyclic alkyl group for $R^{20}$ is preferably a cyclic group of 4 to 15 carbon atoms, more preferably 4 to 10 carbon atoms, and most preferably 6 to 10 carbon atoms.

The halogenated alkyl group for $R^{20}$ is a group in which some or all of the hydrogen atoms within an alkyl group have been substituted with halogen atoms, wherein the alkyl group is preferably an alkyl group of 1 to 5 carbon atoms, is more preferably a linear or branched alkyl group, and is most preferably a methyl group, ethyl group, propyl group, isopropyl group, n-butyl group, tert-butyl group, tert-pentyl group, or isopentyl group. Examples of the halogen atoms used for substituting the hydrogen atoms include fluorine atoms, chlorine atoms, iodine atoms and bromine atoms.

In the halogenated alkyl group, it is preferable that 50 to 100% of all the hydrogen atoms within the alkyl group (the alkyl group prior to halogenation) are substituted with halogen atoms, and groups in which all of the hydrogen atoms have been substituted with halogen atoms are particularly desirable.

As the halogenated alkyl group, a fluorinated alkyl group is preferable. The fluorinated alkyl group is preferably a group of 1 to 10 carbon atoms, more preferably 1 to 8 carbon atoms, and most preferably 1 to 4 carbon atoms.

Furthermore, the fluorination ratio of the fluorinated alkyl group, is preferably within a range from 10 to 100%, and more preferably from 50 to 100%. Groups in which all of the hydrogen atoms have been substituted with fluorine atoms are particularly desirable as they yield stronger acids.

Specific examples of these types of preferred fluorinated alkyl groups include a trifluoromethyl group, pentafluoro-n-propyl group and nonafluoro-n-butyl group.

The aryl group for $R^{20}$ is preferably an aryl group of 6 to 20 carbon atoms.

The alkenyl group for $R^{20}$ is preferably an alkenyl group of 2 to 10 carbon atoms.

The expression that $R^{20}$ "may have a substituent" means that some or all of the hydrogen atoms within the above-mentioned linear, branched or cyclic alkyl group, halogenated alkyl group, aryl group or alkenyl group may be substituted with a substituent (an atom other than a hydrogen atom or a group).

The number of substituents within $R^{20}$ may be either 1, or 2 or more.

Examples of the substituent include halogen atoms, hetero atoms, alkyl groups, and groups represented by the formula $X^3$-$Q^1$- (wherein $Q^1$ represents a divalent linking group containing an oxygen atom, and $X^3$ represents a hydrocarbon group of 3 to 30 carbon atoms which may have a substituent).

Examples of the halogen atoms and alkyl groups include the same halogen atoms and alkyl groups as those described above with respect to the halogenated alkyl group for $R^{20}$.

Examples of the hetero atoms include an oxygen atom, a nitrogen atom, and a sulfur atom.

In the group represented by formula $X^3$-$Q^1$-, $Q^1$ represents a divalent linking group containing an oxygen atom.

$Q^1$ may also contain atoms other than the oxygen atom. Examples of these atoms other than the oxygen atom include a carbon atom, hydrogen atom, sulfur atom and nitrogen atom.

Examples of the divalent linking group containing an oxygen atom include non-hydrocarbon-based oxygen atom-containing linking groups such as an oxygen atom (an ether bond, —O—), an ester linkage (—C(=O)—O—), an amide linkage (—C(=O)—NH—), a carbonyl group (—C(=O)—), a carbonate linkage (—O—C(=O)—O—), and combinations of these non-hydrocarbon-based hetero atom-containing linking groups with an alkylene group. These combinations may also include an additional sulfonyl (—SO$_2$—) linkage.

Specific examples of the combinations include —$R^{91}$—O—, —$R^{92}$—O—C(=O)—, —C(=O)—O—$R^{93}$—O—C(=O)—, —SO$_2$—O—$R^{94}$—O—C(=O)—, and —$R^{95}$—SO$_2$—O—$R^{94}$—O—C(=O)— (wherein each of $R^{91}$ to $R^{95}$ independently represents an alkylene group).

The alkylene group for $R^{91}$ to $R^{95}$ is preferably a linear or branched alkylene group, and preferably contains 1 to 12 carbon atoms, more preferably 1 to 5 carbon atoms, and most preferably 1 to 3 carbon atoms.

Specific examples of the alkylene group include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, an ethylene group [—CH$_2$CH$_2$—], alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—], alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

$Q^1$ is preferably a divalent linking group containing an ester linkage or ether linkage, and more preferably a group represented by —R$^{91}$—O—, —R$^{92}$—O—C(=O)— or —C(=O)—O—R$^{93}$—O—C(=O)—.

In the group represented by the formula X$^3$-Q$^1$-, the hydrocarbon group for X$^3$ may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30, still more preferably 5 to 20, still more preferably 6 to 15, and most preferably 6 to 12 carbon atoms. This number of carbon atoms does not include any carbon atoms within substituents.

Specific examples of the aromatic hydrocarbon group include aryl groups, which are aromatic hydrocarbon rings having one hydrogen atom removed therefrom, such as a phenyl group, biphenyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, a portion of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which a portion of the carbon atoms constituting the ring within an aforementioned aryl group have been substituted with a hetero atom such as an oxygen atom, a sulfur atom or a nitrogen atom, and heteroarylalkyl groups in which a portion of the carbon atoms constituting the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group or oxygen atom (=O) or the like.

The alkyl group as the substituent for the aromatic hydrocarbon group is preferably an alkyl group having 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which some or all of the hydrogen atoms within an aforementioned alkyl group have been substituted with aforementioned halogen atoms.

The aliphatic hydrocarbon group for X$^3$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for X$^3$, a portion of the carbon atoms constituting the aliphatic hydrocarbon group may be substituted with a substituent containing a hetero atom, and/or some or all of the hydrogen atoms constituting the aliphatic hydrocarbon group may be substituted with a substituent containing a hetero atom.

There are no particular limitations on this "hetero atom" within X$^3$, provided it is an atom other than a carbon atom or a hydrogen atom. Examples of the hetero atom include a halogen atom, oxygen atom, sulfur atom and nitrogen atom.

Examples of the halogen atom include a fluorine atom, chlorine atom, iodine atom and bromine atom.

The substituent containing a hetero atom may consist solely of the hetero atom, or may be a group that also contains a group or atom other than a hetero atom.

Specific examples of the substituent for substituting a portion of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, any of these substituents may be included within the ring structure of the aliphatic hydrocarbon group.

Examples of the substituent for substituting some or all of the hydrogen atoms include an alkoxy group, halogen atom, halogenated alkyl group, hydroxyl group, oxygen atom (=O) and cyano group.

The alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which some or all of the hydrogen atoms within an alkyl group of 1 to 5 carbon atoms (such as a methyl group, ethyl group, propyl group, n-butyl group or tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30, still more preferably 5 to 20, still more preferably 6 to 15, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure thereof, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L5) and (S1) to (S4) shown below.

[Chemical Formula 42]

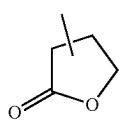 (L1)

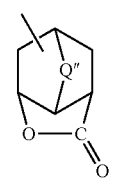 (L2)

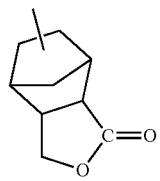 (L3)

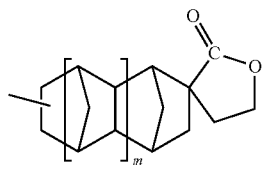 (L4)

-continued

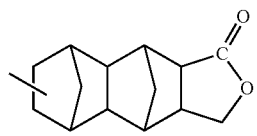 (L5)

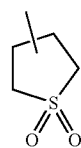 (S1)

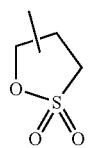 (S2)

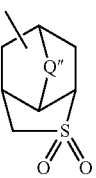 (S3)

(S4)

wherein Q" represents an alkylene group of 1 to 5 carbon atoms, —O—, —S—, —O—$R^{94'}$— or —S—$R^{95'}$%, each of $R^{94'}$ and $R^{95'}$ independently represents an alkylene group of 1 to 5 carbon atoms, and m represents an integer of 0 or 1.

Examples of the alkylene groups for Q", $R^{94'}$ and $R^{95'}$ include the same alkylene groups as those described above for $R^{91}$ to $R^{93}$.

In these aliphatic cyclic groups, a portion of the hydrogen atoms bonded to the carbon atoms that constitute the ring structure may be substituted with a substituent. Examples of this substituent include an alkyl group, alkoxy group, halogen atom, halogenated alkyl group, hydroxyl group or oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting some or all of the hydrogen atoms.

In the present invention, $X^3$ is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by formulas (L2) to (L5), and (S3) and (S4) above are preferable.

Among the above possibilities, $R^{20\prime}$ is preferably a halogenated alkyl group or a group having $X^3$-$Q^1$- as a substituent.

In those cases where $R^{20}$ has $X^3$-$Q^1$- as a substituent, $R^{20}$ is preferably a group represented by the formula $X^3$-$Q^1$-$Y^3$— (wherein $Q^1$ and $X^3$ are the same as defined above, and $Y^3$ represents an alkylene group of 1 to 4 carbon atoms which may have a substituent, or a fluorinated alkylene group of 1 to 4 carbon atoms which may have a substituent).

In the group represented by the formula $X^3$-$Q^1$-$Y^3$—, examples of the alkylene group represented by $Y^3$ include those alkylene groups described above for $Q^1$ in which the number of carbon atoms is within a range from 1 to 4.

Examples of the fluorinated alkylene group for $Y^3$ include groups in which some or all of the hydrogen atoms of an aforementioned alkylene group have been substituted with fluorine atoms.

Specific examples of $Y^3$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—, —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—, —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$— and —$C(CH_3)(CH_2CH_3)$—.

$Y^3$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CH_2CF_2$—, —$CH_2CF_2CF_2$—, —$CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include alkyl groups of 1 to 4 carbon atoms, alkoxy groups of 1 to 4 carbon atoms, and a hydroxyl group.

Specific examples of $R^{20}$—$SO_3^-$ in those cases where $R^{20}$ is a group represented by $X^3$-$Q^1$-$Y^3$— include anions represented by formulas (b1) to (b9) shown below.

[Chemical Formula 43]

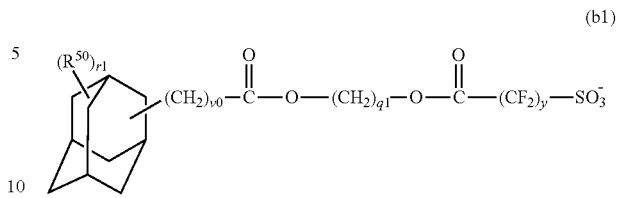
(b1)

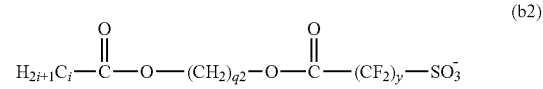
(b2)

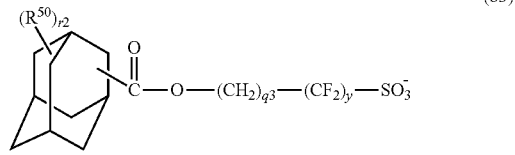
(b3)

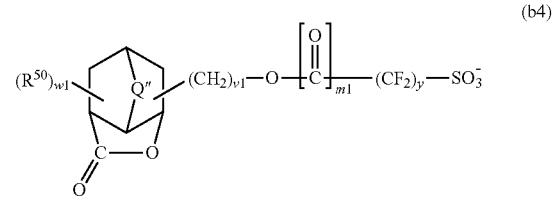
(b4)

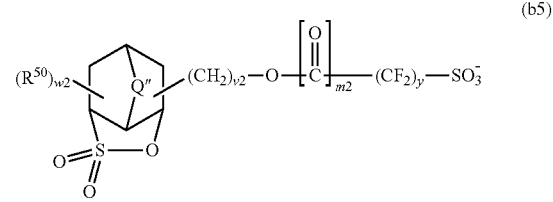
(b5)

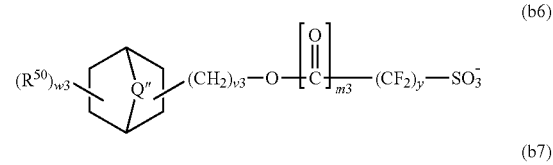
(b6)

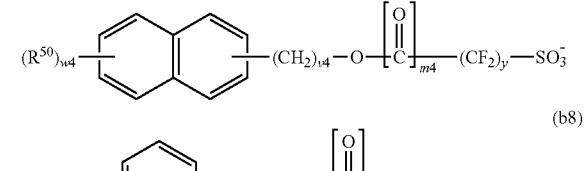
(b7)

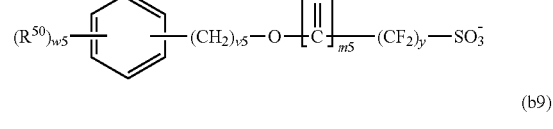
(b8)

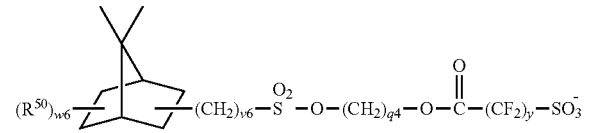
(b9)

wherein y represents an integer of 1 to 3, each of q1 and q2 independently represents an integer of 1 to 5, q3 represents an integer of 1 to 12, q4 represents an integer of 1 to 3, each of r1 and r2 independently represents an integer of 0 to 3, i represents an integer of 1 to 20, $R^{50}$ represents a substituent, each of m1 to m5 independently represents 0 or 1, each of v0 to v6 independently represents an integer of 0 to 3, each of w1 to w6 independently represents an integer of 0 to 3, and Q" is the same as defined above.

Examples of the substituent for $R^{50}$ include the same groups as those which the aforementioned aliphatic hydrocarbon group or aromatic hydrocarbon group for $X^3$ may have as a substituent.

If there are two or more $R^{50}$ groups, as indicated by the values r1 and r2, and w1 to w6, then the plurality of $R^{50}$ groups within the compound may be the same or different from each other.

Further, in the above general formula (b0), r may also be an anion represented by general formula (b-3) shown below, or an anion represented by general formula (b-4) shown below.

[Chemical Formula 44]

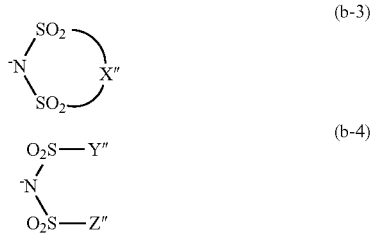

(b-3)

(b-4)

wherein X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

In general formula (b-3), X" represents a linear or branched alkylene group in which at least one hydrogen atom has been substituted with a fluorine atom, wherein the alkylene group preferably has 2 to 6 carbon atoms, more preferably 3 to 5 carbon atoms, and most preferably 3 carbon atoms.

In general formula (b-4), each of Y" and Z" independently represents a linear or branched alkyl group in which at least one hydrogen atom has been substituted with a fluorine atom, wherein the alkyl group preferably has 1 to 10 carbon atoms, more preferably 1 to 7 carbon atoms, and most preferably 1 to 3 carbon atoms.

The smaller the number of carbon atoms of the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less and electron beams is improved.

The fluorination ratio within the alkylene group or alkyl group is preferably within a range from 70 to 100%, and more preferably from 90 to 100%. A perfluoroalkylene or perfluoroalkyl group in which all the hydrogen atoms are substituted with fluorine atoms is the most desirable.

Furthermore, in the above general formula (b0), X⁻ may also be represented by $R^a$—COO⁻ (wherein $R^a$ represents an alkyl group or a fluorinated alkyl group).

Specific examples of the group $R^a$ in the above formula include the same groups as those listed below for $R^{4\prime\prime\prime}$ in formula (b-1) or (b-2).

Specific examples of $R^a$—COO⁻ include a trifluoroacetate ion, an acetate ion, and a 1-adamantanecarboxylate ion.

Furthermore, in general formula (b0), X⁻ may also represent a halogen anion.

Examples of this halogen anion include a fluoride ion, chloride ion, bromide ion or iodide ion.

Of the various possibilities described above, X⁻ within general formula (b0) is preferably an anion represented by $R^{20}SO_3^-$, and anions of the above formulas (b1) to (b9) in which $R^{20}$ is a group represented by $X^3$-$Q^1$-$Y^3$—, and anions in which $R^{20}$ is a halogenated alkyl group are particularly desirable.

A single component (B1) may be used alone, or two or more different types of the component (B1) may be used in combination.

In the resist composition of the present invention, the amount of the component (B1) within the component (B) is preferably not less than 40% by weight, is more preferably 70% by weight or more, and may be 100% by weight.

[Component (B2)]

In the resist composition of the present invention, if required, the component (B) may also include, in addition to the component (B1) described above, another acid generator (hereinafter referred to as "component (B2)") other than the component (B1).

As the component (B2), there are no particular limitations provided the acid generator falls outside the definition for component (B1), and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bissulfonyl)diazomethanes; nitrobenzylsulfonate-based acid generators; iminosulfonate-based acid generators; and disulfone-based acid generators.

As an onium salt-based acid generator, compounds represented by general formulas (b-1) and (b-2) shown below may be used.

[Chemical Formula 45]

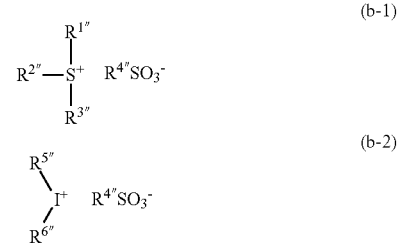

(b-1)

(b-2)

wherein $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring together with the sulfur atom in the formula; and $R^{4\prime\prime}$ represents an alkyl group which may have a substituent, a halogenated alkyl group, an aryl group or an alkenyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime\prime}$ to $R^{3\prime\prime\prime}$ each independently represents an aryl group or an alkyl group. In formula (b-1), two of $R^{1\prime\prime\prime}$ to $R^{3\prime\prime\prime}$ may be bonded to each other to form a ring together with the sulfur atom in the formula.

Further, among $R^{1\prime\prime\prime}$ to $R^{3\prime\prime\prime}$, at least one group represents an aryl group. Among $R^{1\prime\prime\prime}$ to $R^{3\prime\prime\prime}$, two or more groups are preferably aryl groups, and it is particularly desirable that all of $R^{1\prime\prime\prime}$ to $R^{3\prime\prime\prime}$ are aryl groups.

The aryl group for $R^{1\prime\prime\prime}$ to $R^{3\prime\prime\prime}$ is not particularly limited. For example, an aryl group having 6 to 20 carbon atoms may be used, in which some or all of the hydrogen atoms of the aryl group may or may not be substituted with alkyl groups, alkoxy groups, halogen atoms or hydroxyl groups.

In terms of enabling low-cost synthesis, the aryl group is preferably an aryl group having 6 to 10 carbon atoms. Specific examples thereof include a phenyl group and naphthyl group.

The alkyl group with which hydrogen atoms of the aryl group may be substituted is preferably an alkyl group having 1 to 5 carbon atoms, and most preferably a methyl group, an ethyl group, a propyl group, an n-butyl group, or a tert-butyl group.

The alkoxy group with which hydrogen atoms of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or ethoxy group.

The halogen atom with which hydrogen atoms of the aryl group may be substituted is preferably a fluorine atom.

The alkyl group for $R^{1\prime\prime\prime}$ to $R^{3\prime\prime\prime}$ is not particularly limited and includes, for example, linear, branched and cyclic alkyl groups of 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group and decyl group, and a methyl group is most preferable because it yields excellent resolution and can be synthesized at low cost.

In formula (b-1), two of $R^{1\prime\prime\prime}$ to $R^{3\prime\prime\prime}$ may be bonded to each other to form a ring together with the sulfur atom in the formula. This ring may be either saturated or unsaturated.

Further, the ring may be monocyclic or polycyclic. For example, in those cases where either one or both of the two groups that form the ring are cyclic groups (such as cyclic alkyl groups or aryl groups), bonding the two groups together results in the formation of a polycyclic ring (a condensed ring).

In those cases where two of $R^{1\prime\prime\prime}$ to $R^{3\prime\prime\prime}$ are bonded to each other to form a ring, the single ring containing the sulfur atom within the ring skeleton thereof is preferably a 3- to 10-membered ring, and more preferably a 5- to 7-membered ring, including the sulfur atom.

Specific examples of the ring formed by bonding two of $R^{1\prime\prime\prime}$ to $R^{3\prime\prime\prime}$ to each other include benzothiophene, dibenzothiophene, 9H-thioxanthene, thioxanthene, thianthrene, phenoxathiin, tetrahydrothiophenium and tetrahydrothiopyranium.

In those cases where two of $R^{1\prime\prime\prime}$ to $R^{3\prime\prime\prime}$ are bonded to each other to form a ring together with the sulfur atom in the formula, the remaining group among $R^{1\prime\prime\prime}$ to $R^{3\prime\prime\prime}$ is preferably an aryl group.

Among the various cation moieties of the compounds represented by formula (b-1), specific examples of preferred cation moieties in those cases where $R^{1\prime\prime\prime}$ to $R^{3\prime\prime\prime}$ each represents a phenyl group which may have a substituent, namely those cases where the cation moiety has a triphenylsulfonium skeleton, include the cation moieties represented by formulas (I-1-1) to (I-1-14) shown below.

[Chemical Formula 46]

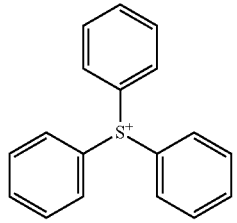
(I-1-1)

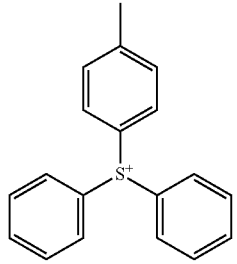
(I-1-2)

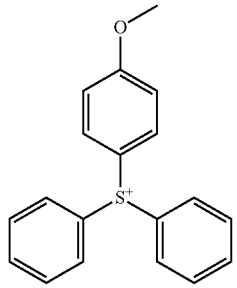
(I-1-3)

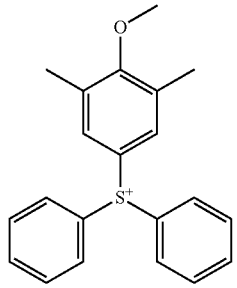
(I-1-4)

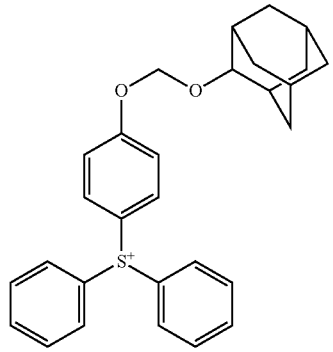
(I-1-5)

-continued
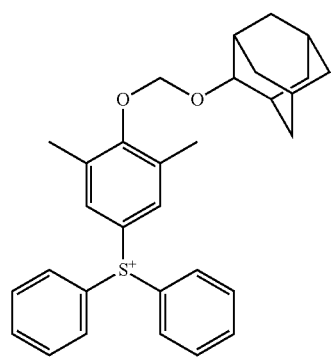
(I-1-6)
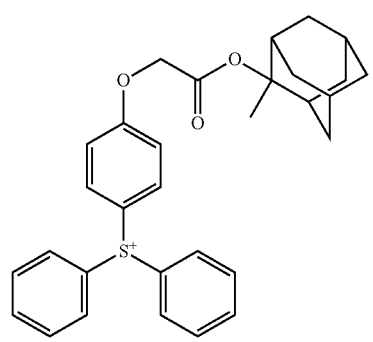
(I-1-7)
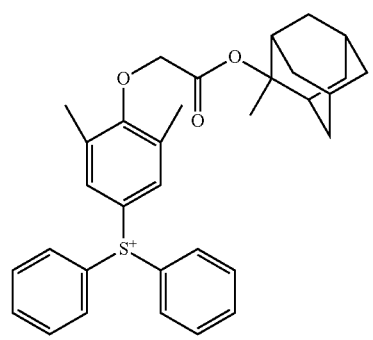
(I-1-8)
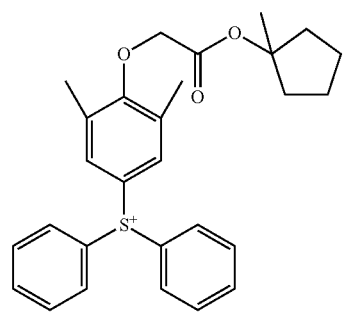
(I-1-9)
-continued
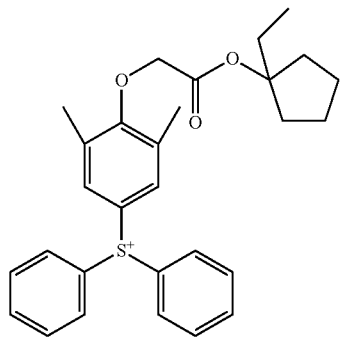
(I-1-10)
[Chemical Formula 47]
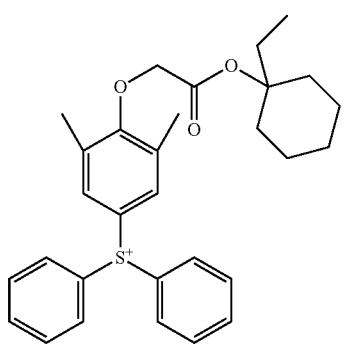
(I-1-11)
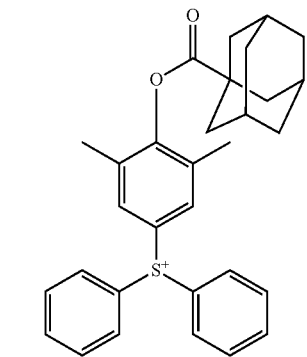
(I-1-12)
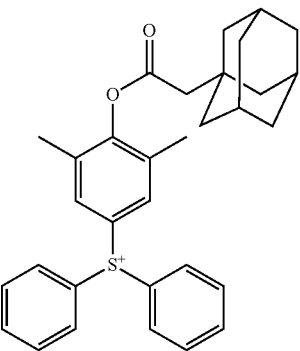
(I-1-13)

-continued (I-1-14)

[Structure I-1-14: dimethylphenyl ester with long alkyl chain and diphenylsulfonium group]

Further, cation moieties in which some or all of the phenyl groups in the above cation moieties have each been substituted with a naphthyl group which may have a substituent are also preferable. Of the three phenyl groups, the number of phenyl groups substituted with naphthyl groups is preferably either 1 or 2.

Furthermore, among the various cation moieties of the compounds represented by formula (b-1), specific examples of preferred cation moieties in those cases where two of $R^{1\prime\prime}$ to $R^{3\prime\prime}$ are bonded to each other to form a ring together with the sulfur atom in the formula include the cation moieties represented by formulas (I-11-10) to (I-11-13) shown below.

[Chemical Formula 48]

(I-11-10)

[Structure: $R^9-{}^+S$ with $(CH_2)_u$ ring]

(I-11-11)

[Structure: $R^{10}$-C(=O)-CH$_2$-$^+S$ with $(CH_2)_u$ ring]

wherein $R^9$ represents a phenyl group which may have a substituent, a naphthyl group which may have a substituent, or an alkyl group of 1 to 5 carbon atoms, $R^{10}$ represents a phenyl group which may have a substituent, a naphthyl group which may have a substituent, an alkyl group of 1 to 5 carbon atoms, an alkoxy group of 1 to 5 carbon atoms, or a hydroxyl group, and u represents an integer of 1 to 3.

[Chemical Formula 49]

(I-11-12)

[Structure: dibenzothiophenium with $R^{41}$, $R^{42}$, $R^{43}$ substituents and subscripts $n_1$, $n_2$, $n_3$]

-continued (I-11-13)

[Structure: benzothiophenium with $R^{44}$, $R^{45}$, $R^{46}$ substituents and subscripts $n_4$, $n_5$, $n_6$]

wherein each of $R^{41}$ to $R^{46}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

In formulas (I-11-10) and (I-11-11), for groups $R^9$ and $R^{10}$, examples of the substituent with which the phenyl group or naphthyl group may be substituted include the same groups as those described above for the substituent with which the aryl group of $R^{1\prime\prime}$ to $R^{3\prime\prime}$ may be substituted.

Further, for groups $R^9$ and $R^{10}$, examples of the substituent with which the alkyl group may be substituted include the same groups as those described above for the substituent with which the alkyl group of $R^{1\prime\prime}$ to $R^{3\prime\prime}$ may be substituted.

u is an integer of 1 to 3, and is most preferably 1 or 2.

The alkyl group for $R^{41}$ to $R^{46}$ in formulas (I-1-12) and (I-11-13) is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have been substituted with hydroxyl groups, and examples thereof include a hydroxymethyl group, hydroxyethyl group and hydroxypropyl group.

When the subscripts $n_1$ to $n_6$ appended to $R^{41}$ to $R^{46}$ represent an integer of 2 or more, the plurality of $R^{41}$ to $R^{46}$ groups may be the same or different.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

In formulas (b-1) and (b-2), $R^{4\prime\prime}$ represents an alkyl group which may have a substituent, a halogenated alkyl group, an aryl group or an alkenyl group. Examples of $R^{4\prime\prime}$ include the same groups as those listed above for $R^{20}$.

In formula (b-2), each of $R^{5\prime\prime}$ and $R^{6\prime\prime}$ independently represents an aryl group or an alkyl group. At least one of $R^{5\prime\prime}$ and $R^{6\prime\prime}$ represents an aryl group. It is preferable that $R^{5\prime\prime}$ and $R^{6\prime\prime}$ both represent aryl groups.

Examples of the aryl group for $R^{5\prime\prime}$ and $R^{6\prime\prime}$ include the same aryl groups as those listed above for $R^{1\prime\prime}$ to $R^{3\prime\prime}$ in formula (b-1).

Examples of the alkyl group for $R^{5\prime\prime}$ and $R^{6\prime\prime}$ include the same alkyl groups as those listed above for $R^{1\prime\prime}$ to $R^{3\prime\prime}$ in formula (b-1).

It is particularly desirable that $R^{5"}$ and $R^{6"}$ both represent phenyl groups.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by either an alkylsulfonate which may have a substituent, such as a methanesulfonate, n-propanesulfonate, n-butanesulfonate, n-octanesulfonate, 1-adamantanesulfonate, 2-norbornanesulfonate or d-camphor-10-sulfonate, or an aromatic sulfonate such as a benzenesulfonate, perfluorobenzenesulfonate or p-toluenesulfonate.

Further, onium salts in which the anion moiety of these onium salts has been replaced by an anion moiety represented by any one of chemical formulas (b1) to (b9) shown above, and onium salts in which the anion moiety has been replaced with an anion moiety represented by formula (b-3) or (b-4) can also be used.

Further, onium salt-based acid generators in which the anion moiety ($R^{4"}SO_3^-$) in the above-mentioned general formula (b-1) or (b-2) is replaced by an anion moiety represented by $R^{7"}$—COO⁻ [wherein $R^{7"}$ represents an alkyl group or a fluorinated alkyl group] (and the cation moiety is the same as that within formula (b-1) or (b-2)) may also be used as the onium salt-based acid generator.

Specific examples of the group $R^{7"}$ include the same groups as those listed above for $R^{4"}$.

Specific examples of $R^{7"}$—COO⁻ include a trifluoroacetate ion, an acetate ion, and a 1-adamantanecarboxylate In the present description, an oxime sulfonate-based acid generator is a compound having at least one group represented by general formula (B-1) shown below, and has a feature of generating acid by irradiation. Such oxime sulfonate-based acid generators are widely used for chemically amplified resist compositions, and any of these known compounds may be selected as appropriate.

[Chemical Formula 50]

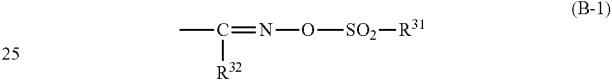

(B-1)

wherein $R^{31}$ and $R^{32}$ each independently represents an organic group.

The organic group for $R^{31}$ and $R^{32}$ refers to a group containing a carbon atom, and may include atoms other than carbon atoms (such as a hydrogen atom, oxygen atom, nitrogen atom, sulfur atom or halogen atom (such as a fluorine atom or chlorine atom) or the like).

As the organic group for $R^{31}$, a linear, branched, or cyclic alkyl group or aryl group is preferable. The alkyl group or aryl group may have a substituent. There are no particular limitations on the substituent, and examples thereof include a fluorine atom and a linear, branched or cyclic alkyl group having 1 to 6 carbon atoms. The expression that the alkyl group or aryl group "may have a substituent" means that some or all of the hydrogen atoms of the alkyl group or aryl group may be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, chlorine atom, bromine atom and iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group"

refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ are the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 51]

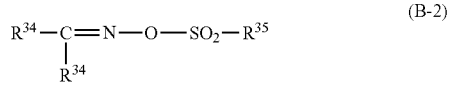

(B-2)

wherein $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 52]

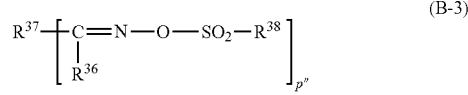

(B-3)

wherein $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$ within formula (B-2).

Examples of the divalent or trivalent aromatic hydrocarbon group for $R^{37}$ include groups in which an additional one or two hydrogen atoms have been removed from the aryl group for $R^{34}$ within the above formula (B-2).

Examples of the alkyl group having no substituent or the halogenated alkyl group for $R^{38}$ include the same groups as those described above for the alkyl group having no substituent or the halogenated alkyl group for $R^{35}$ within formula (B-2).

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzylcyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in International Patent Publication No. 2004/074242 pamphlet (Examples 1 to 40 described on pages 65 to 86) may also be used favorably.

Furthermore, the following compounds may also be used as preferred examples.

[Chemical Formula 53]

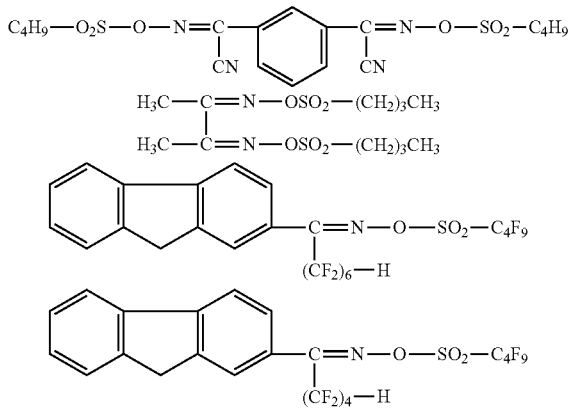

Of the above-mentioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl) diazomethane, and bis(2,4-dimethylphenylsulfonyl) diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B2), one type of acid generator described above may be used alone, or two or more types of acid generators may be used in combination.

In the resist composition of the present invention, in those cases where the component (B) includes the component (B2), the amount of the component (B2) within the component (B) is preferably within a range from 0.5 to 90% by weight, more preferably from 3 to 70% by weight, and still more preferably from 5 to 50% by weight.

The total amount of the overall component (B) within the resist composition of the present invention is typically within a range from 0.5 to 80 parts by weight, and preferably from 1 to 60 parts by weight, relative to 100 parts by weight of the component (A). When the amount of the component (B) is within the above-mentioned range, formation of a resist pattern can be performed satisfactorily. Further, by virtue of the above-mentioned range, a uniform solution can be obtained and the storage stability tends to improve.

<Component (D)>

In the resist composition of the present invention, the component (D) includes a compound represented by general formula (d1) or general formula (d2) shown below (hereinafter, these compounds are referred to as "compound (d1)" and "compound (d2)" respectively). This compound acts as an acid diffusion control agent, namely a quencher that traps the acid generated from the component (B) upon exposure. By including the compound (d1) or compound (d2) within the component (D), the storage stability of the resist composition can be improved.

[Chemical Formula 54]

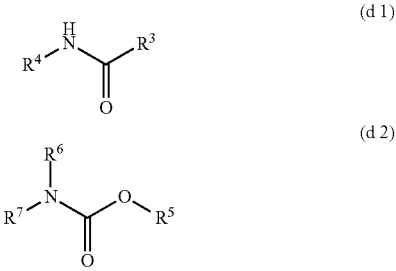

wherein each of $R^3$ and $R^4$ independently represents an aliphatic hydrocarbon group, $R^5$ represents a hydrocarbon group of 5 or more carbon atoms, each of $R^6$ and $R^7$ independently represents a hydrogen atom, an aliphatic hydrocarbon group which may have a substituent, or —C(=O)—O—$R^5$, in the case of a plurality of $R^5$ groups, the $R^5$ groups may be the same or different, and $R^6$ and $R^7$ may be bonded to each other to form a ring.

(Compound (d1))

In the above formula (d1), each of $R^3$ and $R^4$ represents an aliphatic hydrocarbon group.

The aliphatic hydrocarbon group for $R^3$ and $R^4$ may be saturated or unsaturated, but in general, is preferably saturated.

Specific examples of the aliphatic hydrocarbon group for $R^3$ and $R^4$ include linear or branched aliphatic hydrocarbon groups, and aliphatic hydrocarbon groups containing a ring in the structure thereof.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

These chain-like aliphatic hydrocarbon groups may or may not have a substituent. Examples of the substituent include a fluorine atom, a fluorinated alkyl group of 1 to 5 carbon atoms, and an oxygen atom (=O).

Examples of the aliphatic hydrocarbon group containing a ring in the structure thereof include cyclic aliphatic hydrocarbon groups (groups in which one hydrogen atom has been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which one hydrogen atom has been removed from a monocycloalkane of 3 to 6 carbon atoms is preferable, and specific examples of the monocycloalkane include cyclopentane and cyclohexane.

As the polycyclic group, a group in which one hydrogen atom has been removed from a polycycloalkane of 7 to 12 carbon atoms is preferable, and specific examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As $R^3$ and $R^4$, a chain-like aliphatic hydrocarbon group of 1 to 5 carbon atoms, or a group in which one hydrogen atom has been removed from a polycyclic group is preferred.

Specific examples of the compound (d1) are shown below.

[Chemical Formula 55]

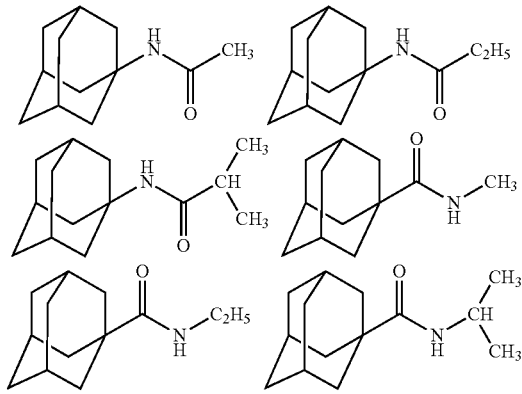

As the compound (d1), a single compound may be used alone, or two or more compounds may be used in combination.

The compound (d1) may use commercially available compounds, or the compound may be synthesized using conventional methods.

In those cases where the component (D) includes the compound (d1), the amount of the compound (d1) within the component (D), relative to the total weight of the component (D), is preferably not less than 25% by weight, more preferably 50% by weight or more, still more preferably 75% by weight or more, and may be 100% by weight.

(Compound (d2))

In the above formula (d2), $R^5$ represents a hydrocarbon group of 5 or more carbon atoms.

The hydrocarbon group of 5 or more carbon atoms for $R^5$ may be an aliphatic hydrocarbon group or an aromatic hydrocarbon group. The term "aliphatic hydrocarbon group" describes a hydrocarbon group having no aromaticity.

The aliphatic hydrocarbon group for $R^5$ may be either saturated or unsaturated, but in general, is preferably saturated.

More specific examples of the aliphatic hydrocarbon group for $R^5$ include linear or branched aliphatic hydrocarbon groups, and aliphatic hydrocarbon groups containing a ring in the structure thereof.

The "linear or branched aliphatic hydrocarbon group" for $R^5$ preferably contains 5 to 21 carbon atoms, more preferably 5 to 15 carbon atoms, and still more preferably 5 to 10 carbon atoms.

The linear aliphatic hydrocarbon group is preferably a linear alkyl group, and specific examples thereof include a pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group or heneicosyl group.

The branched aliphatic hydrocarbon group is preferably a branched alkyl group, and specific examples thereof include a 2-methylbutan-2-yl (tert-pentyl) group, 1-ethylbutyl group, 2-ethylbutyl group, 2-methylpentan-2-yl (tert-hexyl) group, 1-methylpentyl group, 2-methylpentyl group, 3-methylpentyl group, 4-methylpentyl group or 2-methylhexan-2-yl (tert-heptyl) group.

These chain-like alkyl groups may or may not have a substituent. Examples of the substituent include a fluorine atom, an oxygen atom (=O), a hydroxyl group, $SO_2$ or C(=O)—O or the like.

Examples of the aliphatic hydrocarbon group containing a ring in the structure thereof include cyclic aliphatic hydrocarbon groups (groups in which one hydrogen atom has been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 5 to 20 carbon atoms, and more preferably 5 to 12 carbon atoms.

The cyclic aliphatic hydrocarbon group may be either a polycyclic group or a monocyclic group. As the monocyclic group, a group in which one hydrogen atom has been removed from a monocycloalkane of 5 or more carbon atoms is preferable. Specific examples of the monocycloalkane include cyclopentane and cyclohexane.

As the polycyclic group, a group in which one hydrogen atom has been removed from a polycycloalkane of 7 to 12 carbon atoms is preferable, and specific examples of the polycycloalkane include adamantane, norbornane, isobornane, tricyclodecane and tetracyclododecane.

The cyclic aliphatic hydrocarbon group may or may not have a substituent. Examples of the substituent include alkyl groups of 1 to 5 carbon atoms, a fluorine atom, fluorinated alkyl groups of 1 to 5 carbon atoms, an oxygen atom (=O), a hydroxyl group, $SO_2$, C(=O)—O, and C(=O)—OH.

Specific examples of the aromatic hydrocarbon group include monovalent aromatic hydrocarbon groups such as a phenyl group, biphenyl group, fluorenyl group, naphthyl group, anthryl group or phenanthryl group.

In the aromatic hydrocarbon group, a portion of the carbon atoms that constitute the ring structure may be substituted with a hetero atom such as an oxygen atom, sulfur atom or nitrogen atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As $R^5$, an aliphatic hydrocarbon group is preferable, and a branched alkyl group or an aliphatic hydrocarbon group containing a ring in the structure thereof is particularly desirable.

Further, as $R^5$, a tertiary hydrocarbon group in which the carbon atom bonded to the adjacent oxygen atom is a tertiary carbon atom is particularly preferable.

Specific examples of this tertiary hydrocarbon group include groups represented by general formula (I) shown below.

[Chemical Formula 56]

(I)

wherein each of $R^{121}$ to $R^{123}$ independently represents a linear or branched alkyl group, and independently preferably contains 1 to 5 carbon atoms. Two of $R^{121}$ to $R^{123}$ may be bonded to each other, thereby form a ring together with the carbon atom to which $R^{121}$ to $R^{123}$ are bonded.

Further, the group represented by general formula (I) preferably contains a total of at least 5 carbon atoms, more preferably 5 to 20 carbon atoms, and most preferably 5 to 12 carbon atoms.

Examples of preferred forms of the group represented by general formula (I) include a tert-pentyl group, tert-hexyl group and tert-heptyl group, and a tert-pentyl group is particularly desirable.

In formula (d2), each of $R^6$ and $R^7$ independently represents a hydrogen atom, an aliphatic hydrocarbon group which may have a substituent, or —C(=O)—O—$R^5$.

The $R^5$ group within $R^6$ or $R^7$ may be the same as, or different from, the $R^5$ group described above.

The aliphatic hydrocarbon group which may have a substituent for $R^6$ and $R^7$ may be saturated or unsaturated, but in general, is preferably saturated.

Examples of the aliphatic hydrocarbon group for $R^6$ and $R^7$ include linear or branched aliphatic hydrocarbon groups, and aliphatic hydrocarbon groups containing a ring in the structure thereof.

The linear aliphatic hydrocarbon group which may have a substituent for $R^6$ and $R^7$ is preferably a linear alkyl group, and preferably contains 1 to 21 carbon atoms, more preferably 1 to 15 carbon atoms, and still more preferably 1 to 10 carbon atoms. Specific examples thereof include a methyl group, ethyl group, propyl group, butyl group, pentyl group, hexyl group, heptyl group, octyl group, nonyl group, decanyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group or heneicosyl group.

The branched aliphatic hydrocarbon group which may have a substituent for $R^6$ and $R^7$ is preferably a branched alkyl group, and preferably contains 3 to 21 carbon atoms, more preferably 3 to 15 carbon atoms, and still more preferably 3 to 10 carbon atoms. Specific examples thereof include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group, 4-methylpentyl group or tert-butyl group.

These chain-like alkyl groups may or may not have a substituent. Examples of the substituent include a fluorine atom, an oxygen atom (=O), a hydroxyl group, $SO_2$ or C(=O)—O or the like.

Examples of the aliphatic hydrocarbon group containing a ring in the structure thereof for $R^6$ and $R^7$ include cyclic aliphatic hydrocarbon groups (groups in which one hydrogen atom has been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

Examples of the cyclic aliphatic hydrocarbon groups include the same groups as those described above for the cyclic aliphatic hydrocarbon group for $R^5$.

The aliphatic hydrocarbon which may have a substituent for each of $R^6$ and $R^7$ is preferably a linear alkyl group or an aliphatic hydrocarbon group containing a ring in the structure thereof, and is more preferably a methyl group, ethyl group, propyl group, hexyl group, adamantyl group, or a combination thereof.

$R^6$ and $R^7$ may be bonded to each other to form a ring, and preferably form a 3- to 30-membered ring, and more preferably a 5- to 20-membered ring, that includes the nitrogen atom within formula (d2). Specific examples of the formed ring include a piperidine, piperazine, pyrrolidine or morpholine ring.

Specific examples of preferred compounds for the compound (d2) include compounds represented by general formulas (d2-1) to (d2-3) shown below.

[Chemical Formula 57]

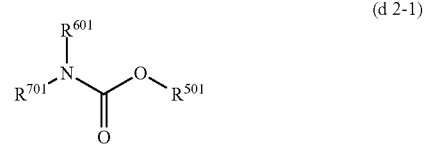

(d 2-1)

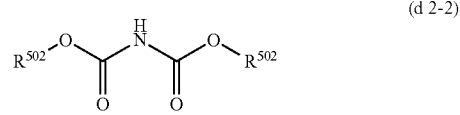

(d 2-2)

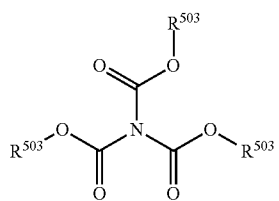

(d 2-3)

wherein each of $R^{501}$, $R^{502}$ and $R^{503}$ independently represents a linear or branched alkyl group of 5 or more carbon atoms which may have a substituent, $R^{601}$ represents a hydrogen atom or a linear or branched alkyl group which may have a substituent, $R^{701}$ represents a hydrogen atom, a linear or branched alkyl group which may have a substituent or an aliphatic hydrocarbon group containing a ring in the structure thereof, the plurality of $R^{502}$ and $R^{503}$ groups in the above formulas may be the same or different, and $R^{601}$ and $R^{701}$ may be bonded to each other to form a ring.

In formulas (d2-1) to (d2-3), each of $R^{501}$, $R^{502}$ and $R^{503}$ independently represents a linear or branched alkyl group of 5 or more carbon atoms which may have a substituent. A branched alkyl group of 5 or more carbon atoms which may have a substituent is preferable, and a tert-pentyl group, tert-hexyl group or tert-heptyl group is particularly desirable. The plurality of $R^{502}$ and $R^{503}$ groups in the above formulas may be the same or different, but are preferably the same.

$R^{601}$ represents a hydrogen atom or a linear or branched alkyl group which may have a substituent, is preferably a hydrogen atom or a linear alkyl group, and is most preferably a hydrogen atom.

$R^{701}$ represents a hydrogen atom, a linear or branched alkyl group which may have a substituent, or an aliphatic hydrocarbon group containing a ring in the structure thereof, and is preferably a hydrogen atom or an aliphatic hydrocarbon group containing a ring in the structure thereof.

Further, compounds in which $R^{601}$ and $R^{701}$ each represents a linear alkyl group, wherein $R^{601}$ and $R^{701}$ are bonded to each other to form a ring, are also desirable.

Examples of the linear alkyl group which may have a substituent, the branched alkyl group which may have a substituent, and the aliphatic hydrocarbon group containing a ring in the structure thereof include the same groups as those described above in relation to groups $R^5$ to $R^7$ within formula (d2).

Specific examples of the compound (d2) are shown below.

[Chemical Formula 58]

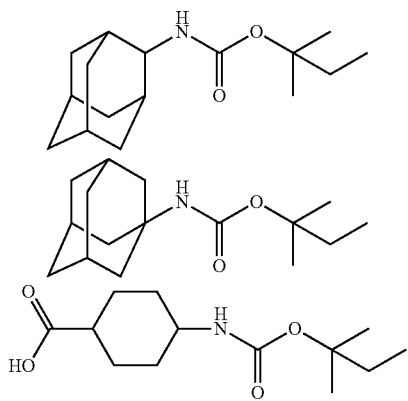

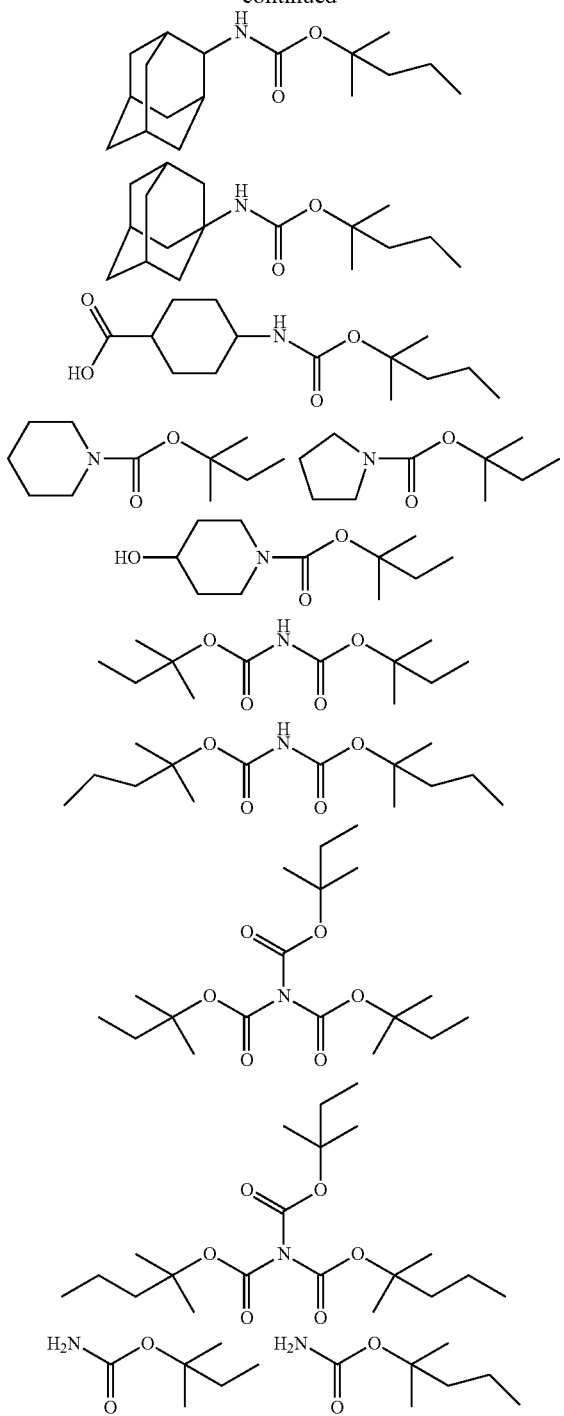

As the compound (d2), a single compound may be used alone, or two or more compounds may be used in combination.

There are no particular limitations on the method used for producing the compound (d2), and synthesis may be conducted using conventional methods.

In those cases where the component (D) includes the compound (d2), the amount of the compound (d2) within the component (D), relative to the total weight of the component (D), is preferably not less than 25% by weight, more preferably 50% by weight or more, still more preferably 75% by weight or more, and may be 100% by weight.

(Other Nitrogen-containing Organic Compounds (d3))

Within the resist composition of the present invention, the component (D) may also include another nitrogen-containing organic compound (d3) (hereinafter referred to as "compound (d3)") besides the above compounds (d1) and (d2) for the purposes of improving the resist pattern shape and the post exposure stability of the latent image formed by the pattern-wise exposure of the resist layer, provided the inclusion of this other nitrogen-containing organic compound does not impair the effects of the present invention.

There are no particular limitations on the compound (d3), provided it does not correspond with the definitions of the above-mentioned compounds (d1) and (d2), and functions as an acid diffusion control agent, namely a quencher that traps the acid generated from the component (B) upon exposure. A multitude of these compounds have already been proposed, and any of these known compounds may be used, although an aliphatic amine, and particularly a secondary aliphatic amine or tertiary aliphatic amine is preferable. Here, "an aliphatic amine" refers to an amine having one or more aliphatic groups, wherein the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), and cyclic amines.

Specific examples of the alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine, and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, trialkylamines and/or alkyl alcohol amines are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of aromatic amines include aniline, 2,6-diisopropylaniline, pyridine, 4-dimethylaminopyridine, pyrrole, indole, pyrazole, imidazole, and derivatives thereat as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

As the compound (d3), a single compound may be used alone, or two or more compounds may be used in combination.

In the resist composition of the present invention, one type of component (D) may be used alone, or two or more types may be used in combination.

In the resist composition of the present invention, the amount of the component (D) is preferably within a range from 0.01 to 10 parts by weight, more preferably from 0.05 to 10 parts by weight, and still more preferably from 0.1 to 5 parts by weight, relative to 100 parts by weight of the component (A). By ensuring that the amount of the component (D) is within the above-mentioned range, lithography properties such as LWR, MEF and EL margin are improved during formation of a resist pattern, and the pattern shape also improves.

<Optional Component—Component (E)>

In the resist composition of the present invention, for the purposes of preventing any deterioration in sensitivity, and improving the resist pattern shape and the post exposure stability of the latent image formed by the pattern-wise exposure of the resist layer, at least one compound (E) (hereinafter referred to as "component (E)") selected from the group consisting of organic carboxylic acids, and phosphorus oxo acids and derivatives thereof may be added as an optional component.

Examples of the organic carboxylic acids include acetic acid, malonic acid, citric acid, malic acid, succinic acid, benzoic acid, salicylic acid, and adamantane carboxylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an above-mentioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight relative to 100 parts by weight of the component (A).

If desired, other miscible additives besides those described above may also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Optional Component—Component (S)>

The positive resist composition of the present invention can be prepared by dissolving the materials for the resist composition in an organic solvent (S) (hereinafter, frequently referred to as "component (S)").

The component (S) may be any organic solvent which can dissolve the respective components to give a uniform solution, and any one or more kinds of organic solvents can be appropriately selected from those which have been conventionally known as solvents for chemically amplified resists.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as mixed solvents containing two or more solvents.

Among these, propylene glycol monomethyl ether acetate (PGMEA), propylene glycol monomethyl ether (PGME), ethyl lactate (EL) and cyclohexanone are preferable.

Further, a mixed solvent obtained by mixing PGMEA with a polar solvent is also preferable. The mixing ratio (weight ratio) of this mixed solvent can be determined appropriately with due consideration of the compatibility of the PGMEA with the polar solvent, but is preferably in the range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably from 3:7 to 7:3.

Furthermore, when cyclohexanone is mixed as the polar solvent, the PGMEA:cyclohexanone weight ratio is preferably from 1:9 to 9:1, more preferably from 2:8 to 8:2, and still more preferably from 3:7 to 7:3

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and may be adjusted appropriately to a concentration which enables coating of a coating solution onto a substrate in accordance with the thickness of the coating film. In general, the organic solvent is used in an amount that yields a solid content for the resist composition that is within a range from 1 to 20% by weight, and preferably from 2 to 15% by weight According to the present invention, a resist composition can be obtained that exhibits excellent lithography properties such as sensitivity, LWR, EL margin and MEF, yields a superior pattern shape, and also exhibits excellent storage stability.

The reasons for these effects are not entirely clear, but it is thought that by using the compound (d1) or the compound (d2), the nucleophilicity and degree of basicity of the component (D) can be adjusted to appropriate levels, and as a result, because no decomposition of the component (D) occurs as a result of reaction with the acid generator or the ester linkages within the base component contained within the resist composition, the resist composition exhibits excellent storage stability and the lithography properties described above and the pattern shape are also favorable. Moreover, by using the compound (d1) or the compound (d2), the effects of basic compounds within the air can be suppressed and the PED resistance can be improved, resulting in more favorable lithography properties and pattern shape.

Further, the component (B1) has an electron-withdrawing fluorinated alkyl group within the structure of the cation moiety. It is speculated that, as a result, the acid generation efficiency improves, and the resolution and lithography properties also improve.

Moreover, in the present invention, by using the comparatively high-reactivity component (B1) in combination with a nitrogen-containing organic compound containing the compound (d1) or (d2) having comparatively low nucleophilic reactivity, it is thought that decomposition of the component (B1) by the nitrogen-containing organic compound can be suppressed, enabling a superior level of storage stability to be achieved.

<<Method of Forming a Resist Pattern>>

The method of forming a resist pattern according to the present invention includes: applying a resist composition of the present invention to a substrate to form a resist film on the substrate, conducting exposure of the resist film, and developing the resist film to form a resist pattern.

More specifically, the method for forming a resist pattern according to the present invention can be performed, for example, as follows.

Firstly, a positive resist composition of the present invention is applied onto a substrate using a spinner or the like, and a prebake (post applied bake (PAB)) is conducted under temperature conditions of 80 to 150° C. for 40 to 120 seconds, and preferably 60 to 90 seconds, to form a resist film. Then, following selective exposure of the thus formed resist film, either by exposure through a mask pattern using, for example, an exposure apparatus such as an ArF exposure apparatus, an electron beam lithography apparatus or an EUV exposure apparatus, or by patterning via direct irradiation with an electron beam without using a mask pattern, a post exposure bake (PEB) is conducted under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, a bake treatment (post bake) can be conducted following the developing.

In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates that has been provided with an inorganic and/or organic film on the surface thereof may also be used. As the inorganic film, an inorganic antireflection film (inorganic BARC) can be exemplified. As the organic film, an organic antireflection film (organic BARC) can be exemplified.

The wavelength to be used for exposure is not particularly limited, and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective for use with a KrF excimer laser, ArF excimer laser, EB and EUV, and is particularly effective to an ArF excimer laser.

The method of exposure used for the resist film may be either a general exposure method (dry exposure) conducted in air or an inert gas such as nitrogen, or an immersion exposure (liquid immersion lithography) method.

In liquid immersion lithography, the region between the resist film and the lens at the lowermost portion of the exposure apparatus is filled with a solvent (an immersion medium) that has a larger refractive index than the refractive index of air, and in this state, the resist film is subjected to exposure (immersion exposure).

The immersion medium preferably exhibits a refractive index that is larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C., and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environmental issues and versatility.

EXAMPLES

A more detailed description of the present invention is presented below based on a series of examples, although the scope of the present invention is in no way limited by these examples.

Examples 1 to 13, Comparative Examples 1 to 8

The components shown in Tables 1 and 2 were mixed together and dissolved to prepare a series of positive resist compositions.

TABLE 1

|  | (A) | (B) | (D) | (S) | Storage stability (ΔCD (nm)) |
|---|---|---|---|---|---|
| Comparative example 1 | (A)-1 [100] | (B)-1 [19.63] | (D)-A [2.0] | (S)-1 [4000] | −(>200) B |
| Comparative example 2 | (A)-1 [100] | (B)-1 [19.63] | (D)-B [1.14] | (S)-1 [4000] | 41.2 B |
| Comparative example 3 | (A)-1 [100] | (B)-1 [19.63] | (D)-C [0.97] | (S)-1 [4000] | 33.3 B |
| Example 1 | (A)-1 [100] | (B)-1 [19.63] | (D)-1 [0.74] | (S)-1 [4000] | 12.0 A |
| Example 2 | (A)-1 [100] | (B)-1 [19.63] | (D)-2 [1.39] | (S)-1 [4000] | 11.5 A |
| Example 3 | (A)-1 [100] | (B)-1 [19.63] | (D)-3 [2.03] | (S)-1 [4000] | 11.3 A |
| Example 4 | (A)-1 [100] | (B)-1 [19.63] | (D)-4 [1.09] | (S)-1 [4000] | 10.3 A |
| Example 5 | (A)-1 [100] | (B)-1 [19.63] | (D)-5 [1.50] | (S)-1 [4000] | 9.7 A |
| Example 6 | (A)-1 [100] | (B)-1 [19.63] | (D)-6 [1.50] | (S)-1 [4000] | 9.5 A |
| Comparative example 4 | (A)-1 [100] | (B)-2 [25.09] | (D)-A [2.0] | (S)-1 [4000] | −(>200) B |
| Comparative example 5 | (A)-1 [100] | (B)-2 [25.09] | (D)-B [1.14] | (S)-1 [4000] | 38.0 B |
| Comparative example 6 | (A)-1 [100] | (B)-2 [25.09] | (D)-C [0.97] | (S)-1 [4000] | 32.7 B |
| Example 7 | (A)-1 [100] | (B)-2 [25.09] | (D)-1 [0.74] | (S)-1 [4000] | 10.3 A |
| Example 8 | (A)-1 [100] | (B)-2 [25.09] | (D)-2 [1.39] | (S)-1 [4000] | 11.0 A |
| Example 9 | (A)-1 [100] | (B)-2 [25.09] | (D)-3 [2.03] | (S)-1 [4000] | 10.5 A |
| Example 10 | (A)-1 [100] | (B)-2 [25.09] | (D)-4 [1.09] | (S)-1 [4000] | 9.6 A |
| Example 11 | (A)-1 [100] | (B)-2 [25.09] | (D)-5 [1.50] | (S)-1 [4000] | 9.3 A |
| Example 12 | (A)-1 [100] | (B)-2 [25.09] | (D)-6 [1.50] | (S)-1 [4000] | 10.3 A |

TABLE 2

|  | (A) | (B) | (D) | (S) | Eop (μC/cm$^2$) | Resolution (nm) | LWR (nm) | Pattern shape |
|---|---|---|---|---|---|---|---|---|
| Comparative example 7 | (A)-1 [100] | (B)-3 [20.00] | (D)-4 [2.50] | (S)-1 [6500] | 45.3 | 60 | 13.3 | Top-round |
| Comparative example 8 | (A)-1 [100] | (B)-4 [28.16] | (D)-4 [0.50] | (S)-1 [6500] | 50.4 | 80 | 13.1 | T-top |
| Example 13 | (A)-1 [100] | (B)-2 [25.00] | (D)-4 [2.50] | (S)-1 [6500] | 50.3 | 40 | 10.4 | Vertical |

In Tables 1 and 2, the numerical values in brackets [ ] indicate the amount (in parts by weight) of the component added. Further, the reference symbols in Tables 1 and 2 have the meanings shown below.

(A)-1: the polymer compound represented by chemical formula (A)-1 shown below.

(B)-1: the compound represented by chemical formula (B)-1 shown below.
(B)-2: the compound represented by chemical formula (B)-2 shown below.
(B)-3: the compound represented by chemical formula (B)-3 shown below.
(B)-4: the compound represented by chemical formula (B)-4 shown below.
(D)-A: tri-n-octylamine
(D)-B: the compound represented by chemical formula (D)-B shown below.
(D)-C: the compound represented by chemical formula (D)-C shown below.
(D)-1: the compound represented by chemical formula (D)-1 shown below.
(D)-2: the compound represented by chemical formula (D)-2 shown below.
(D)-3: the compound represented by chemical formula (D)-3 shown below.
(D)-4: the compound represented by chemical formula (D)-4 shown below.
(D)-5: the compound represented by chemical formula (D)-5 shown below.
(D)-6: the compound represented by chemical formula (D)-6 shown below.
(S)-1: a mixed solvent of PGMEA/cyclohexanone=60/40 (weight ratio)

[Chemical Formula 59]

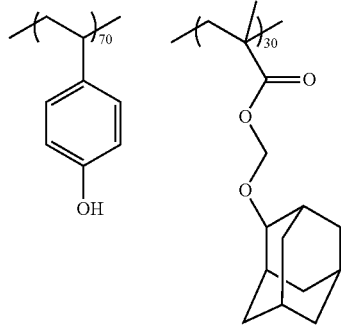

(A)-1

[Mw=10,000, Mw/Mn=1.60, wherein the subscript numerals shown to the bottom right of the parentheses ( ) indicate the copolymer composition (molar ratio).]

[Chemical Formula 60]

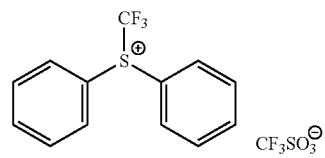

(B)-1

[Chemical Formula 61]

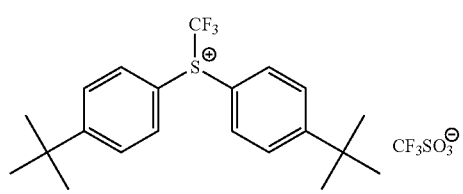

(B)-2

[Chemical Formula 62]

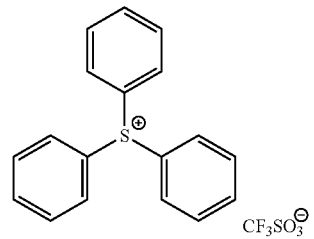

(B)-3

[Chemical Formula 63]

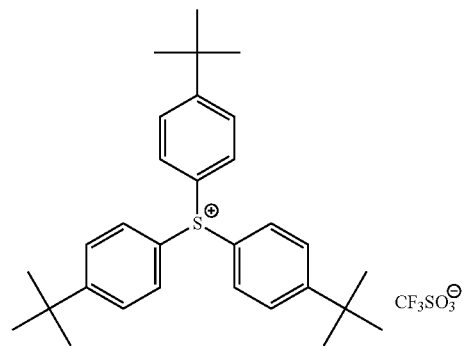

(B)-4

[Chemical Formula 64]

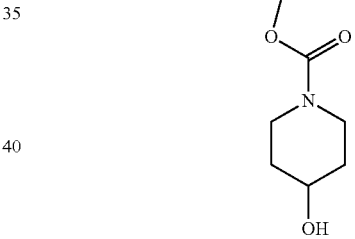

(D)-B

[Chemical Formula 65]

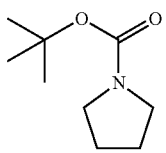

(D)-C

[Chemical Formula 66]

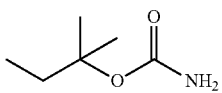

(D)-1

[Chemical Formula 67]

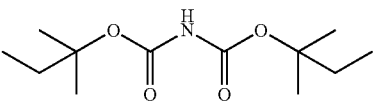

(D)-2

-continued

[Chemical Formula 68]

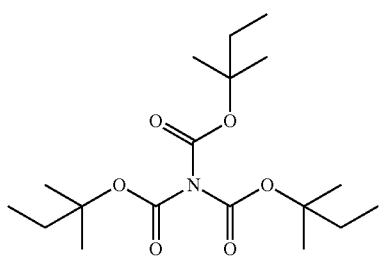
(D)-3

[Chemical Formula 69]

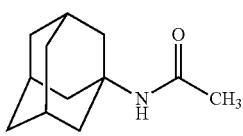
(D)-4

[Chemical Formula 70]

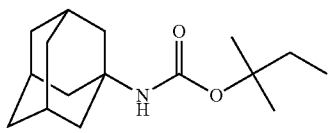
(D)-5

[Chemical Formula 71]

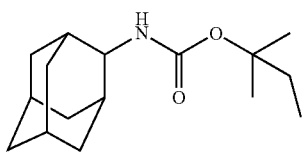
(D)-6

<Resist Pattern Formation-1>

Using a spinner, each of the positive resist compositions shown in Table 1 was applied uniformly onto an 8-inch silicon substrate that had been treated with hexamethyldisilazane (HMDS) for 36 seconds at 90° C., and a prebake (PAB) was then conducted for 60 seconds at 110° C., thereby forming a resist film (film thickness: 60 nm).

This resist film was subjected to direct patterning (exposure) with an electron beam lithography apparatus HL-800D (VSB) (manufactured by Hitachi, Ltd.) at an accelerating voltage of 70 KeV and 7 A/cm², and was then subjected to a post exposure bake treatment (PEB) for 60 seconds at 100° C., followed by development for 60 seconds at 23° C. in a 2.38% by weight aqueous solution of TMAH (product name: NMD-3, manufactured by Tokyo Ohka Kogyo Co., Ltd.). The resist film was then rinsed for 15 seconds with pure water, and subjected to a post bake for 60 seconds at 100° C.

As a result, with the exceptions of comparative example 1 and comparative example 4 in which a pattern was unable to be formed, a 1:1 line and space (L/S) pattern having a line width of 200 μM and a pitch of 400 nm was obtained in each of the examples.

[Evaluation of Storage Stability]

Using the positive resist composition from each example, the line width of an L/S pattern formed after the composition had been stored for 2 weeks at room temperature (23° C.), and the line width of an L/S pattern formed after the composition had been stored for 2 weeks in a freezer (−20° C.) were measured, and then using the formula below, the absolute value of the difference in line widths (ΔCD) for room temperature storage and freezer storage was determined. The results are shown in Table 1. In Table 1, the symbol "-" indicates that a pattern was unable to be formed.

ΔCD (nm)=|line width (nm) of item stored in freezer−line width (nm) of item stored at room temperature|

A smaller value for ΔCD indicates a higher level of storage stability, and the storage stability was evaluated against the criteria below. The results are shown in Table 1.

A: ΔCD value for 200 nm L/S pattern of <20 nm

B: ΔCD value for 200 nm L/S pattern of ≥20 nm

The above results confirmed that the resist compositions of examples 1 to 12 according to the present invention exhibited superior storage stability to the resist compositions of comparative examples 1 to 6.

<Resist Pattern Formation-2>

Using a spinner, each of the positive resist compositions shown in Table 2 was applied uniformly onto an 8-inch silicon substrate that had been treated with hexamethyldisilazane (HMDS) for 36 seconds at 90° C., and a prebake (PAB) was then conducted for 60 seconds at 100° C., thereby forming a resist film (film thickness: 60 nm).

This resist film was subjected to direct patterning (exposure) with an electron beam lithography apparatus HL-800D (VSB) (manufactured by Hitachi, Ltd.) at an accelerating voltage of 70 KeV.

Subsequently, a post exposure bake treatment (PEB) was performed for 60 seconds at 100° C., followed by development for 30 seconds at 23° C. in a 2.38% by weight aqueous solution of tetramethylammonium hydroxide (TMAH) (product name: NMD-3, manufactured by Tokyo Ohka Kogyo Co., Ltd.). The resist film was then rinsed for 15 seconds with pure water, and shaken dry.

As a result, in each example, a 1:1 line and space pattern (hereafter abbreviated as "L/S pattern") having a line width of 100 nm and a pitch of 200 nm was formed in the resist film.

The optimum exposure dose EOP (μC/cm²), namely the sensitivity, was also determined for each pattern formation. The results are shown in Table 2.

[Evaluation of Line Width Roughness (LWR)]

For each of the L/S patterns having a line width of 100 nm and a pitch of 200 nm, the space width was measured at 400 points along the lengthwise direction of the space using a measuring scanning electron microscope (SEM) (scanning electron microscope, accelerating voltage: 800 V, product name: S-9220, manufactured by Hitachi, Ltd.), and from these results, the value of 3 times the standard deviation (s) (namely, 3s) was determined. The average value of 3s across 5 locations was calculated as an indicator of the LWR. The results are shown in Table 2.

The smaller the value of 3s, the lower the level of roughness in the line width, indicating an L/S pattern of more uniform width.

[Evaluation of Resolution]

For the resist pattern formation described above, the critical resolution (nm) at the EOP mentioned above was evaluated using a scanning electron microscope S-9220 (a product name, manufactured by Hitachi, Ltd.). The results are listed in Table 2.

[Evaluation of Resist Pattern Shape]

Each L/S pattern of line width 100 nm and pitch 200 nm formed at the EOP value mentioned above was inspected using a scanning electron microscope (SEM), and the cross-sectional shape of the L/S pattern was evaluated against the criteria listed below. The results are shown in Table 2.

Top-round: the top sections of the resist pattern were rounded, and the rectangularity was poor.

T-Top: the cross-sectional shape of the resist pattern was T-shaped, with poor rectangularity.

Vertical: a resist pattern shape of superior rectangularity.

The above results confirmed that the resist composition of example 13 according to the present invention exhibited superior lithography properties and yielded a more favorable pattern shape than the comparative examples 7 and 8.

The invention claimed is:

1. A resist composition comprising a base component (A) which exhibits changed solubility in an alkali developing solution under action of acid comprising a resin component (A1) comprising a structural unit (a1) derived from an acrylate ester containing an acetal-type acid-dissociable, dissolution-inhibiting group and a structural unit (a5) including at least one structural unit represented by general formulae (a5-1) and (a5-2) shown below, an acid-generator component (B) which generates acid upon exposure comprising an acid generator (B1) consisting of a compound represented by general formula (b0) shown below, and a nitrogen-containing organic compound (D) comprising a compound represented by general formula (d2-3) shown below:

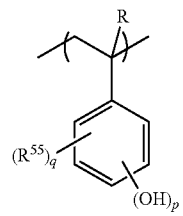

(a5-1)

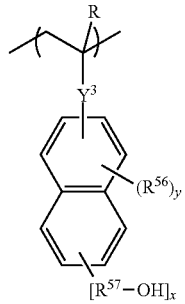

(a5-2)

wherein R represents a hydrogen atom, an alkyl group of 1 to 5 carbon atoms or a halogenated alkyl group of 1 to 5 carbon atoms, each of $R^{55}$ and $R^{56}$ independently represents a halogen atom, an alkyl group of 1 to 5 carbon atoms, an alkoxy group of 1 to 5 carbon atoms or a halogenated alkyl group of 1 to 5 carbon atoms, p represents an integer of 1 to 3 and q represents an integer of 0 to 4, provided that p+q is an integer of 1 to 5, $Y^3$ represents a single bond or —C(=O)—O—$R^{58}$— (wherein $R^{58}$ represents a single bond or a divalent linking group), $R^{57}$ represents a single bond or an alkylene group, x represents an integer of 1 to 3 and y represents an integer of 0 to 6, provided that x+y is an integer of 1 to 7,

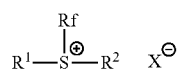

(b0)

wherein each of $R^1$ and $R^2$ independently represents an aryl group which may have a substituent, Rf represents an unsubstituted fluorinated alkyl group, and $X^-$ represents a counter anion,

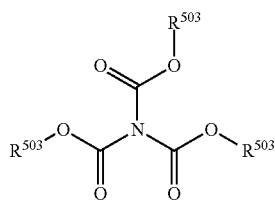

(d 2-3)

wherein each $R^{503}$ independently represents a linear or branched alkyl group of 5 or more carbon atoms which may have a substituent; and the plurality of $R^{503}$ groups in the above formulas are the same or different.

2. The resist composition according to claim 1, wherein said base component (A) is a base component which exhibits increased solubility in an alkali developing solution under action of acid.

3. A method of forming a resist pattern, said method comprising: applying a resist composition according to claim 1 to a substrate to form a resist film on said substrate, conducting exposure of said resist film, and alkali-developing said resist film to form a resist pattern.

* * * * *